(12) United States Patent
Ezaki et al.

(10) Patent No.: US 7,295,460 B2
(45) Date of Patent: Nov. 13, 2007

(54) MAGNETIC MEMORY CELL, MAGNETIC MEMORY DEVICE, AND METHOD OF MANUFACTURING MAGNETIC MEMORY DEVICE

(75) Inventors: Joichiro Ezaki, Chuo-ku (JP); Keiji Koga, Chuo-ku (JP); Yuji Kakinuma, Chuo-ku (JP)

(73) Assignee: TDK Corporation, Tokyo (JP)

( * ) Notice: Subject to any disclaimer, the term of this patent is extended or adjusted under 35 U.S.C. 154(b) by 183 days.

(21) Appl. No.: 10/550,519

(22) PCT Filed: Mar. 26, 2004

(86) PCT No.: PCT/JP2004/004353

§ 371 (c)(1),
(2), (4) Date: Sep. 23, 2005

(87) PCT Pub. No.: WO2004/088751

PCT Pub. Date: Oct. 14, 2004

(65) Prior Publication Data

US 2007/0019462 A1   Jan. 25, 2007

(30) Foreign Application Priority Data

Mar. 28, 2003 (JP) ............................. 2003-092924

(51) Int. Cl.
*G11C 11/00* (2006.01)
(52) U.S. Cl. .................. 365/158; 365/171; 365/173; 438/3
(58) Field of Classification Search ............. 365/158, 365/171, 173; 438/3
See application file for complete search history.

(56) References Cited

U.S. PATENT DOCUMENTS

| | | |
|---|---|---|
| 5,343,422 A | 8/1994 | Kung et al. |
| 5,587,943 A | 12/1996 | Torok et al. |
| 5,629,922 A | 5/1997 | Moodera et al. |
| 5,861,328 A | 1/1999 | Tehrani et al. |
| 6,882,563 B2 * | 4/2005 | Asao ........................ 365/158 |

FOREIGN PATENT DOCUMENTS

JP   A-09-091949   4/1997

(Continued)

*Primary Examiner*—Son Dinh
*Assistant Examiner*—N Nguyen
(74) *Attorney, Agent, or Firm*—Oliff & Berridge, PLC

(57) ABSTRACT

The present invention provides a magnetic memory device capable of reducing a loss of a magnetic field generated by currents flowing in a write line and performing writing stably, and a magnetic memory cell mounted on the magnetic memory device. Further, the invention provides a method for easily manufacturing such a magnetic memory device. A magnetic memory cell includes: stacked bodies each including a magneto-sensitive layer whose magnetization direction changes according to an external magnetic field, and constructed so that current flows in a direction perpendicular to a stack layer surface; and a toroidal magnetic layer disposed between the first and second stacked bodies so that the direction along the stack layer surface is set as an axial direction, and constructed so as to be penetrated by a plurality of conductors along the axial direction. Thus, strength reduction in a circulating magnetic field generated in a toroidal magnetic layer can be suppressed, and the magnetization direction of a magneto-sensitive layer in each of the first and second stacked bodies can be inverted by a smaller write current.

50 Claims, 38 Drawing Sheets

FOREIGN PATENT DOCUMENTS

| | | |
|---|---|---|
| JP | A-2000-090658 | 3/2000 |
| JP | A-2001-168417 | 6/2001 |
| JP | A-2001-230468 | 8/2001 |
| JP | A-2001-230469 | 8/2001 |
| JP | A-2001-230472 | 8/2001 |
| JP | A-2002-353415 | 12/2002 |

\* cited by examiner

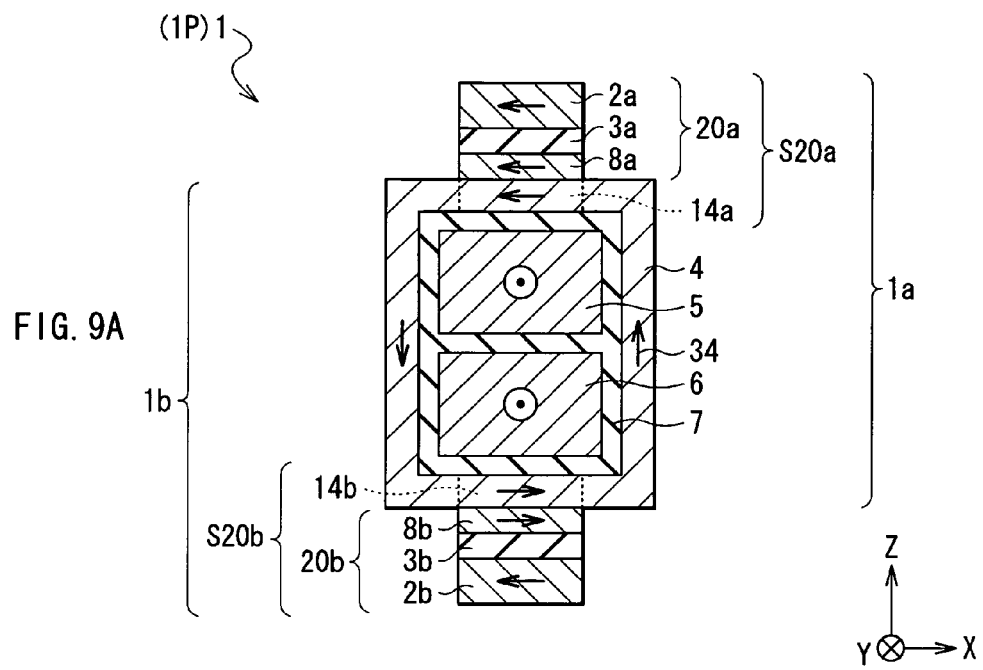
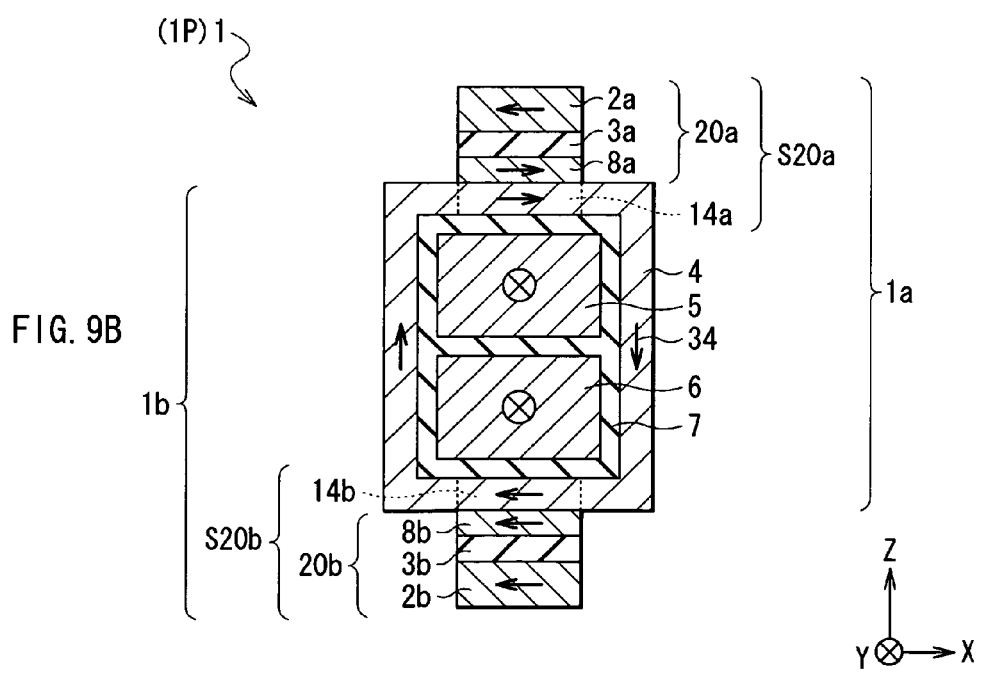

「0」

「1」

MAGNETIC MEMORY CELL, MAGNETIC MEMORY DEVICE, AND METHOD OF MANUFACTURING MAGNETIC MEMORY DEVICE

TECHNICAL FIELD

The present invention relates to a magnetic memory cell including a magnetoresistive device, a magnetic memory device having a plurality of magnetic memory cells and recording/reading information, and a method of manufacturing the magnetic memory device.

BACKGROUND ART

Conventionally, as general memories used for information processors such as a computer and a communication device, volatile memories such as a DRAM (Dynamic Random Access Memory) and an SRAM (Static RAM) are used. The volatile memories have to be refreshed by always supplying current to hold stored information. When the power source is turned off, all of information is lost, so that a nonvolatile memory as means for recording information has to be provided in addition to the volatile memory. For example, a flash EEPROM, a magnetic hard disk drive, or the like is used.

In the nonvolatile memories, as the speed of information processing increases, increase in speed of an access is becoming an important subject. Further, as a portable information device is being rapidly spread and the performance is becoming higher, information device development aiming at so-called ubiquitous computing which means that information processing can be performed everywhere at any time is rapidly being progressed. Development of a nonvolatile memory adapted for higher-speed processing as a key device of such information device development is in strong demand.

As a technique effective to increase the speed of the nonvolatile memory, a magnetic random access memory (MRAM) in which magnetic memory elements each for storing information in accordance with the magnetization direction along the axis of easy magnetization of a ferromagnetic layer are arranged in a matrix is known. The MRAM stores information by using a combination of the magnetization directions in two ferromagnetic members. On the other hand, stored information is read by detecting a resistance change (that is, a change in current or voltage) which occurs between the case where the magnetization direction is parallel to a reference direction and the case where the magnetization direction isantiparallel to the reference direction. Since the MRAM operates with the principle, it is important that the resistance change ratio is as high as possible to perform stable writing and reading in the MRAM.

The MRAM currently used in practice utilizes the giant magnetoresistive (GMR) effect. The GMR effect is a phenomenon such that when two magnetic layers are disposed so that their axes of easy magnetization are parallel to each other, in the case where the magnetization directions of the layers are parallel to the axis of easy magnetization, the resistance value becomes the minimum. In the case where the magnetization directions of the layers antiparallel to the axis of easy magnetization, the resistance value becomes the maximum. An MRAM using a GMR device capable of obtaining such a GMR effect (hereinbelow, described as GMR-MRAM) is disclosed in, for example, U.S. Pat. No. 5,343,422.

The GMR-MRAM has a coercive force difference type (pseudo spin valve type) and an exchange bias type (spin valve type). In the MRAM of the coercive force difference type, the GMR device has two ferromagnetic layers and a nonmagnetic layer sandwiched between the two ferromagnetic layers and, by using the difference between the coercive forces of the two ferromagnetic layers, information is written/read. In the case where the GMR device has a configuration of, for example, "nickel iron alloy (NiFe)/copper(Cu)/cobalt(Co)", the resistance change rate is a small value of about 6 to 8%. On the other hand, the MRAM of the exchange bias type, the GMR device has a pinned layer whose magnetization direction is pinned by antiferromagnetic coupling to an antiferromagnetic layer, a free layer whose magnetization direction changes according to an external magnetic field, and a nonmagnetic layer sandwiched between the pinned layer and the free layer. By using the difference between the magnetization direction of the pinned layer and the magnetization direction of the free layer, information is written/read. For example, the resistance change rate of the GMR device having a configuration of "platinum manganese (PtMn)/cobalt iron (CoFe)/copper (Cu)/CoFe" is about 10% which is higher than that of the coercive force difference type. However, it is insufficient to achieve improvement in storing speed and access speed.

To solve the problems, an MRAM having a TMR device using tunneling magnetoresistive effect (TMR) (hereinbelow, written as "TMR-MRAM") is proposed. The TMR effect is an effect such that the tunnel current passing through an insulating layer changes in accordance with relative angles of the magnetization directions of two ferromagnetic layers sandwiching a very-thin insulating layer (tunnel barrier layer). When the magnetization directions of the two ferromagnetic layers are parallel to each other, the resistance value becomes the minimum. When the magnetization directions antiparallel to each other, the resistance value becomes the maximum. In the TMR-MRAM, when the TMR device has a configuration of, for example, "CoFe/aluminum oxide/CoFe", the resistance change ratio is high as 40% and the resistance value is also large. Consequently, the TMR-MRAM can be easily matched with a semiconductor device such as an MOSFET. Therefore, the TMR-MRAM can easily obtain a higher output as compared with the GMR-MRAM, and improvement in storage capacity and access speed is expected. In the TMR-MRAM, a method of storing information by changing the magnetization direction of a magnetic film of the TMR device by a current magnetic field generated by passing current to a conductor is known. As a method of reading stored information, a method of passing current in a direction perpendicular to a tunnel barrier layer and detecting a resistance change in the TMR device is known. Techniques on the TMR-MRAM disclosed in U.S. Pat. No. 5,629,922 and Japanese Patent Laid-open No. Hei 9-91949 and the like are known.

As described above, an MRAM using the TMR effect can achieve an output higher than that of the MRAM using the GMR effect. However, since an output voltage of even the MRAM using the TMR device achieving a resistance change rate of about 40% is tens mV, it is insufficient to realize a magnetic memory device of higher packing density.

FIG. 48 is a plan view showing the configuration in a magnetic memory device using the conventional TMR effect. FIG. 49 shows a sectional configuration of the main part of the conventional magnetic memory device corresponding to FIG. 48. A write bit line 105 is orthogonal to a read word line 112 and a write word line 106 extending in parallel with each other, and a TMR device 120 constructed by a first magnetic layer 102, a tunnel burrier layer 103, and a second magnetic layer 104 is disposed in an area sandwiched in the Z direction of the orthogonal portion. In such an MRAM of the type in which the write bit line 105 and the write word line 106 are orthogonal to each other, the magnetization direction of the second magnetic layer 104 functioning as a free layer cannot be sufficiently maintained as a whole, and it is difficult to perform sufficiently stable writing.

In the MRAM using the TMR effect, information is stored in each of memory cells by changing the magnetization direction of the magnetic film by an induction field by current flowing in conductors arranged orthogonal to each other, that is, current magnetic field. Since the current magnetic field is an open magnetic field (which is not magnetically confined in a specific area), the efficiency is low and an adverse influence on neighboring memory cells is also concerned.

Further, in the case of increasing integration of memory cells to achieve higher packing density of a magnetic memory device, it is essential to make a TMR device finer. However, it is feared that demagnetizing field increases as the aspect ratio (thickness/width in the direction in the stack layer plane) of each of the magnetic layers in the TMR device becomes higher, the magnetic field intensity to change the magnetization direction of the free layer increases, and larger write current is necessary.

DISCLOSURE OF THE INVENTION

The present invention has been achieved in consideration of such problems and a first object of the invention is to provide a magnetic memory device capable of reducing a loss of a magnetic field generated by currents flowing in a write line and performing stable writing with a compact configuration, and a magnetic memory cell to be mounted on the magnetic memory device. A second object is to provide a magnetic memory device hardly exerting an adverse influence on an adjacent magnetic memory cell and a magnetic memory cell to be mounted on the magnetic memory device. A third object is to provide a high-speed and large-capacity magnetic memory device capable of obtaining a high signal output by using a pair of magnetoresistive devices and a magnetic memory cell to be mounted on the magnetic memory device. Further, a fourth object is to provide a method for easily manufacturing such a magnetic memory device.

A magnetic memory cell of the invention includes: first and second stacked bodies each including a magneto-sensitive layer whose magnetization direction changes according to an external magnetic field, and constructed so that current flows in a direction perpendicular to a stack layer surface, and disposed so that their stack layer surfaces face each other; and a toroidal magnetic layer disposed between the first and second stacked bodies so that the direction along the stack layer surface is set as an axial direction, and constructed so as to be penetrated by a plurality of conductors along the axial direction. The "external magnetic field" in the invention denotes a magnetic field generated by currents flowing in the plurality of conductors or a circulating magnetic field generated in the toroidal magnetic layer. "Toroidal" in the "toroidal magnetic layer" denotes a state where the magnetic layer completely surrounds each of the plurality of conductors penetrating the inside magnetically and electrically continuously and is closed in section in the direction crossing the plurality of conductors. Therefore, the toroidal magnetic layer allows to contain an insulator as long as it is magnetically and electrically continuous. That is, although an insulator in which no current flows is not included, for example, an oxide film formed in a manufacturing process may be included. The "axial direction" denotes an opening direction when attention is paid to the toroidal magnetic layer single body, that is, the extending direction of the plurality of conductors penetrating the inside. The expression "(a toroidal magnetic layer) constructed so as to be penetrated by a plurality of conductors" means that a plurality of conductors penetrate an area or space surrounded by the toroidal magnetic layer.

In the magnetic memory cell of the invention, with the configuration, a closed magnetic path is formed by passing currents to the plurality of conductors, so that the magnetization of each of the magneto-sensitive layers in the first and second stacked bodies is inverted efficiently.

A magnetic memory device of the invention includes: a first write line; a second write line extending so as to cross the first write line; and a magnetic memory cell. The magnetic memory cell comprises: first and second stacked bodies each including a magneto-sensitive layer whose magnetization direction changes according to an external magnetic field, and constructed so that current flows in a direction perpendicular to a stack layer surface, and disposed so that their stack layer surfaces face each other; and a toroidal magnetic layer disposed between the first and second stacked bodies so that the direction along the stack layer surface is set as an axial direction, and constructed so as to be penetrated by the first and second write lines along the axial direction.

In the magnetic memory device of the invention, with the configuration, a closed magnetic path is formed by passing currents to the first and second write lines, so that the magnetization of each of the magneto-sensitive layers in the first and second stacked bodies is inverted efficiently.

A method of manufacturing a magnetic memory device of the invention, including a first write line, a second write line extending so as to cross the first write line, and a magnetic memory cell having first and second stacked bodies including magneto-sensitive layers whose magnetization directions change according to an external magnetic field, comprises the steps of: forming a second stack layer part as part of the second stacked body on a substrate provided with first and second rectifying devices and electrically connecting the second rectifying device and the second stack layer part; forming a bottom magnetic layer so as to cover at least the stack layer part and completing formation of the second stacked body; forming the first write line over the bottom magnetic layer via a first insulating film; forming the second write line over the first write line via a second insulating film so as to include a portion in which the first and second write lines extend parallel to each other; forming a stack layer pattern forming a stack layer pattern including the portion in which the first and second write lines extend parallel to each other while sandwiching the second insulating film by performing patterning by sequentially etching the second write line, the second insulating film, and the first write line; forming a toroidal magnetic layer by providing a top magnetic layer so as to surround the stack layer pattern via a third insulating film; forming a first stacked body by providing a first stack layer part in a position corresponding to the second stacked body over the toroidal magnetic layer and forming a magnetic memory cell having the first and second stacked bodies; and electrically connecting the first stacked body and the first rectifying device.

In the method of manufacturing a magnetic memory device according to the invention, by the above steps, a structure in which the first and second stacked bodies disposed so that their stack layer surfaces face each other are formed for the toroidal magnetic layer commonly provided can be obtained. In this case, the state "the first and second write lines extend parallel to each other while sandwiching the second insulating film" includes ±10° of an error range in manufacture.

In the magnetic memory cell and the magnetic memory device of the invention, preferably, the first stacked body constructs a first magnetoresistive device in cooperation with the toroidal magnetic layer, and the second stacked body constructs a second magnetoresistive device in cooperation with the toroidal magnetic layer. With the configuration, a pair of magnetoresistive devices sharing the toroidal magnetic layer is constructed, so that the space can be reduced more than the case where one toroidal magnetic layer is provided for one stacked body.

In the magnetic memory cell and the magnetic memory device of the invention, preferably, each of the first and second stacked bodies is electrically connected to the toroidal magnetic layer. With the configuration, in the first and second stacked bodies, currents flowing in the direction perpendicular to the stack layer face flow from the magneto-sensitive layer to the toroidal magnetic layer.

In the magnetic memory cell and the magnetic memory device of the invention, the plurality conductors (first and second write lines) extend parallel to each other in an area penetrating the toroidal magnetic layer. With the configuration, a synthetic magnetic field generated by passing currents to the plurality of conductors (first and second write lines) can be made larger than that in the case where the plurality of write lines (first and second write lines) cross each other, and the magnetization in the magneto-sensitive layer can be inverted more efficiently.

In the magnetic memory cell and the magnetic memory device of the invention, the plurality of conductors may be disposed so as to be adjacent to each other in a direction of a straight line passing through the first and second stacked bodies in an area penetrating the toroidal magnetic layer, or may be disposed so as to be adjacent to each other in a direction orthogonal to a straight line passing through the first and second stacked bodies in an area penetrating the toroidal magnetic layer.

In the magnetic memory cell and the magnetic memory device of the invention, preferably, magnetization directions of the magneto-sensitive layers in the first and second stacked bodies change so as to be antiparallel to each other by a magnetic field generated by currents flowing in the plurality of conductors (first and second write lines) penetrating the toroidal magnetic layer, and information is accordingly stored in the first and second stacked bodies. The expression "the magnetization directions are antiparallel to each other" includes not only the case where the relative angle formed between the magnetization directions, that is, average magnetization directions of the magnetic layers is strictly 180 degrees but also the case where the relative angle is deviated from 180 degrees only by a predetermined angle due to an error occurring in manufacture, an error caused when a perfect uniaxis cannot be obtained, and the like. "Information" denotes binary information expressed by, generally, "0" and "1" by input/output signals to/from a magnetic memory device or "high" and "low" by current values or voltage values.

In the magnetic memory cell and the magnetic memory device, in the first and second stacked bodies, information is stored in a state where the magnetization directions of the magneto-sensitive layers are antiparallel to each other.

More concretely, either a first state or a second state is obtained. In the first state, one of a pair of magneto-sensitive layers in the first and second stacked bodies is magnetized in a first direction, and the other is magnetized in a second direction antiparallel to the first direction. In the second state, one of the magneto-sensitive layers in the pair is magnetized in the second direction and the other is magnetized in the first direction. Preferably, information is stored in the first and second stacked bodies in correspondence with the first and second states. At this time, the magnetizations of the magneto-sensitive layers in the first and second stacked bodies can be in two states; a state where they are parallel to each other, and a state where they are antiparallel to each other. Binary information corresponds to the two states.

In the magnetic memory cell and the magnetic memory device of the invention, a pair of magneto-sensitive layers may construct part of the toroidal magnetic layer. Further, a pair of magneto-sensitive layers may include first and second magneto-sensitive parts constructed so as to be magnetically exchange-coupled to each other, and the first magneto-sensitive part may construct part of the toroidal magnetic layer. In addition, a pair of first nonmagnetic conductive layers for antiferromagnetic-coupling a pair of first magneto-sensitive parts and a pair of second magneto-sensitive parts may be disposed between the pair of first magneto-sensitive parts and the pair of second magneto-sensitive parts.

Further, in the magnetic memory cell and the magnetic memory device of the invention, each of the first and second stacked bodies includes: a nonmagnetic layer; a first magnetic layer stacked on one side of the nonmagnetic layer and whose magnetization direction is pinned; and a magneto-sensitive layer stacked on the side opposite to the first magnetic layer, of the nonmagnetic layer, or includes; a nonmagnetic layer; a first magnetic layer stacked on one side of the nonmagnetic layer and whose magnetization direction is pinned; and a second magnetic layer stacked on the side opposite to the first magnetic layer, of the nonmagnetic layer and functioning as the second magneto-sensitive part, and information may be detected on the basis of currents flowing in the first and second stacked bodies. In this case, preferably, the first magnetic layer has a coercive force larger than that of the second magnetic layer. A third magnetic layer which is antiferromagnetic and is exchange-coupled to the first magnetic layer may be disposed on the side opposite to the nonmagnetic layer of the first magnetic layer. A second nonmagnetic conductive layer and a fourth magnetic layer which is antiferromagnetic-coupled to the first magnetic layer may be disposed in order from the side of the first magnetic layer between the first and third magnetic layers. In those cases, the nonmagnetic layer may be an insulating layer which can produce a tunnel effect.

The magnetic memory device of the invention may further include a pair of first read lines which are connected to first and second magnetoresistive devices and supply read current to the magnetoresistive devices, and information is read from a magnetic memory cell on the basis of the current flowing in the stacked bodies. The expression "connected to" in the magnetic memory cell of the invention indicates a state where components are connected to each other at least electrically but do not have to be directly connected to each other physically.

In the magnetic memory device, information is read by using the phenomenon that current values of currents passed in the direction perpendicular to the stack layer face of the stacked bodies in accordance with the relative magnetization directions of the magneto-sensitive layers in the pair of the magnetoresistive devices.

Preferably, read current is supplied from the pair of first read lines to the first and second stacked bodies and, on the basis of the difference between the pair of read current values, information is read from the magnetic memory cell. In this method, the read currents are differentially output, so that noise occurring in each of the first read lines and an offset component included in an output value of each of the magnetoresistive devices is cancelled off and removed.

Preferably, the magnetic memory device according to the invention includes: first and second rectifying devices provided between a pair of first read lines and the first and second stacked bodies on each of current paths of the read currents supplied to the first and second stacked bodies; and a second read line for leading the read currents passed through the first and second stacked bodies to the ground.

The "rectifying device" of the invention denotes a device for passing current only in one direction and checking passage of current in an opposite direction. The "current path" denotes a whole path in which the read current passes so as to be flowed in a stacked body, passes through the stacked body, and flows out from the stacked body. The rectifying device has a rectifying action of passing current only in an earth direction (second read line side) on the current path. By the rectifying device, a round of the current from another magnetic memory cell connected to a common second read line, flowing toward a magnetic memory cell to be read can be avoided, and the current can be prevented from passing from one of the stacked bodies in a magnetic memory cell to be read to the other stacked body and reaching the first read line. As the rectifying device, preferably, a Schottky diode, a PN junction diode, a bipolar transistor, or a MOS transistor is employed.

Further, in the magnetic memory device of the invention, preferably, the second stacked body, the toroidal magnetic layer, and the first stacked body are disposed in order on a substrate provided with the first and second rectifying devices, and the first and second rectifying devices and the first and second stacked bodies are electrically connected to each other, respectively. In this case, a bipolar transistor may be used as the rectifying device and the emitter in the bipolar transistor and the magnetoresistive device can be electrically connected to each other. Alternately, a MOS transistor may be used as the rectifying device, and the source in the MOS transistor can be electrically connected to the magnetoresistive device, or a Schottky diode may be used as the rectifying device having an epitaxial layer and a metal layer in order from the substrate side, and a Schottky barrier may be formed between the epitaxial layer and the metal layer.

In the method of manufacturing a magnetic memory device of the invention, in the stacked layer pattern forming step, preferably, the stack layer pattern is formed in a self aligned manner by selectively etching the second insulating film and the first write line by using the second write line as a mask. By the method, processing with high alignment precision can be realized and, further, the whole manufacturing process can be simplified.

BRIEF DESCRIPTION OF THE DRAWINGS

FIGS. 9A and 9B are explanatory diagrams showing the relation between a write current direction and a circulating magnetic field direction (magnetization direction) in the sectional configuration of the memory cell illustrated in FIG. 5.

BEST MODE FOR CARRYING OUT THE INVENTION

Figure 1:
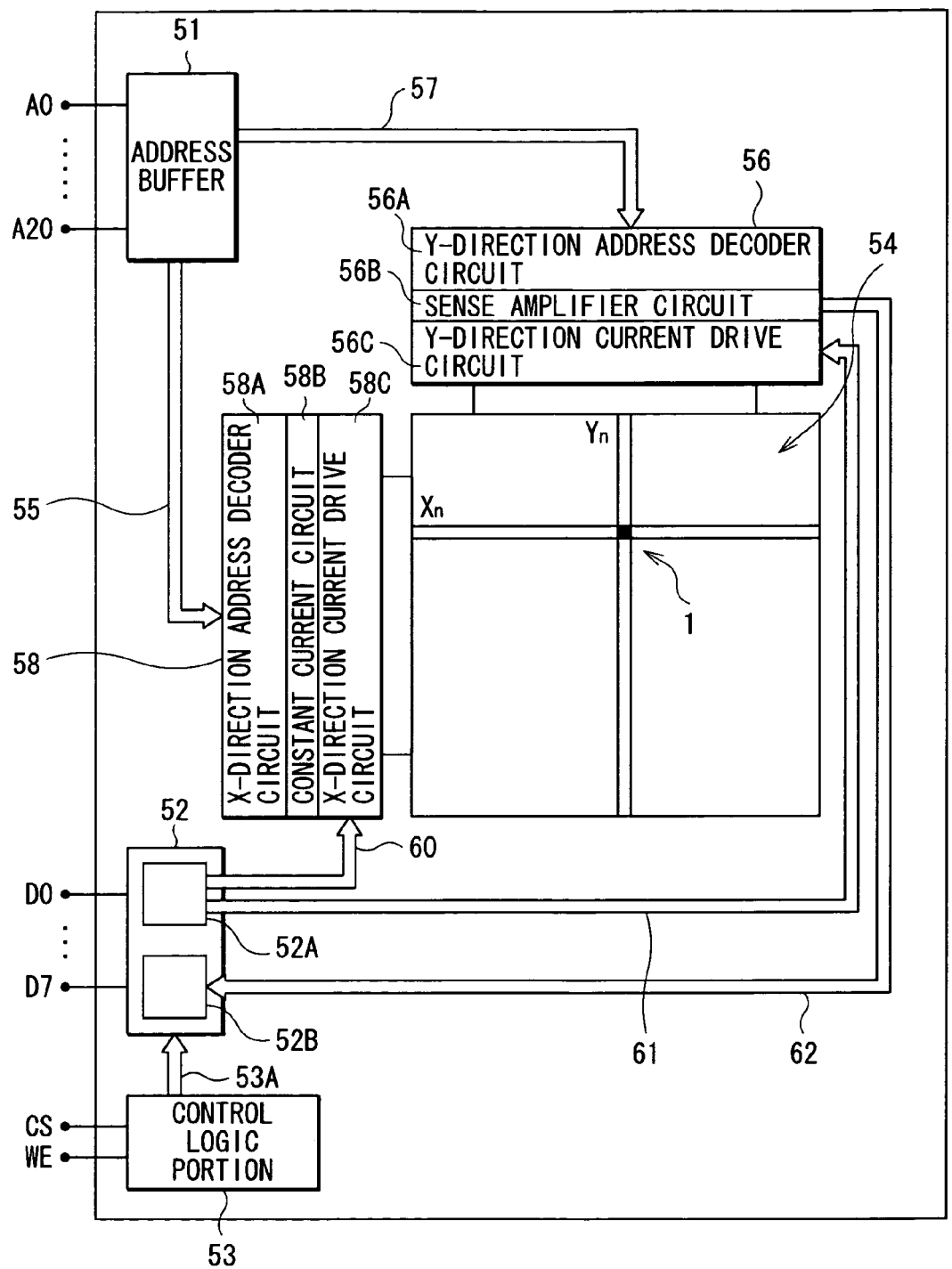
FIG. 1 is a block diagram showing a general configuration of a magnetic memory device according to a first embodiment of the invention.

Embodiments of the invention will be described in detail hereinbelow by referring to the drawings.

First Embodiment

First, by referring to FIGS. 1 to 7, the configuration of a magnetic memory device according to a first embodiment of the invention will be described.

FIG. 1 is a conceptual diagram showing a general configuration of a magnetic memory device in the embodiment. The magnetic memory device has an address buffer 51, a data buffer 52, a control logic portion 53, a memory cell group 54, a first drive control circuit portion 56, a second drive control circuit portion 58, external address input terminals A0 to A20, and external data terminals D0 to D7.

The memory cell group 54 has a matrix structure in which a number of memory cells 1 each having a pair of tunneling magnetoresistive devices (hereinbelow, called TMR devices) are arranged in a word line direction (X direction) and a bit line direction (Y direction) which are orthogonal to each other. The memory cell 1 is the minimum unit for storing data in the magnetic memory device and is a concrete example corresponding to a "magnetic memory cell" in the invention. The memory cell 1 will be described in detail later.

The first drive control circuit portion 56 has an address decoder circuit 56A, a sense amplification circuit 56B, and a current drive circuit 56C in the Y direction. The second drive control circuit portion 58 has an address decoder circuit 58A, a constant current circuit 58B, and a current drive circuit 58C in the X direction.

The address decoder circuits 56A and 58A are to select a word decode line 72 which will be described later and a bit decode line 71 according to an input address signal. The sense amplification circuit 56B and the constant current circuit 58B are circuits driven at the time of performing reading operation. The current drive circuits 56C and 58C are circuits driven at the time of performing writing operation.

The sense amplification circuit 56B and the memory cell group 54 are connected to each other via a plurality of bit decode lines 71 (which will be described later) in which the sense current flows at the time of reading operation. Similarly, the constant current circuit 58B and the memory cell group 54 are connected to each other via a plurality of word decode lines 72 (which will be described later) in which the sense current flows at the time of reading operation.

The current drive circuit 56C and the memory cell group 54 are connected to each other via write bit lines 5 (which will be described later) necessary at the time of writing operation. Similarly, the current drive circuit 58C and the memory cell group 54 are connected to each other via write word lines 6 (which will be described later) necessary at the time of writing operation.

The address buffer 51 has the external address input terminals A0 to A20 and is connected to the Y-direction address decoder circuit 56A in the first drive control circuit portion 56 via a Y-direction address line 57 and to the X-direction address decoder circuit 58A in the second drive control circuit portion 58 via an X-direction address line 55. The address buffer 51 receives an address signal from the outside via the external address input terminals A0 to A20 and amplifies the address signal to a voltage level required in the Y-direction address decoder circuit 56A and the X-direction address decoder circuit 58B by a buffer amplifier (not shown) provided in the address buffer 51. Further, the address buffer 51 functions to divide the amplified address signal into two signals and output the signals to the Y-direction address decoder circuit 56A via the Y-direction address line 57 and to the X-direction address decoder circuit 58A via the X-direction address line 55.

The data buffer 52 is constructed by an input buffer 52A and an output buffer 52B, has the external data terminals D0 to D7, is connected to the control logic portion 53, and is operated by an output control signal 53A from the control logic portion 53. The input buffer 52A is connected to the Y-direction current drive circuit 56C in the first drive control circuit portion 56 and the X-direction current drive circuit 58C in the second drive control circuit portion 58 via a Y-direction write data bus 61 and an X-direction write data bus 60, respectively. At the time of performing an operation of writing data to the memory cell group 54, the input buffer 52A functions to receive signal voltages of the external data terminals D0 to D7, amplify the signal voltage to a required voltage level by an internal buffer amplifier (not shown), and transmit the resultant voltage to the X-direction current drive circuit 58C and the Y-direction current drive circuit 56C via the X-direction write data bus 60 and the Y-direction write data bus 61, respectively. The output buffer 52B is connected to the sense amplification circuit 56B via a Y-direction read data bus 62. At the time of reading an information signal stored in the memory cell group 54, the output buffer 52B functions to amplify the information signal supplied from the sense amplification circuit 56B by an internally provided buffer amplifier (not shown) and to output the resultant signal with low impedance to the external data terminals D0 to D7.

The control logic portion 53 has a chip select terminal CS and a write enable terminal WE and is connected to the data buffer 52. The control logic portion 53 functions to receive a signal voltage from the chip select terminal CS for selecting a memory cell to be read/written from the group 54 of memory cells and a signal voltage from the write enable terminal WE for outputting a write permit signal and to output the output control signal 53A to the data buffer 52.

The configuration related to information writing operation in the magnetic memory device of the embodiment will now be described.

Figure 2:
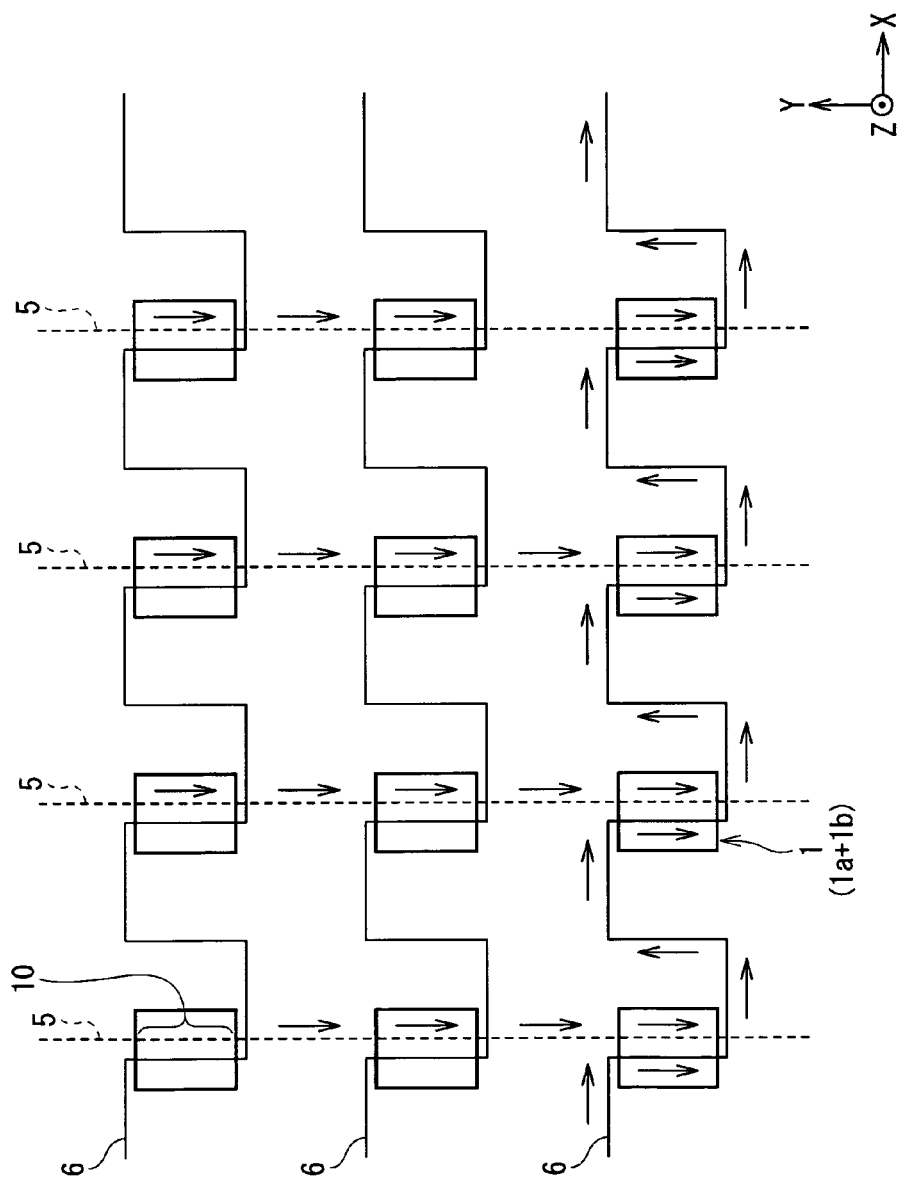
FIG. 2 is a plan view showing the configuration of a write line of the magnetic memory device illustrated in FIG. 1.

FIG. 2 is a conceptual diagram showing a planar configuration of a main part related to the writing operation in the memory cell group 54. As shown in FIG. 2, the magnetic memory device of the embodiment includes the plurality of write bit lines 5 and a plurality of write word lines 6 extending so as to cross the plurality of write bit lines 5. Each region where the write bit line 5 and the write word line 6 cross each other includes a parallel part 10 in which the write bit line 5 and the write word line 6 extend parallel with each other. Concretely, as shown in FIG. 2, the write word lines 6 extend in the X direction in a rectangular wave shape and the write bit lines 5 extend in the Y direction linearly. The rising and falling portions of the rectangular wave shape of the write word lines 6 form the plurality of parallel parts 10 in cooperation with the write bit lines 5. The memory cell 1 is provided in each of the regions where the write bit lines 5 and the write word lines 6 cross each other so as to include at least a part of the parallel parts 10. The state where the memory cell 1 is provided in the cross region includes the case where the memory cell 1 is provided adjacent to the intersecting point. Each of the memory cells 1 is constructed by TMR devices 1a and 1b. The TMR devices 1a and 1b are a concrete example of "a pair of magnetoresistive devices" of the invention.

To the write bit line 5 and the write word line 6, currents from the X-direction current drive circuit 58C and the Y-direction current drive circuit 56C flow, respectively. For example, as shown by the arrows in FIG. 2, when the direction of current flowing in the write bit line 5 is set as −Y direction (from the top to the bottom in the drawing sheet), it is desirable to set the direction of current flowing in the write word line 6 as +X direction as a whole (from left to right in the drawing sheet). By the setting, the direction of current in the write bit line 5 and that in the write word line 6 passing through the TMR devices 1a and 1b become parallel with each other.

Figure 3:
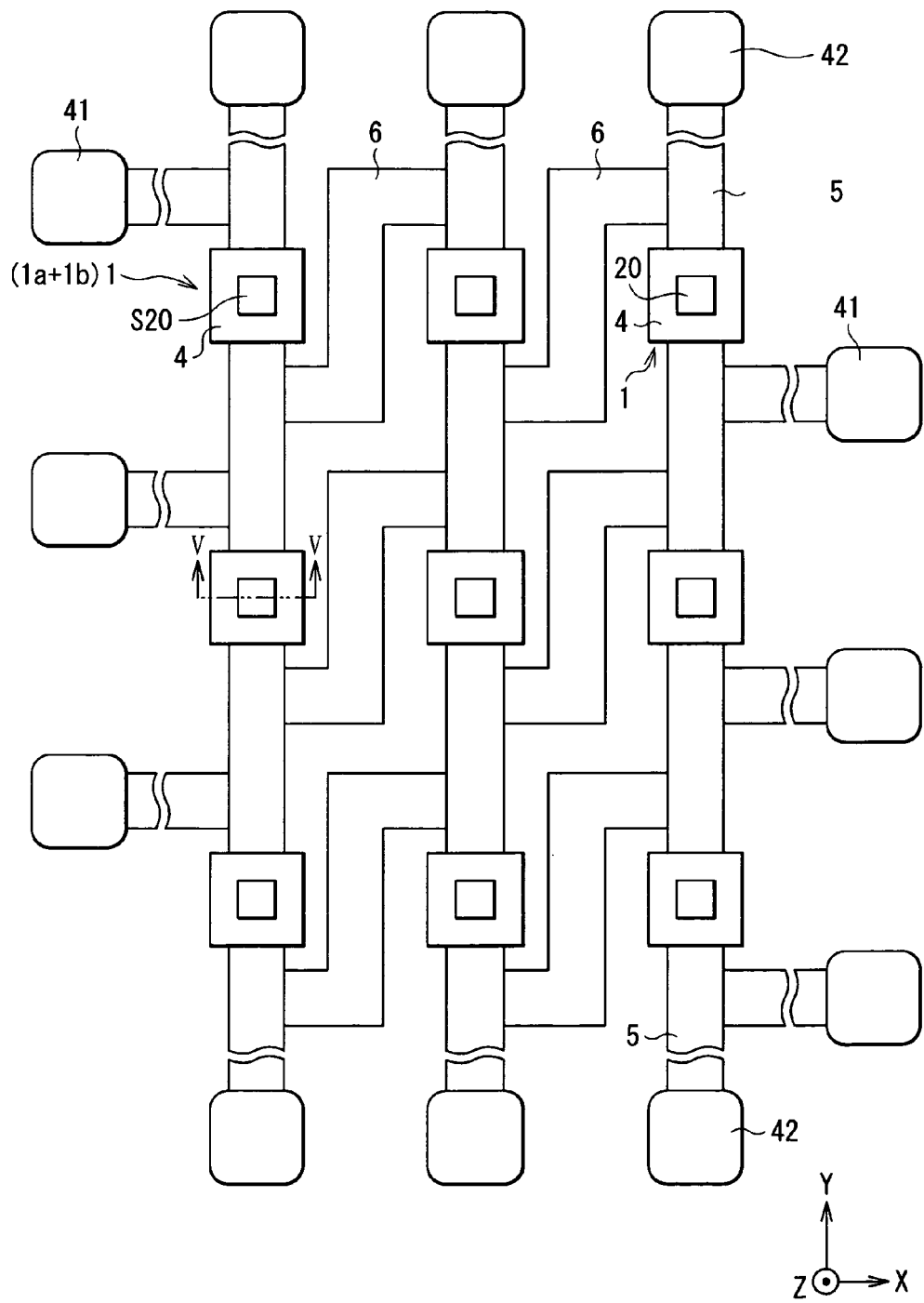
FIG. 3 is a partial plan view showing the configuration of a main part of a memory cell group in the magnetic memory device illustrated in FIG. 1.

FIG. 3 shows the planar configuration of the main part of the memory cell group 54 more specifically. The write bit lines 5, write word lines 6, and memory cells 1 shown in FIG. 3 correspond to those in FIG. 2. The memory cell 1 is disposed in the parallel part 10 of the write bit line 5 and the write word line 6 along the Y direction. A pair of TMR devices 1a and 1b constructing the memory cell 1 have a stacked body S20 (S20a and S20b) each including a magneto-sensitive layer, and a toroidal magnetic layer 4. The magnetization direction of the magneto-sensitive layer changes according to the magnetic field generated by the currents flowing in the write bit line 5 and the write word lines 6 in the parallel part 10 (that is, the external magnetic field in the toroidal magnetic layer 4). In this case, the write bit line 5 and the write word line 6 in the parallel part 10 are provided almost in the matched position in the XY plane but are disposed with a predetermined interval in the Z direction and are electrically insulated from each other.

At both ends of each write bit line 5, write bit line lead electrodes 42 are provided. One of the write bit line lead electrodes 42 is connected to the Y-direction current drive circuit 56C and the other is connected so as to be finally grounded. Similarly, write word line lead electrodes 41 are provided at both ends of each write word line 6. One of the write word line lead electrodes 41 is connected to the X-direction current drive circuit 58C and the other is connected so as to be finally grounded.

Figure 4:
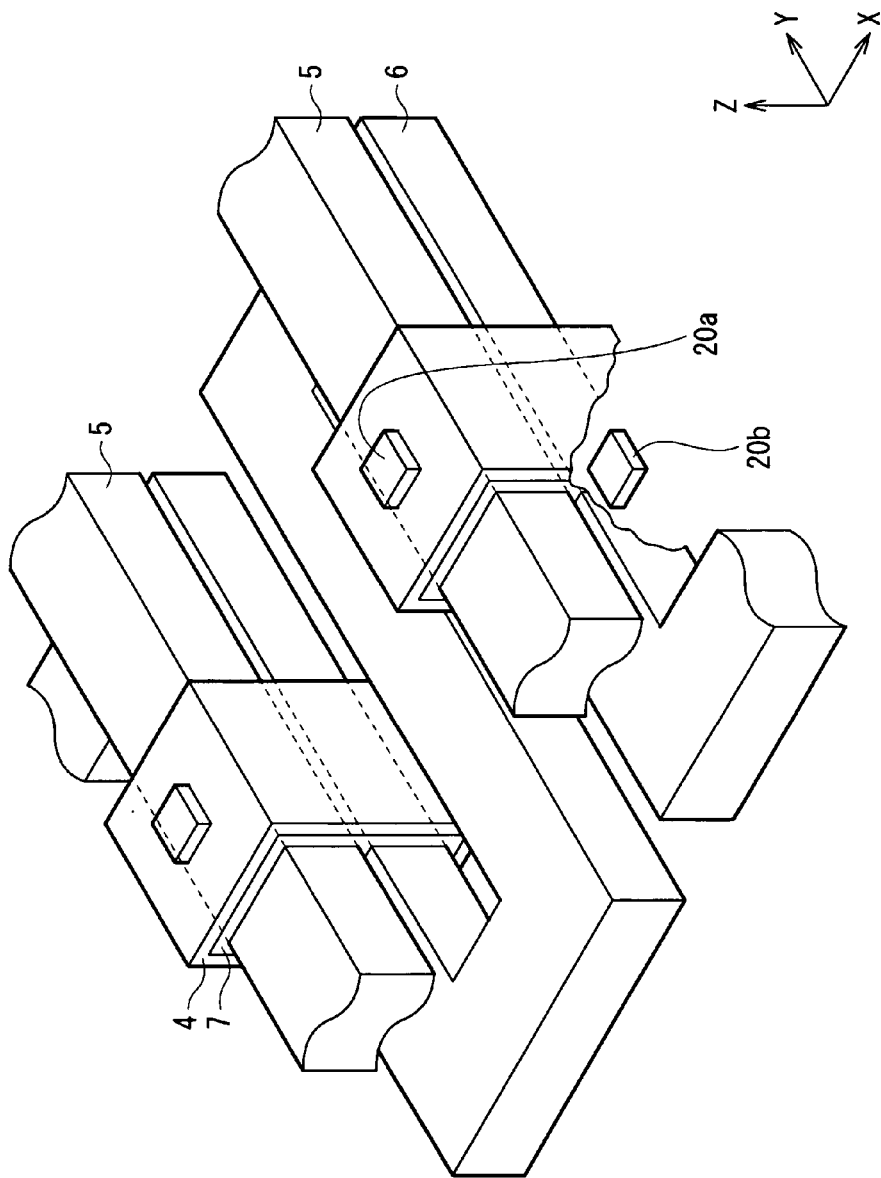
FIG. 4 is a perspective view showing the configuration of a main part of the memory cell group in the magnetic memory device illustrated in FIG. 1.

FIG. 4 is an enlarged perspective view of the memory cell 1. The write word line 6 as a first write line and the write bit line 5 as a second write line extend parallel with each other and penetrate the toroidal magnetic layer 4. The write word line 6, write bit line 5, and toroidal magnetic layer 4 are electrically insulated from each other via an insulating film 7. The stacked layer parts 20a and 20b are disposed on the surface of the toroidal magnetic layer 4 so that their stack layer surfaces face each other. Stacked bodies S20a and S20b in a pair including the pair of stacked layer parts 20a and 20b are electrically connected to conductive layers 36a and 36b (which will be described later), respectively. The pair of conductive layers 36a and 36b is a part of a pair of Schottky diodes 75a and 75b (which will be described later), and the other ends of the Schottky diodes 75a and 75b are connected to read bit lines 33a and 33b (not shown) extending in the Y direction.

Figure 5:
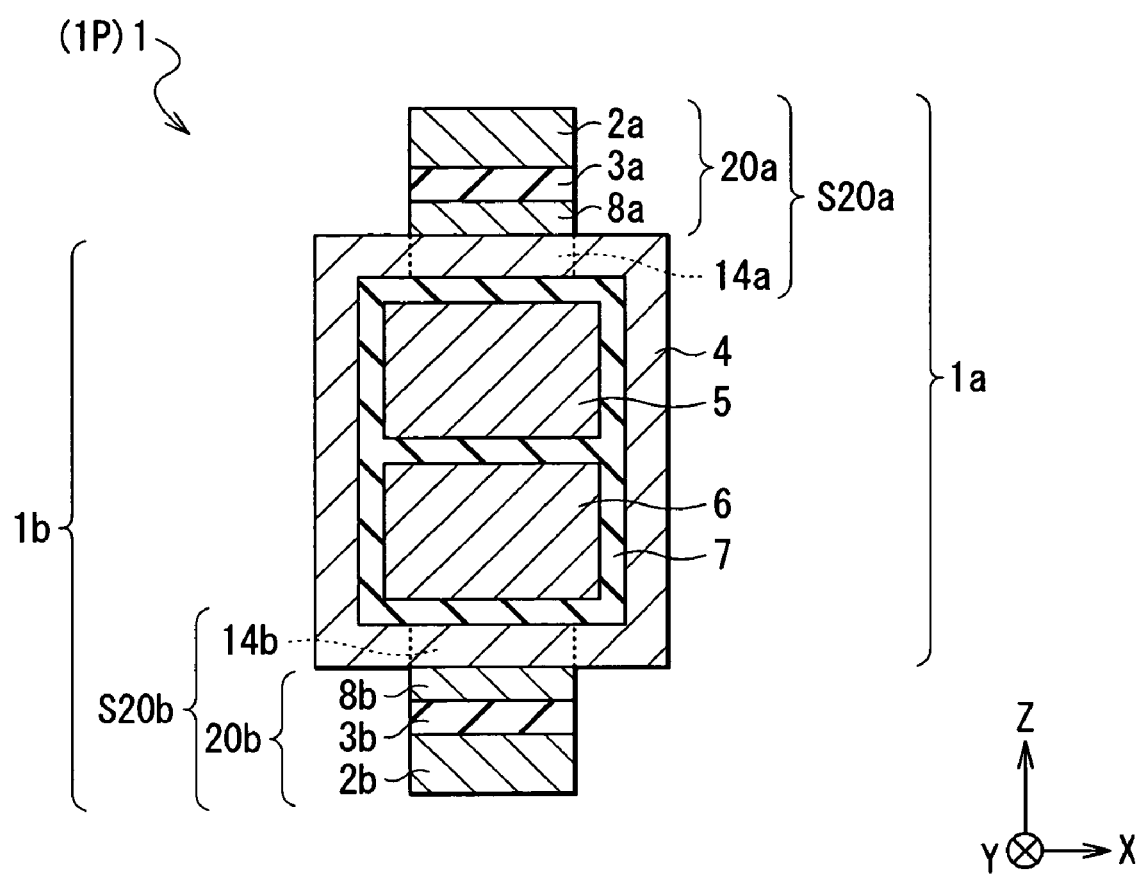
FIG. 5 is a cross section showing the configuration in a plane taken along line V-V of the magnetic memory cell illustrated in FIG. 3.

FIG. 5 shows a sectional configuration taken along line V-V of the memory cell 1 illustrated in FIG. 3. In order to distinguish the memory cell from a memory cell 1H as a modification of the embodiment, which will be described later, the memory cell 1 here is indicated as a memory cell 1P.

As shown in FIG. 5, the memory cell 1P includes: the stacked bodies S20a and S20b each including a magneto-sensitive layer whose magnetization direction changes according to the external magnetic field and constructed so that current flows in the direction perpendicular to the stack layer surface, which are disposed so that their stack layer surfaces face each other; and the toroidal magnetic layer 4 disposed commonly between the stacked bodies S20a and S20b by using the direction along the stack layer surface as the axial direction and through which the write word line 6 and the write bit line 5 extend along the axial direction. The stacked body S20a constructs the TMR device 1a in cooperation with the toroidal magnetic layer 4, and the stacked body S20b constructs the TMR device 1b in cooperation with the toroidal magnetic layer 4. In the memory cell 1P, the write word line 6 and the write bit line 5 are arranged so as to be adjacent to each other in the direction of the straight line passing through the stacked bodies S20a and S20b in the area where the write word line 6 and the write bit line 5 penetrate the toroidal magnetic layer 4. The stacked body S20a is a concrete example corresponding to a "first stacked body" in the invention, and the other stacked body S20b is a concrete example corresponding to a "second stacked body" in the invention.

The magneto-sensitive layer is constructed by a pair of connection parts 14a and 14b constructing a part of the toroidal magnetic layer 4 and a pair of second magnetic layers 8a and 8b which will be described later. The pair of connection parts 14a and 14b and the pair of second magnetic layers 8a and 8b magnetically exchange-coupled to each other. The connection parts 14a and 14b are a concrete example of a "first magneto-sensitive part" in the invention, and one of the second magnetic layers 8a and 8b is a concrete example of a "second magneto-sensitive part" in the invention.

The stacked bodies S20a and S20b are constructed by stack layer parts 20a and 20b and connection parts 14a and 14b, respectively. The stacked bodies S20a and S20b include, in order from the side of the toroidal magnetic layer 4 (connection parts 14a and 14b), the second magnetic layers 8a and 8b, tunnel barrier layers 3a and 3b, and first magnetic layers 2a and 2b whose magnetization direction is fixed, respectively, and constructed so that current flows in the direction perpendicular to the stack layer face. As described above, the second magnetic layers 8a and 8b function as magneto-sensitive layers together with the pair of connection parts 14a and 14b in the toroidal magnetic layer 4. The tunnel barrier layer 3 is a concrete example corresponding to a "nonmagnetic layer" in the invention. In FIG. 5, to clarify the configuration of the stacked bodies S20a and S20b, the stacked bodies S20a and S20b are exaggerated so as to be larger relative to the peripheral parts.

In the stacked bodies S20a and S20b, when a voltage is applied in the direction perpendicular to the layer stack face between the first magnetic layers 2a and 2b and the second magnetic layers 8a and 8b, for example, electrons in the first magnetic layers 2a and 2b pass through the tunnel barrier layers 3a and 3b and move to the second magnetic layers 8a and 8b, and tunnel current flows. The tunnel current changes according to a relative angle between the spin in the first magnetic layers 2a and 2b in the interface with the tunnel barrier layers 3a and 3b and the spin in the second magnetic layers 8a and 8b. Specifically, when the spin of the first magnetic layers 2a and 2b and that of the second magnetic layers 8a and 8b are parallel to each other, the resistance value becomes the minimum. When they antiparallel to each other, the resistance value becomes the maximum. By using the resistance values, the magneto-resistance change ratio (MR ratio) is defined as Formula (1).

$$\text{MR ratio} = dR/R \quad \text{Formula (1)}$$

where "dR" denotes the difference between the resistance value in the case where the spins are parallel to each other and that in the case where the spins are antiparallel to each other, and "R" indicates the resistance value in the case where the spins are parallel to each other.

The resistance value against the tunnel current (hereinbelow, called tunnel resistance Rt) strongly depends on the thickness T of the tunnel barrier layers 3a and 3b. In a low voltage region, as shown in Formula (2), the tunnel resistance Rt exponentially increases with the thickness T of the tunnel barrier layers 3a and 3b.

$$Rt \propto \exp(2\chi^T), \chi = \{8\pi^2 m^*(\phi \cdot Ef)^{0.5}\}/h \quad \text{Formula (2)}$$

where $\phi$ denotes the height of the barrier, "m*" denotes effective mass of electrons, "Ef" indicates Fermi energy, and h indicates a Planck's constant. Generally, in a memory element using the TMR device, to match with a semiconductor device such as a transistor, it is said that the proper tunnel resistance Rt is about tens $k\Omega \cdot (\mu m)^2$. However, to realize higher packing density in the magnetic memory device and higher operating speed, the tunnel resistance Rt is set to, preferably, 10 $k\Omega \cdot (\mu m)^2$ or less, more preferably, 1 $k\Omega \cdot (\mu m)^2$ or less. Therefore, to realize the tunnel resistance Rt, it is desirable to set the thickness T of the tunnel barrier layers 3a and 3b to 2 nm or less, more preferably, 1.5 nm or less.

By reducing the thickness T of the tunnel barrier layers 3a and 3b, the tunnel resistance Rt can be reduced but, on the other hand, a leak current occurs due to roughness of the junction interfaces with the first magnetic layers 2a and 2b and the second magnetic layers 8a and 8b so that the MR ratio deteriorates. To prevent this, the thickness T of the tunnel barrier layers 3a and 3b has to be large to an extent that leak current does not flow. Concretely, the thickness T is desirably 0.3 nm or larger.

Desirably, the stacked bodies S20a and S20b shown in FIG. 5 have a coercive force differential structure and the coercive force of the first magnetic layers 2a and 2b is larger than that of the second magnetic layers 8a and 8b. Concretely, the coercive force of the first magnetic layers 2a and 2b is preferably larger than $(50/4\pi) \times 10^3$ A/m, more preferably, $(100/4\pi) \times 10^3$ A/m. With the configuration, the magnetization direction of the first magnetic layers 2a and 2b can be prevented from being influenced by unnecessary magnetic fields such as external disturbance magnetic fields or the like. The first magnetic layers 2a and 2b are made of, for example, cobalt iron alloy (CoFe) and have a thickness of 5 nm. Alternately, cobalt (Co), cobalt platinum alloy (CoPt), nickel iron cobalt alloy (NiFeCo), or the like can be applied to the first magnetic layers 2a and 2b. The second magnetic layers 8a and 8b are made of, for example, cobalt (Co), cobalt iron alloy (CoFe), cobalt platinum alloy (CoPt), nickel iron alloy (NiFe), or nickel iron cobalt alloy (NiFeCo). The axes of easy magnetization of the first magnetic layers 2a and 2b and the second magnetic layers 8a and 8b are preferably parallel to each other so that the magnetization direction of the first magnetic layers 2a and 2b and that of the second magnetic layers 8a and 8b are stabilized in a parallel orantiparallel state.

The toroidal magnetic layer 4 extends so as to surround at least a part of the parallel part 10 in the write bit line 5 and the write word line 6 and are constructed so that a circulating magnetic field is generated in the toroidal magnetic layer 4 by current flowing in the parallel part 10. The magnetization direction of the toroidal magnetic layer 4 is inverted by the circulating magnetic field. The connection parts 14a and 14b in the toroidal magnetic layer 4 and the second magnetic layers 8a and 8b adjacent to the connection parts 14a and 14b function as storage layers for storing information. The toroidal magnetic layer 4 is made of, for example, nickel iron alloy (NiFe) and, desirably, the coercive force of the connection parts 14a and 14b is smaller than that of the first magnetic layers 2a and 2b within the range of $(100/4\pi) \times 10^3$ A/m or less. With the coercive force exceeding $(100/4\pi) \times 10^3$ A/m, the TMR films 20a and 20b themselves may deteriorate due to heat generation caused by increase in write current. Further, when the coercive force of the connection parts 14a and 14b becomes equal to or larger than that of the first magnetic layers 2a and 2b, the write current increases, the magnetization directions of the first magnetic layers 2a and 2b as magnetization pinned layers are changed, and the TMR devices 1a and 1b as memory elements are destroyed. The magnetic permeability of the toroidal magnetic layer 4 is preferably high to make the current magnetic field generated by the write bit line 5 and the write word line 6 concentrated on the toroidal magnetic layer 4. To be concrete, the magnetic permeability is 2,000 or higher and, more preferably, 6,000 or higher.

Each of the write bit line 5 and the write word line 6 has a structure in which a film of titanium (Ti) having a thickness of 10 nm, a film of titanium nitride (TiN) having a thickness of 10 nm, and a film of aluminum (Al) having a thickness of 500 nm are sequentially stacked. The write bit line 5 and the write word line 6 are electrically insulated from each other by the insulating film 7. The write bit line 5 and the write word line 6 may be made of at least one of, for example, aluminum (Al), copper (Cu), and tungsten (W). More concrete operation of writing information to the memory cell 1 by using the write bit line 5 and the write word line 6 will be described later.

Figure 6:
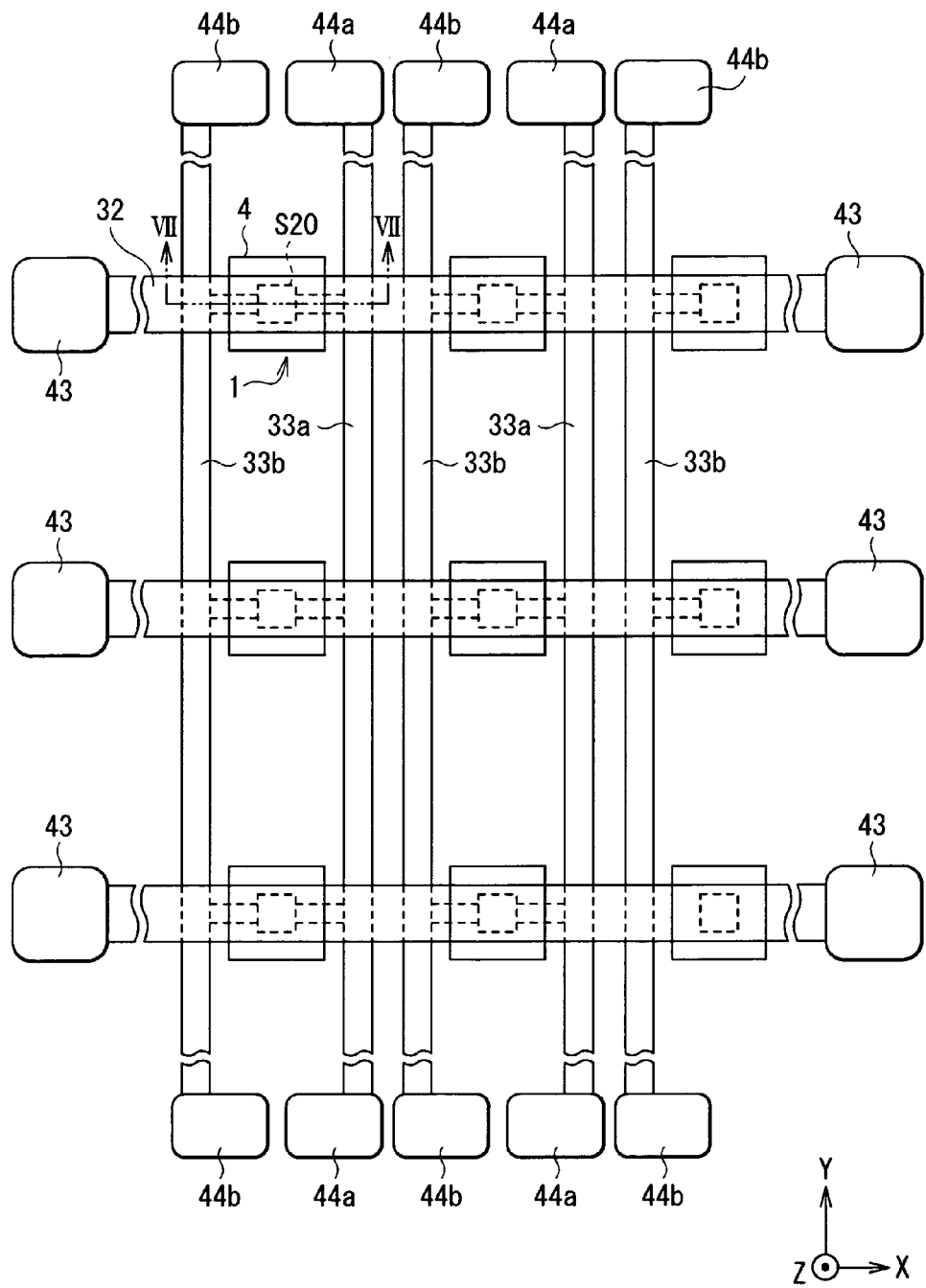
FIG. 6 is another partial plan view showing the configuration of the main part of the memory cell group in the magnetic memory device illustrated in FIG. 1.

The configuration related to information reading operation will now be described. FIG. 6 shows a planar configuration of a main part related to the reading operation in the memory cell group 54 and corresponds to FIG. 3.

As shown in FIG. 6, each memory cell 1 is disposed at each of the intersecting points of the plurality of read word lines 32 and the plurality of read bit lines 33 in the XY plane. Concretely, the read bit line 33 is constructed by a pair of read bit lines 33a and 33b, and the memory cell 1 is provided in an area where it crosses a read word line 32 in an area between the read bit lines 33a and 33b. The pair of read bit lines 33a and 33b are electrically connected to the pair of the stack layer parts 20a and 20b via a pair of Schottky diodes 75a and 75b (which will be described later). One of the read word lines 32 is electrically connected to the toroidal magnetic layer 4 in the memory cell 1 via a connection layer or the like. The pair of read bit lines 33a and 33b supply read current to the pair of TMR devices 1a and 1b, respectively, in each memory cell 1. One of the read word lines 32 leads the read current flowed in each of the TMR devices 1a and 1b to the ground. At both ends of each of the read bit lines 33a and 33b, read bit line lead electrodes 44a and 44b are provided. On the other hand, at both ends of each of the read word lines 32, read word line lead electrodes 43 are provided. The read bit line 33 is a concrete example of a "first read line" of the invention, and the read word line 32 is a concrete example of a "second read line" of the invention.

Figure 7:
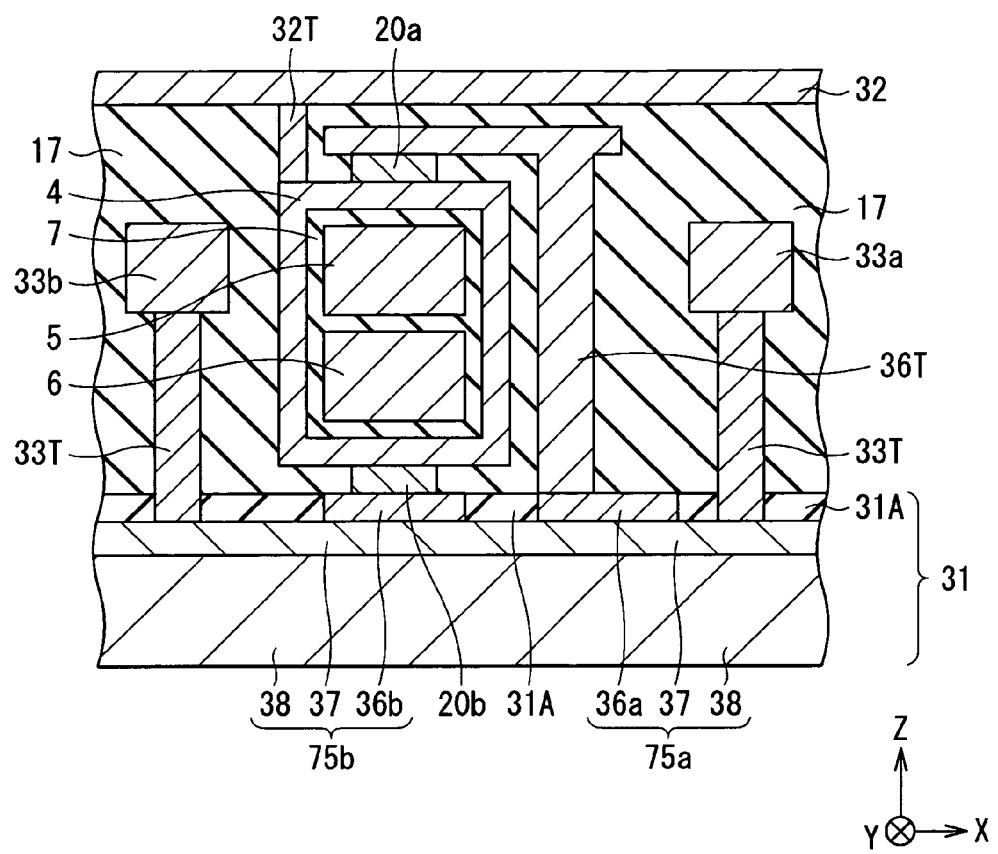
FIG. 7 is a cross section showing the configuration in a plane taken along line VII-VII of the memory cell illustrated in FIG. 6.

FIG. 7 is a cross section taken along line VII-VII shown in FIG. 6. As shown in FIG. 7, the magnetic memory device of the embodiment is constructed so that, in a region including the memory cell 1, a pair of stacked bodies 20a and 20b and the toroidal magnetic layer 4 are formed in order over the substrate 31 provided with the pair of Schottky diodes 75a and 75b (hereinbelow, simply called diodes 75a and 75b) functioning as a rectifier. The diode 75a is a concrete example of a "first rectifying device" of the invention, and the other diode 75b is a concrete example of a "second rectifying device" of the invention.

The pair of diodes 75a and 75b have the conductive layers 36a and 36b, an epitaxial layer 37, and a substrate 38 in order from the side of the memory cell 1. Between the conductive layers 36a and 36b and the epitaxial layer 37, a Schottky barrier is formed. The diodes 75a and 75b do not have parts electrically connected to each other except for connection to the toroidal magnetic layer 4 while sandwiching the stack layer parts 20a and 20b. The substrate 38 is an n-type silicon wafer. Generally, in the n-type silicon wafer, an impurity of phosphorus (P) is diffused. As the substrate 38, a wafer of an $n^{++}$ type obtained by being highly doped with phosphorus is used. In contrast, as the epitaxial layer 37, a wafer of the n-type obtained by being lightly doped with phosphorus is used. By making the epitaxial layer 37 as an n-type semiconductor and the conductive layers 36a and 36b made of a metal come into contact with each other, a bandgap is created and a Schottky barrier is formed. Further, the pair of diodes 75a and 75b is connected to the read bit lines 33a and 33b, respectively, via a connection layer 33T.

Figure 8:
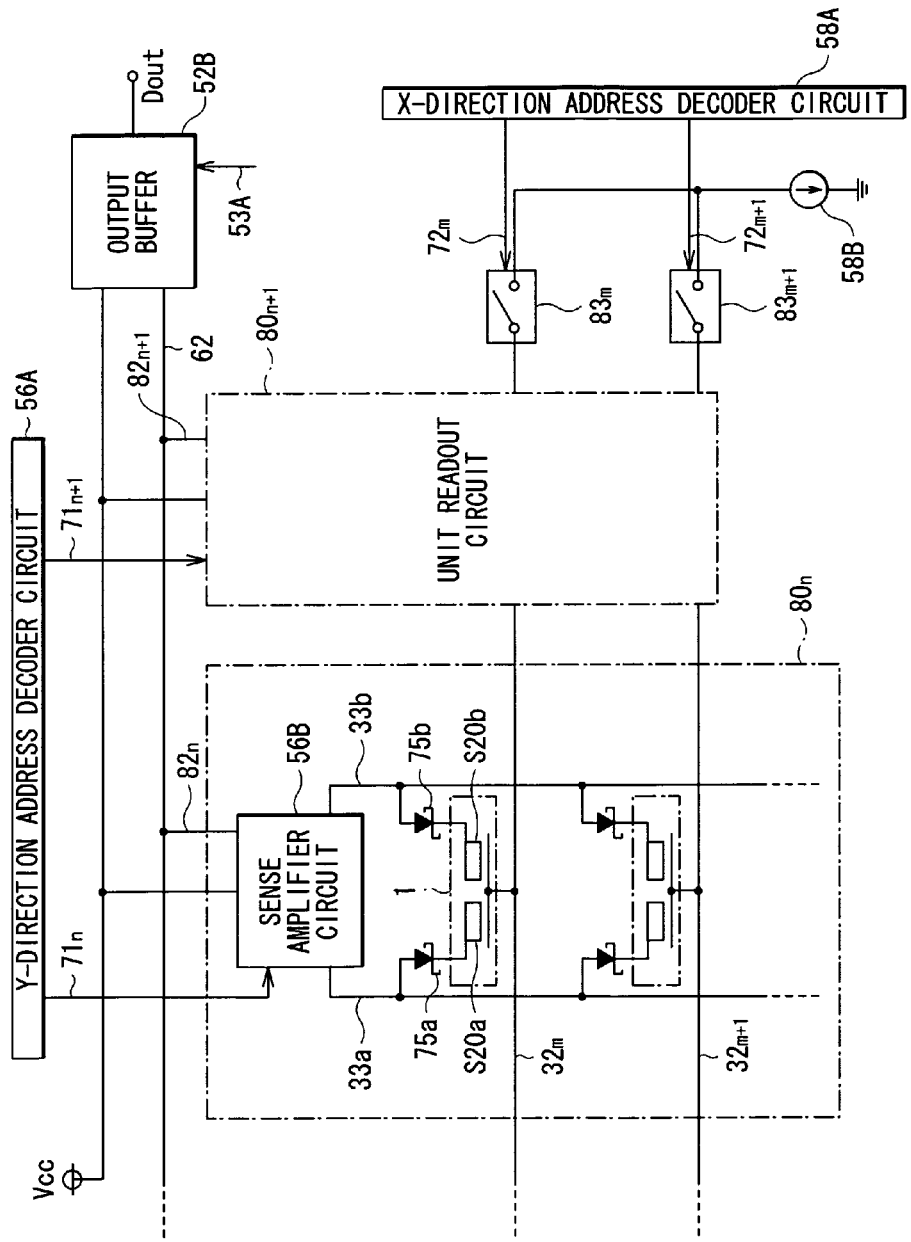
FIG. 8 is a circuit diagram showing the circuit configuration of the magnetic memory device illustrated in FIG. 1.

Referring now to FIG. 8, the circuit configuration related to the reading operation in the magnetic memory device of the embodiment will be described.

FIG. 8 is a configuration diagram of a circuit system constructed by the memory cell group 54 and a readout circuit. In the read circuit system, the memory cell 1 is of a differential amplifier type constructed by the pair of TMR devices 1a and 1b. Information in the memory cell 1 is read by outputting a differential value of read currents passed to the stacked bodies S20a and S20b in the TMR devices 1a and 1b, respectively, (currents passed from the read bit lines 33a and 33b to the stacked bodies S20a and S20b and output to the common read word line 32).

In FIG. 8, a unit readout circuit 80 ( . . . , 80n, 80n+1, . . . ) as a unit of repetition of the read circuit is constructed by the memory cells 1 of each bit line in the memory cell group 54 and a part of the readout circuit including the sense amplification circuit 56B, and the unit readout circuits 80n are arranged in the bit line direction. Each of the unit readout circuits 80n is connected to the Y-direction address decoder circuit 56A via the bit decode line 71 ( . . . , 71n, 71n+1, . . . ) and is connected to the output buffer 52B via the Y-direction read data bus 62.

In the memory cell group 54, the read word lines 32 ( . . . , 32m, 32m+1, . . . ) extending in the X direction and the pair of read bit lines 33a and 33b extending in the Y direction are arranged in a matrix. Each of the memory cells 1 is disposed at a position intersecting with the read word line 32 in a region sandwiched by the pair of read bit lines 33a and 33b. One ends of the stacked bodies S20a and S20b in each memory cell 1 are connected to the read bit lines 33a and 33b via the pair of diodes 75a and 75b, respectively, and the other ends are connected to the common read word line 32.

One end of each read word line 32 is connected to a read switch 83 ( . . . , 83m, 83m+1, . . . ) via the read word line lead electrode 43 and is also connected to the common constant current circuit 58B. Each read switch 83 is connected to the X-direction address decoder circuit 58A via the word decode line 72 (..., 72m, 72m+1, ...). The read switch 83 is made conductive when a selection signal from the X-direction address decoder circuit 58A is supplied. The constant current circuit 58B has the function of making the current flowing in the read word line 32 constant.

One end of each of the read bit lines 33a and 33b is connected to the sense amplification circuit 56B via the read bit line lead electrodes 44a and 44b, and the other end is finally grounded. The sense amplification circuit 56B is provided per unit readout circuit 80 and has the function of receiving the potential difference between the pair of read bit lines 33a and 33b in each unit readout circuit 80 and amplifying the potential difference. The sense amplification circuit 56B is connected to the output line 82 (..., 82n, 82n+1, ...) and is finally connected to the output buffer 52B via the Y-direction read data bus 62.

The operation in the magnetic memory device of the embodiment will now be described.

First, by referring to FIG. 2 and FIGS. 9A and 9B, the operation of writing information in the memory cell 1P will be described. FIGS. 9A and 9B express the relation between the write current direction and the circulating magnetic field direction (magnetization direction) in the sectional configuration of the memory cell 1P shown in FIG. 5. The arrows indicated in magnetic layers in FIGS. 9A and 9B indicate the magnetization directions of the magnetic layers. With respect to the toroidal magnetic layer 4, the magnetic field directions are also shown. The magnetization of the first magnetic layers 2a and 2b is fixed to the −X direction.

FIG. 9A shows the case where write current flows in the same direction to the write bit line 5 and the write word line 6 which extend in the memory cell 1 and are parallel with each other. FIG. 9A corresponds to the write current direction shown in FIG. 2. FIG. 9A shows a case where write current flows from the depth to this side in the direction perpendicular to the drawing sheet (to the −Y direction) in the memory cell 1P, and a circulating magnetic field 34 is generated in the counterclockwise direction in the toroidal magnetic layer 4. In this case, the magnetization direction of the connection part 14a and the second magnetic layer 8a is the −X direction, and the magnetization direction of the connection part 14b and the second magnetic layer 8b is the +X direction. FIG. 9B corresponds to the case where the directions of current flowing in the write bit line 5 and the write word line 6 are opposite to those shown in FIG. 9A. Specifically, FIG. 9B shows a case where write current flows from this side to the depth in the direction perpendicular to the drawing sheet (to the +Y direction) in the memory cell 1P, the circulating magnetic field 34 is generated in the clockwise direction in the toroidal magnetic layer 4. In this case, the magnetization direction of the connection part 14a and the second magnetic layer 8a is the +X direction, and the magnetization direction of the connection part 14b and the second magnetic layer 8b is the −X direction.

As obvious from FIGS. 9A and 9B, according to the direction of the circulating magnetic field 34 generated by the currents flowing in the write bit line 5 and the write word line 6 penetrating the toroidal magnetic layer 4, the magnetization directions of the second magnetic layers 8a and 8b in the pair of TMR-devices 1a and 1b change so as to be opposite to each other. By using the phenomenon, information can be stored in the memory cell 1.

To be specific, when current flows in the same direction in the write bit line 5 and the write word line 6, the magnetization direction of the toroidal magnetic layer 4 is inverted and, accompanying the inversion, the magnetization direction of the second magnetic layer 8 changes, thereby enabling binary information of "0" or "1" to be stored. In the case where "0" corresponds to, for example, the state of FIG. 9A, specifically, the state where the second magnetic layer 8a in the pair of second magnetic layers 8 is magnetized in the −X direction and the other second magnetic layer 8b is magnetized in the +X direction, "1" corresponds to the state of FIG. 9B, specifically, the state where the second magnetic layer 8a is magnetized in the +X direction and the other second magnetic layer 8b is magnetized in the −X direction. The −X direction is a concrete example of a "first direction" in the invention, and the +X direction is a concrete example of a "second direction" in the invention. Therefore, the state of FIG. 9A is a concrete example of a "first state" in the invention, and the state of FIG. 9B is a concrete example of a "second state".

In this case, in the TMR devices 1a and 1b, when the magnetization direction of the first magnetic layers 2a and 2b and that of the second magnetic layers 8a and 8b are parallel to each other, a low resistance state in which large tunnel current flows is obtained. When they are antiparallel to each other, a high resistance state in which only small tunnel current flows is obtained. That is, one of the pair of TMR devices 1a and 1b is always in the low resistance state and the other one is in the high resistance state, thereby storing information. In the case where the write currents flow in the opposite directions in the write bit line 5 and the write word line 6 or in the case where the write current flows only in the write bit line 5 or the write word line 6, the magnetization direction of each of the second magnetic layers 8 is not inverted and the data is not rewritten.

As described above, in the memory cell 1 in the magnetic memory device of the embodiment, by passing the currents in the same direction to both of the write bit line 5 and the write word line 6, the direction of the current magnetic field generated by the write bit line 5 and that of the current magnetic field generated by the write word line 6 become the same in the toroidal magnetic layer 4, so that a synthetic magnetic field can be generated. Consequently, as compared with the case where the toroidal magnetic layer 4 is not provided and the case where the write bit line 5 and the write word line 6 perpendicularly cross each other, higher magnetic flux density is obtained. Thus, the current magnetic field can be used more efficiently and the current necessary to invert the magnetization in the connection parts 14a and 14b of the toroidal magnetic layer 4 and the second magnetic layers 8a and 8b can be further reduced. Moreover, in the memory cell 1, a pair of stacked bodies S20a and S20b are disposed so that their stack layer surfaces face each other, so that the magnetization direction in the connection part 14a and the second magnetic layer 8a and the magnetization direction in the connection part 14b and the second magnetic layer 8b are necessarily antiparallel to each other. Therefore, by using the phenomenon, binary information of "0" or "1" can be stored. Since the toroidal magnetic layer 4 is provided commonly for the pair of stacked bodies S20a and S20b, the pair of TMR devices 1a and 1b can be easily formed, the formation area of the memory cell 1 can be reduced, and a larger amount of stored information can be increased.

Since the second magnetic layer 8 is provided between the tunnel barrier layer 3 and the connection part 14 of the toroidal magnetic layer 4, the following advantages are obtained. The connection part 14 and the second magnetic layer 8 can be exchange-coupled and the magnetization direction of the second magnetic layer 8 as a second magnetic sensitive part is aligned more preferably, so that more stable writing can be performed. Further, the coercive force of the connection part 14 can be reduced. Consequently, by reducing the current value at the time of writing operation, the heat generation amount can be reduced, and the functions of the magnetic memory device can be fully displayed.

Referring now to FIGS. 1, 8, 10A, and 10B, the reading operation in the magnetic memory device will be described.

First, one of the plurality of bit decode lines 71 is selected by the address decoder circuit 56A in the first drive control circuit portion 56 and a control signal is transmitted to the corresponding sense amplification circuit 56B. As a result, read current flows in the read bit lines 33a and 33b and the positive potential is given to the side of the stacked bodies S20a and S20b in the TMR devices 1a and 1b. Similarly, by the X-direction address decoder circuit 58A in the second drive control circuit portion 58, one of the plurality of word decode lines 72 is selected and the read switch 83 in the corresponding part is driven. The selected read switch 83 is energized, read current flows in the corresponding read word line 32, and a negative potential is given to the side opposite to that of the stacked bodies S20a and S20b in the TMR devices 1a and 1b. Therefore, read current necessary for reading can be passed to one memory cell 1 selected by the Y-direction address decoder circuit 56A and the X-direction address decoder circuit 58A. Based on the read current, the magnetization directions of the pair of second magnetic layers 8a and 8b are detected, thereby enabling stored information to be read. It is important that the read current from the read bit lines 33a and 33b passes through the pair of diodes 75a and 75b and flow in the memory cell 1. The reason will be described later.

Figure 10A:
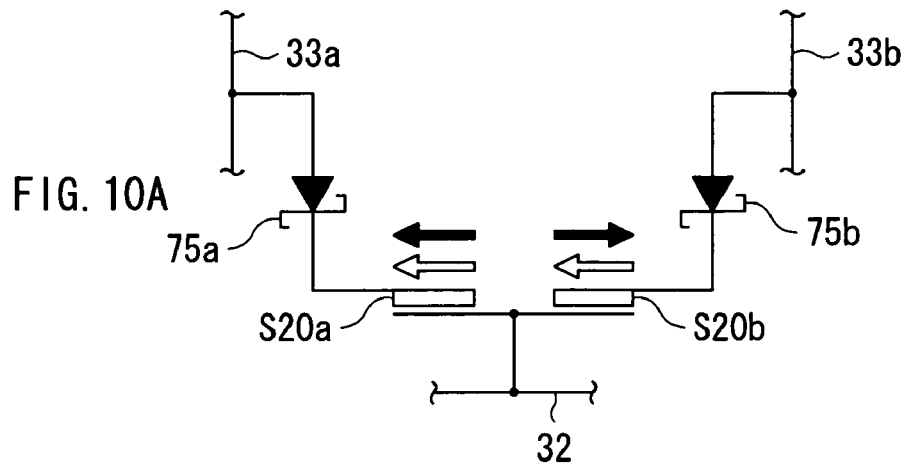
FIGS. 10A and 10B are partial enlarged views of the circuit configuration illustrated in FIG. 8.
Figure 10B:
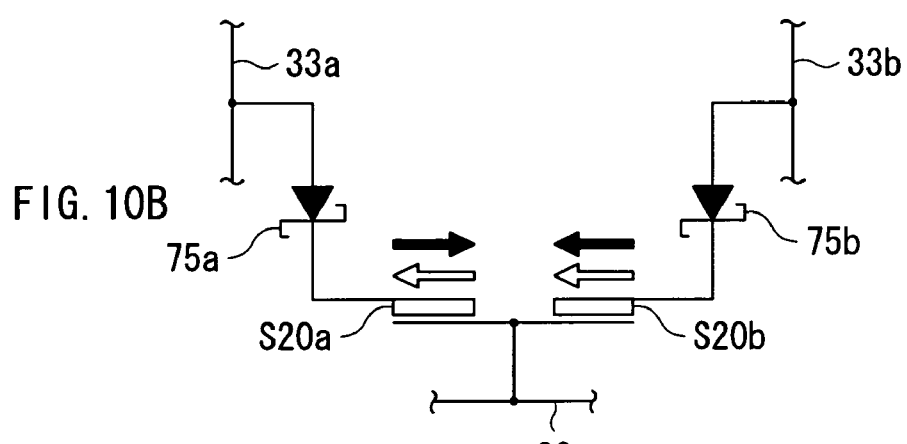

FIGS. 10A and 10B are circuit diagrams each showing a portion around the memory cell 1. The magnetization directions of the first magnetic layers 2a and 2b in the stacked bodies S20a and S20b are indicated by hollow arrows, and those of the second magnetic layers 8a and 8b are indicated by solid arrows. Both of the magnetization directions of the first magnetic layers 2a and 2b are fixed to the left directions. FIG. 10A shows a state corresponding to FIG. 9A. In FIG. 10A, the magnetization direction of the first magnetic layer 2a and that in the second magnetic layer 8a in the stacked body S20a are the same, and the magnetization direction of the first magnetic layer 2b and that of the second magnetic layer 8b in the other stacked body S20b are antiparallel to each other. In this case, the stacked body S20a is in the low resistance state, and the stacked body S20b is in the high resistance state. This case corresponds to, for example, "0". In the other case of FIG. 10B showing a state corresponding to FIG. 9B, different from the case of FIG. 10A, the stacked body S20a is in the high resistance state and the stacked body S20b is in the low resistance state. This case corresponds to, for example, "1". Such binary information can be read by utilizing the fact that the resistance values of the stacked bodies S20a and S20b are different from each other and detecting the difference between the values of currents flowing in the stacked bodies S20a and S20b.

Figure 46:
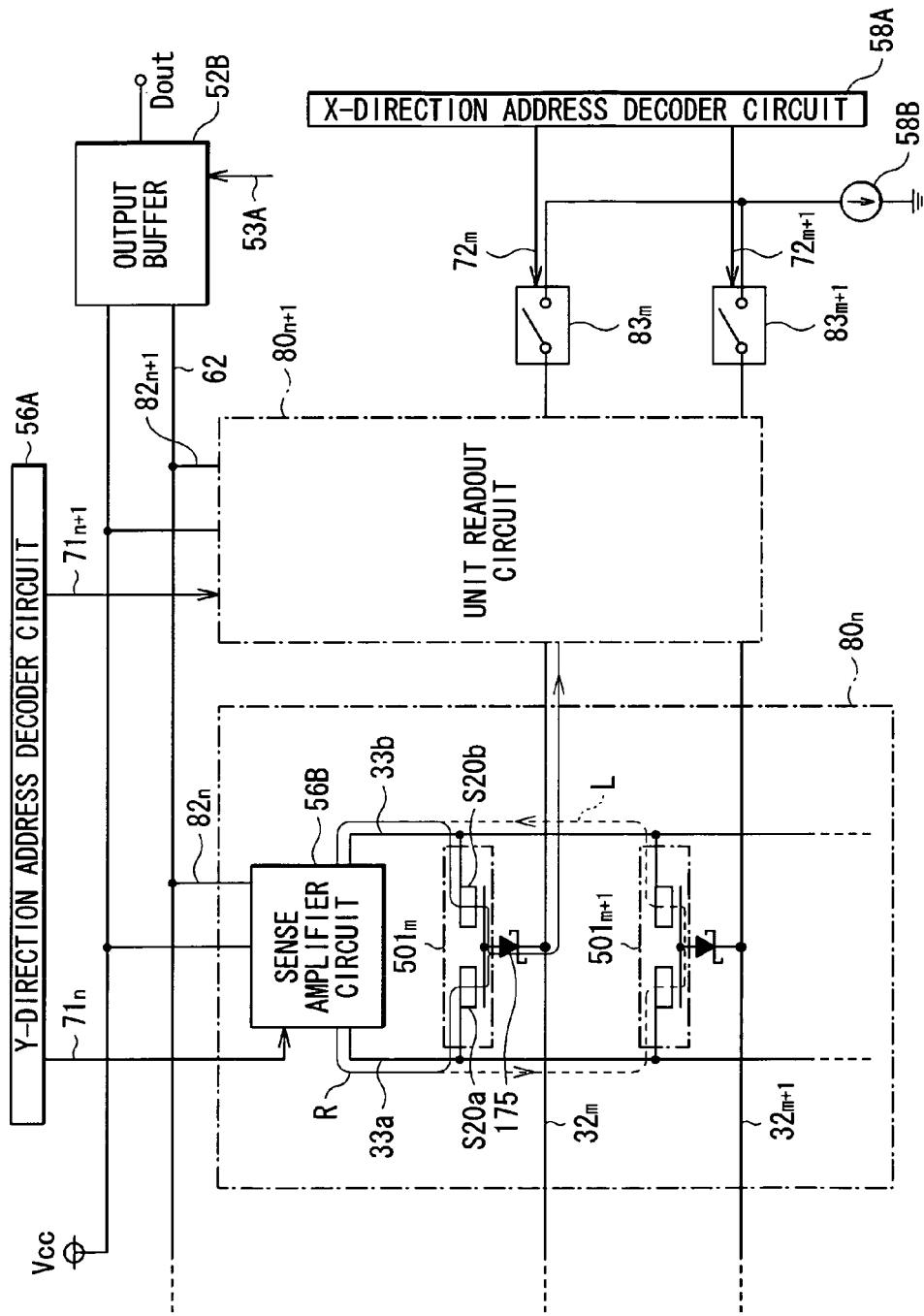
FIG. 46 is a circuit diagram showing a circuit configuration as a comparative example corresponding to the circuit configuration illustrated in FIG. 8.
Figure 47:
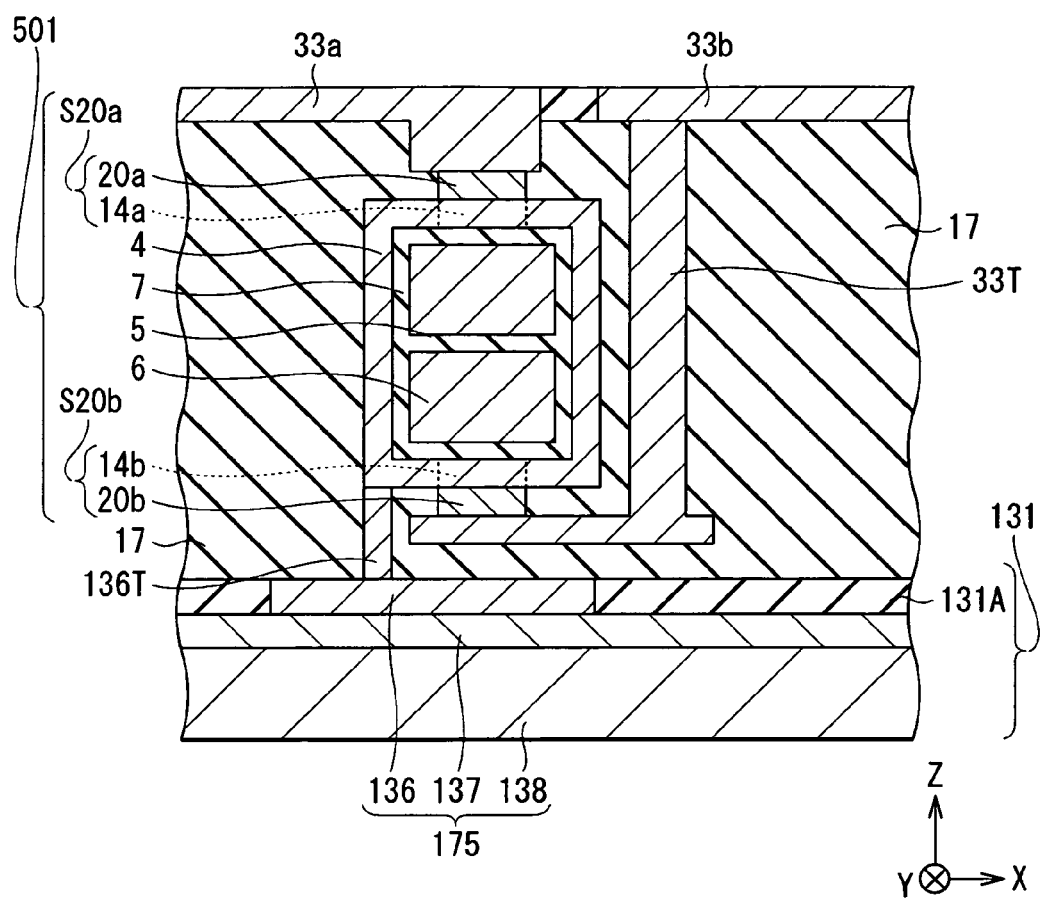
FIG. 47 is a cross section showing the configuration of a main part of a magnetic memory device corresponding to the circuit configurations illustrated in FIGS. 38A and 38B.
Figure 48:
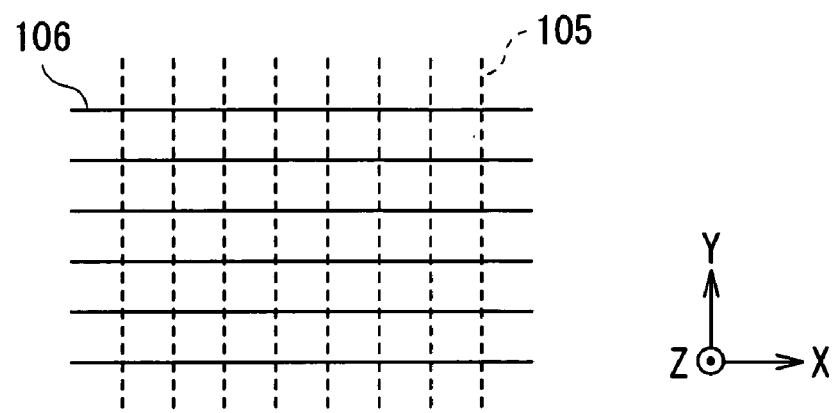
FIG. 48 is a plan view illustrating the configuration of a conventional magnetic memory device.
Figure 49:
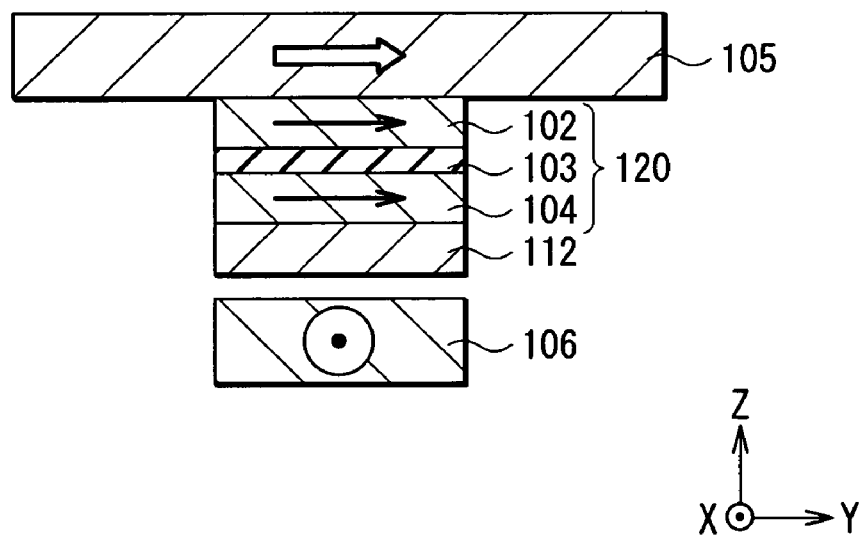
FIG. 49 is a cross section illustrating the configuration of a main part of the conventional magnetic memory device.

The action in the reading operation of the magnetic memory device of the embodiment will be described in comparison with a comparative example. FIG. 46 is a configuration diagram of a circuit system including a memory cell group including a memory cell 501 as a comparative example of the embodiment and a readout circuit. FIG. 47 shows a sectional configuration of the memory cell 501.

In the comparative example shown in FIGS. 46 and 47, one diode 175 is provided on the side opposite to the sense amplifier circuit 56B for the pair of stacked bodies S20a and S20b. As shown in FIG. 47, the memory cell 501 is formed on the diode 175 buried in a substrate 131 and its top face is connected to the pair of read bit lines 33a and 33b. More concretely, the memory cell 501 has the toroidal magnetic layer 4 electrically connected to a conductive layer 136 of the diode 175 via a connection layer 136T and the pair of connection parts 20a and 20b facing each other on the surface of the toroidal magnetic layer 4. The pair of stacked bodies S20a and S20b is formed by the pair of connection parts 20a and 20b in cooperation with part of the toroidal magnetic layer 4, and the stacked bodies S20a and S20b in a pair are connected to the read bit lines 33a and 33b in a pair, respectively.

In the case of selecting a read switch 83m and reading information stored in a memory cell 501m, in the comparative example of FIGS. 46 and 47, a round of read current which flows in a path L passing the memory cell 501m+1 occurs. A path R indicated by solid line is a regular current path. Concretely, for example, the read current flowed from the sense amplifier circuit 56B to the read bit line 33a flows in the stacked body S20a of the memory cell 501m+1 which is not inherently selected as a cell to be read, and further passes through the stacked body S20b via the toroidal magnetic layer 4 shared. After that, the read current flows backward through the read bit line 33b toward the sense amplifier circuit 56B and joins to the read current flowing toward the stacked body S20b of the memory cell 501m.

In contrast, in the magnetic memory device of the embodiment, the stacked body S20b, the toroidal magnetic layer 4, and the stacked body S20a are sequentially stacked on the substrate 31 in which the pair of diodes 75a and 75b are provided, and the pair of diodes 75a and 75b and the toroidal magnetic layer 4 are electrically connected to each other via the pair of stacked bodies S20a and S20b. As a result, the circuit configuration is obtained in which the pair of diodes 75a and 75b is disposed between the pair of read bit lines 33a and 33b and the pair of stacked bodies S20a and S20b, respectively, on each of current paths of the read current supplied to the pair of stacked bodies S20a and S20b. Therefore, noise on a read signal can be reduced, and magnetic information can be stably read.

Further, in the magnetic memory device of the embodiment, read current is supplied from each of the read bit lines 33a and 33b in the pair to each of the first and second stacked bodies S20a and S20b. On the basis of the difference between the pair of read current values, information can be read from the magnetic memory cell. Consequently, the read currents are differentially output so that noise occurring in each of the read bit lines 33 and an offset component included in each of output values of the TMR devices 1a and 1b are cancelled out each other and removed.

A method of manufacturing the magnetic memory device of the embodiment having the configuration as described above will now be described.

The method of manufacturing the magnetic memory device of the embodiment includes the steps of forming the stacked layer part 20b as part of the stacked body S20b over the substrate 31 provided with the pair of diodes 75a and 75b; forming a bottom magnetic layer 4B so as to cover at least the stacked layer part 20b; forming the write word line 6 over the bottom magnetic layer 4B via an insulating film 7A; forming the write bit line 5 over the write word line 6 via an insulating film 7C so as to include a part in which the write word line 6 and the write bit line 5 extend in parallel with each other; forming a stack layer pattern forming a stack layer pattern 19 including a part in which the write word line 6 and the write bit line 5 extend in parallel with each other by sequentially etching and patterning the write bit line 5, the insulating film 7C, and the write word line 6;

forming the toroidal magnetic layer 4 by providing a top magnetic layer so as to surround of the stack layer pattern 19 via insulating films 7D and 7E; forming the stacked body S20a by providing the stack layer part 20a in a position corresponding to the stacked body S20b over the toroidal magnetic layer 4 and forming the memory cell 1 having the stacked bodies S20a and S20b; and electrically connecting the stacked body S20a and the diode 75a. The method will be described concretely hereinbelow.

A method of manufacturing, mainly, the memory cell 1 in the magnetic memory device will be described in detail by referring to FIGS. 11 to 30. FIGS. 11 to 30 are cross sections corresponding to FIG. 7 and show manufacturing processes.

Figure 11:
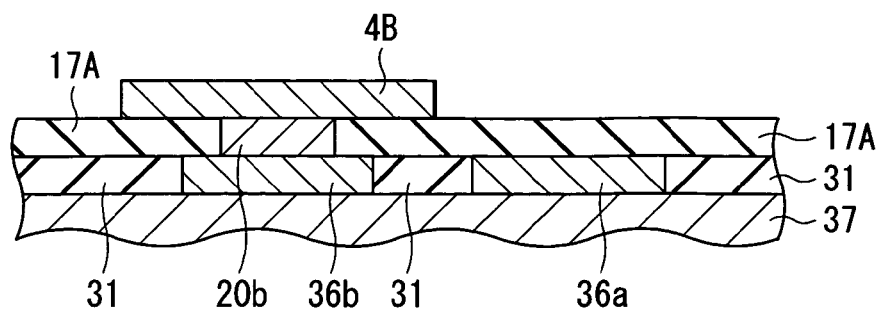
FIG. 11 is an enlarged cross section showing a process in a method of manufacturing the magnetic memory device illustrated in FIG. 1.

First, as shown in FIG. 11, the substrate 31 in which the pair of diodes 75a and 75b is buried is prepared, and the stack layer part 20b is formed on the conductive layer 36b in the diode 75b. Concretely, first, a resist pattern is selectively formed so as to cover the area other than the area for forming the stack layer part 20b by an i-line stepper or the like. Next, the first magnetic layer 2b taking the form of, for example, a CoFe layer, and an aluminum (Al) layer are sequentially formed on the whole surface by sputtering or the like. By performing an oxidizing process on the aluminum layer, the tunnel barrier layer 3b is obtained. Further, on the tunnel barrier layer 3b, the second magnetic layer 8b taking the form of, for example, a CoFe layer is formed by sputtering or the like. To prevent deterioration during process on the stack layer part 20b, a cap layer (protective layer) made of tantalum (Ta) or the like may be provided. Subsequently, by lifting off the resist pattern, the stack layer part 20b having a predetermined pattern shape and constructed by the first magnetic layer 2, the tunnel barrier layer 3, and the second magnetic layer 8 is exposed.

Next, for example, by using TEOS (tetraethylorthosilicate; $Si(OC_2H_5)_4$), an insulating film 17A made of silicon oxide ($SiO_2$) is formed so as to cover the whole by a CVD (Chemical Vapor Deposition) system. After that, for example, annealing is performed at a temperature of 250° C. or less in magnetic fields of $(1/\pi) \times 10^6$ A/m, thereby pinning the magnetization direction of the first magnetic layer 2b. After annealing, for example, by a CMP (Chemical Mechanical Polishing) system, the surface of the insulating film 17A is planarized and the top face of the stack layer part 20b is exposed. Further, by reverse sputtering or the like, impurities in the top face of the stack layer part 20b are removed. After that, the bottom magnetic layer 4B is selectively formed so as to cover the top face of the stack layer part 20b. By the operation, formation of the stacked body S20b constructed by part of the bottom magnetic layer 4B and the stack layer part 20b completes. In this case, a resist frame (not shown) is formed selectively by using photolithography. After that, for example, an NiFe layer is formed in a non-protection area by sputtering or the like, and the resist frame is removed.

Figure 12:
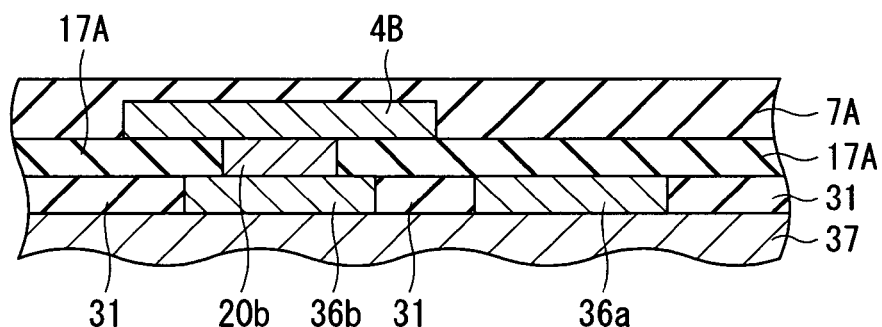
FIG. 12 is an enlarged cross section showing a process subsequent to FIG. 11.

After formation of the bottom magnetic layer 4B, as shown in FIG. 12, the insulating film 7A made of, for example, $SiO_2$ is formed so as to cover the whole by a CVD system. The insulating film 7A is a concrete example corresponding to a "first insulating film" of the invention.

Figure 13:
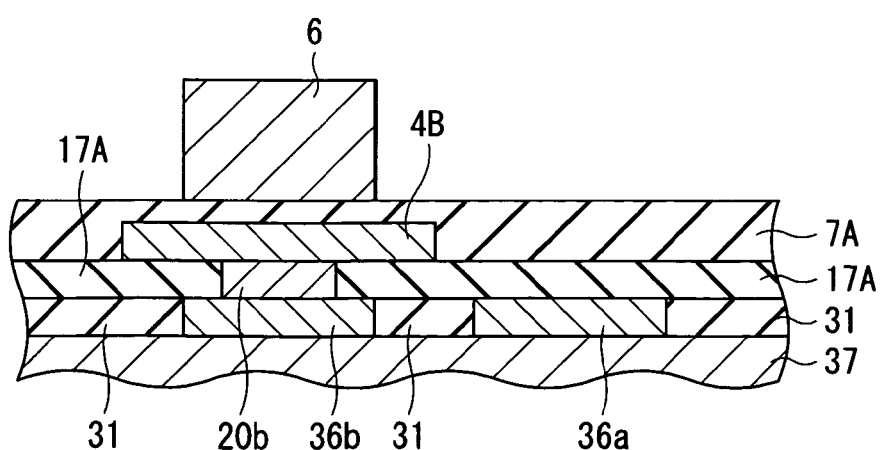
FIG. 13 is an enlarged cross section showing a process subsequent to FIG. 12.

Subsequently, a metal layer (not shown) made of, for example, titanium (Ti) is formed on the insulating film 7A by sputtering or the like. After that, as shown in FIG. 13, on the metal layer, the write word line 6 is selectively formed so as to cover at least the area for forming the stacked body S20b. Concretely, a resist pattern (not shown) having a predetermined shape is formed on the metal layer on the insulating film 7A. After that, the resultant is soaked in a plating bath and a plating process using the metal layer as an electrode is performed, thereby forming the write word line 6 made of, for example, copper (Cu). After removing the resist pattern, the unnecessary metal layer is removed by ion milling.

Figure 14:
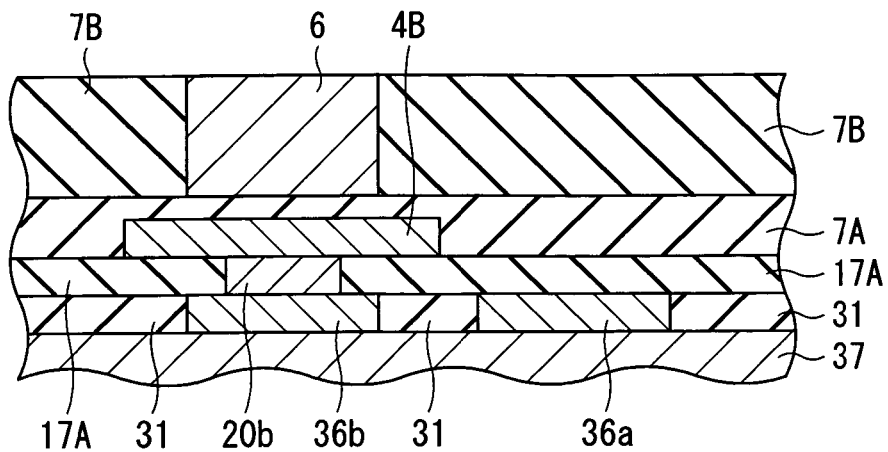
FIG. 14 is an enlarged cross section showing a process subsequent to FIG. 13

Next, as shown in FIG. 14, an insulating film 7B made of, for example, $SiO_2$ is formed so as to cover the whole by using the CVD system. After that, the insulating film 7B is polished until the write word line 6 is exposed finally by the CMP system, thereby planarizing the surface of the write word line 6 and the insulating film 7B. The insulating film 7B is a concrete example corresponding to a "second insulating film" of the invention.

Figure 15:
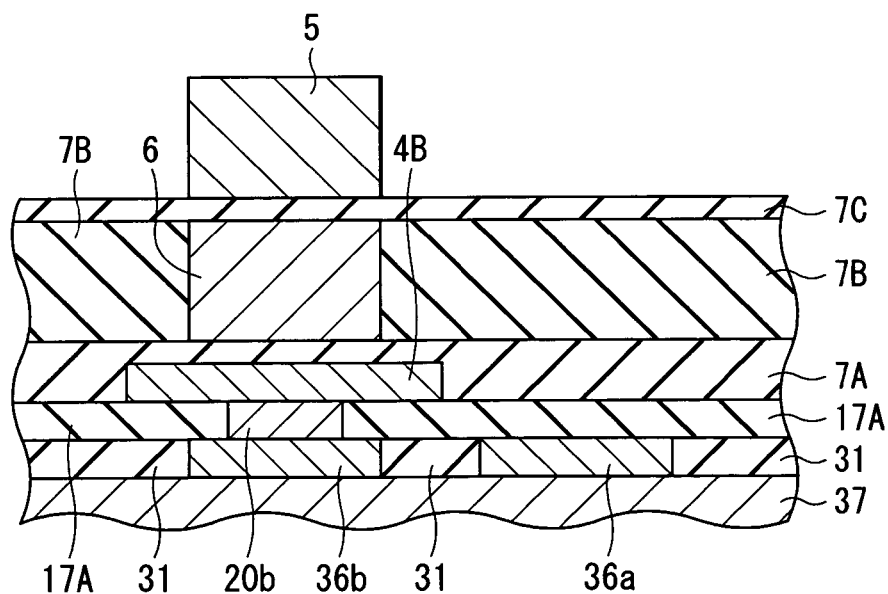
FIG. 15 is an enlarged cross section showing a process subsequent to FIG. 14.

Subsequently, the insulating film 7C made of, for example, $SiO_2$ is formed on the whole. On the insulating film 7C, a metal layer made of, titanium is formed by sputtering or the like. After that, as shown in FIG. 15, the write bit line 5 is selectively formed so as to cover the area corresponding to the write word line 6 of the metal layer. Concretely, a resist pattern (not shown) having a predetermined shape is formed on the insulating film 7C. After that, the resultant is soaked in a plating bath and a plating process using the metal layer as an electrode is performed, thereby forming the write bit line 5 made of, for example, copper. After removing the resist pattern, the unnecessary metal layer is removed by ion milling.

Figure 16:
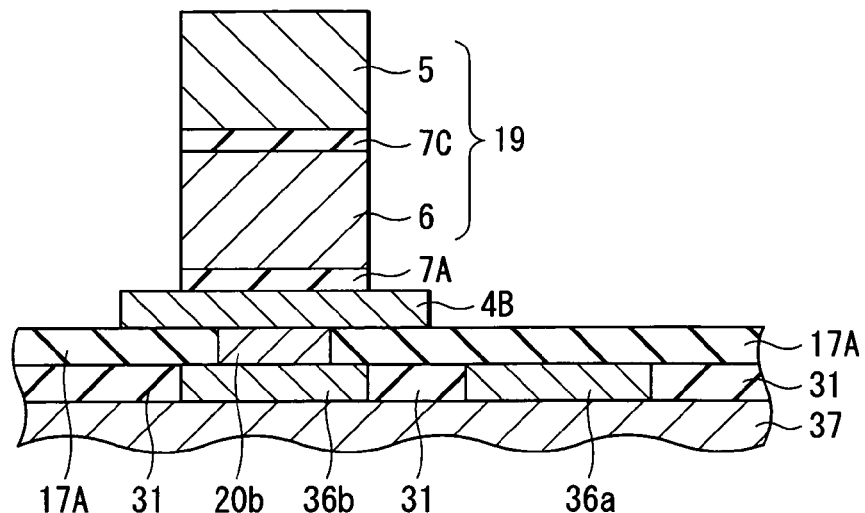
FIG. 16 is an enlarged cross section showing a process subsequent to FIG. 15.

Next, as shown in FIG. 16, by using the write bit line 5 as a mask, the stack layer pattern 19 is formed in a self aligned manner. Concretely, by removing the insulating film 7C, the write word line 6, and the insulating film 7A which are not protected with the write bit line 5 by RIE (Reactive Ion Etching) using $C_4F_8$ as a reactive gas and ion milling, the stack layer pattern 19 is formed. It is important to remove the insulating film 7A until the bottom magnetic layer 4B is exposed.

As described above, by forming the stack layer pattern 19 in a self aligned manner with the write bit line 5 as a mask, the write word line 6 having the same width as that of the write bit line 5 can be formed with high precision. Further, the resist pattern forming process, the process of removing the resist pattern, and the like can be omitted, so that the manufacturing process can be simplified.

Figure 17:
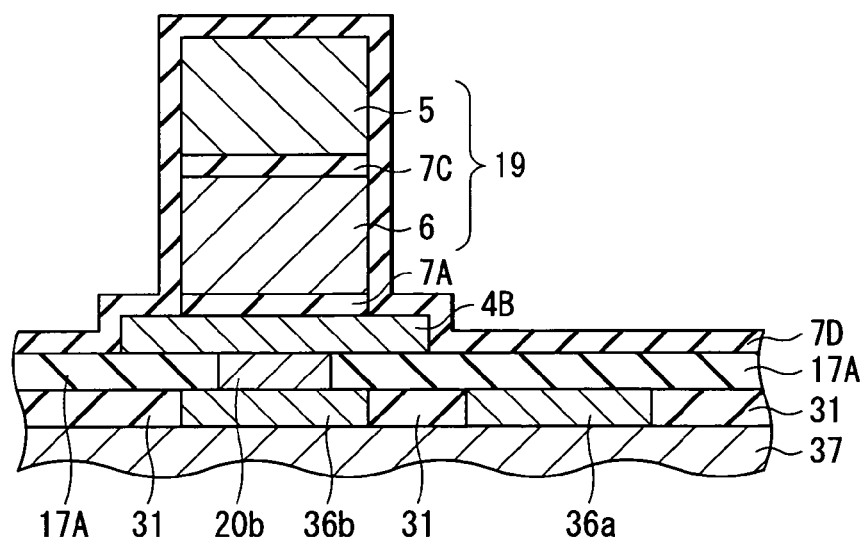
FIG. 17 is an enlarged cross section showing a process subsequent to FIG. 16.

After formation of the stack layer pattern 19 in the parallel part 10 in the write bit line 5 and the write word line 6, as shown in FIG. 17, the insulating film 7D made of $SiO_2$ or the like is formed so as to cover the whole by using the CVD system or the like.

Figure 18:
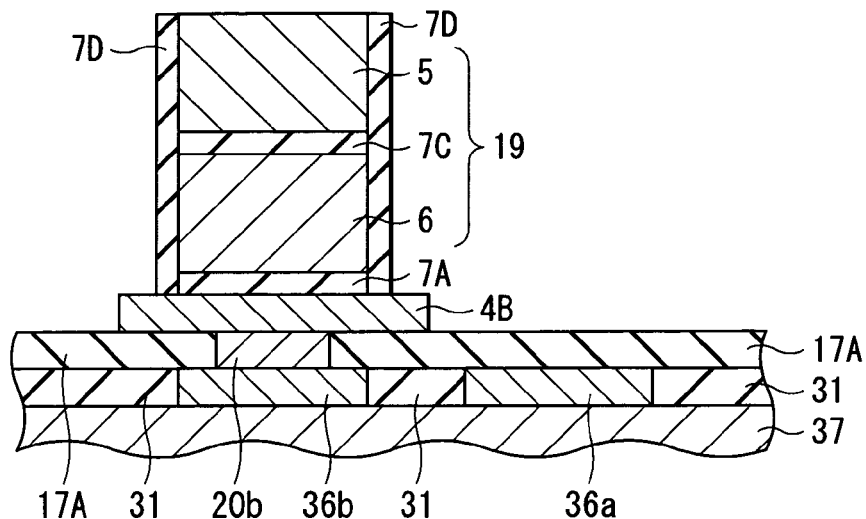
FIG. 18 is an enlarged cross section showing a process subsequent to FIG. 17.
Figure 19:
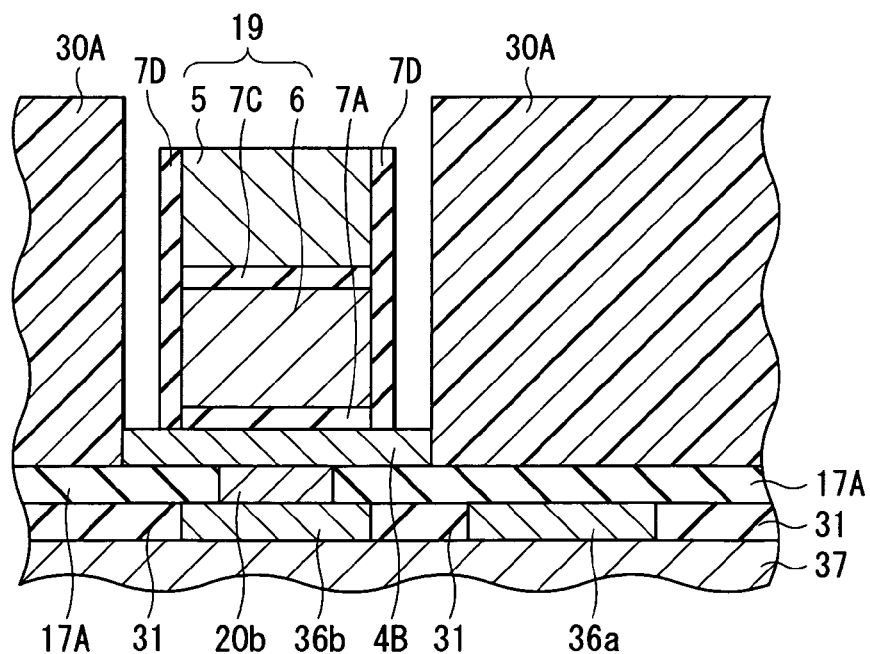
FIG. 19 is an enlarged cross section showing a process subsequent to FIG. 18.
Figure 20:
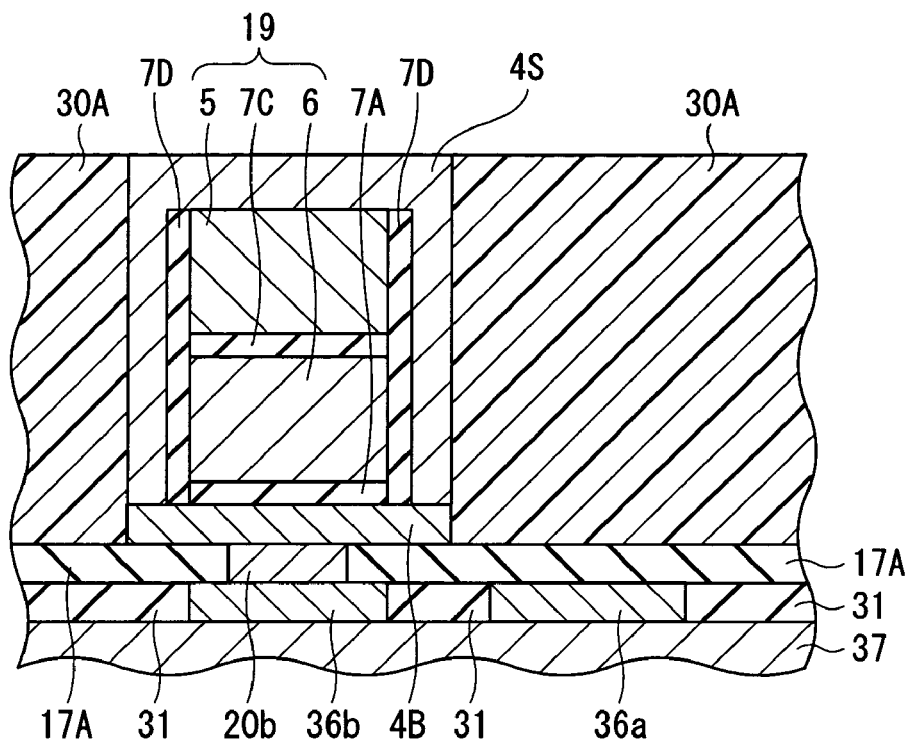
FIG. 20 is an enlarged cross section showing a process subsequent to FIG. 19.

Subsequently, as shown in FIG. 18, the insulating film 7D except for the portion formed so as to be in contact with the side face portion of the stack layer pattern 19 is removed completely by ion milling or the like, and a metal layer made of, for example, NiFe is thinly formed on the entire surface by sputtering or the like. After that, as shown in FIG. 19, a photoresist layer 30A is formed on the metal layer corresponding to the area in which the bottom magnetic layer 4B is not formed by photolithography or the like.

Figure 21:
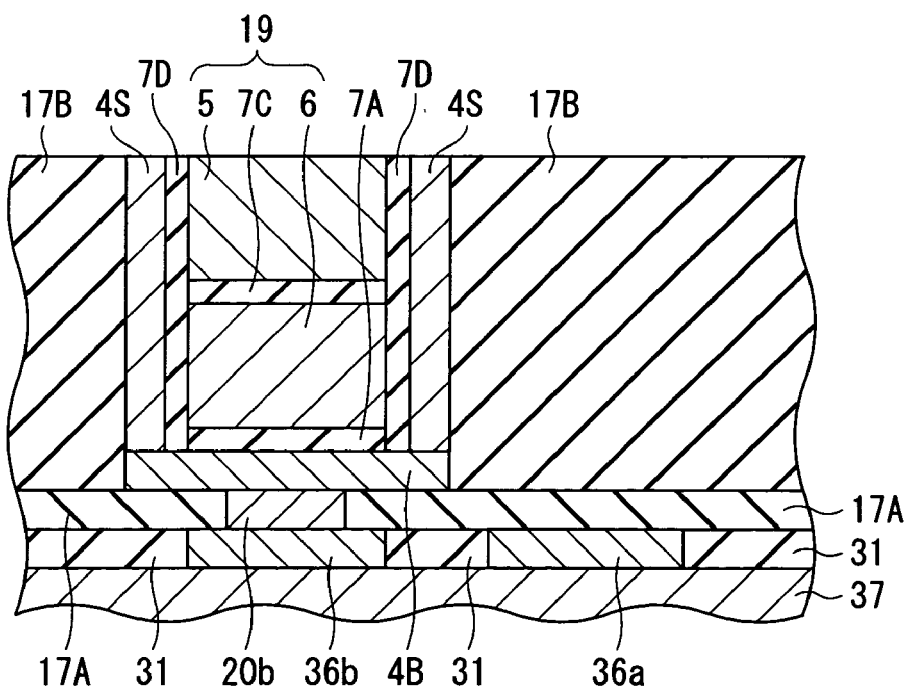
FIG. 21 is an enlarged cross section showing a process subsequent to FIG. 20.

After formation of the photoresist layer 30A, the resultant is soaked in a plating bath and a plating process using the metal layer as an electrode is performed, thereby forming an intermediate magnetic layer 4S made of, for example, NiFe. Subsequently, the photoresist layer 30A is removed, and the unnecessary metal layer is removed by ion milling. Further, as shown in FIG. 21, an insulating film 17B made of, for example, $SiO_2$ is formed so as to cover the whole by the CVD system or the like and is polished until the write bit line 5 is finally exposed by using the CMP system, thereby forming a flat surface including the write bit line 5.

Figure 22:
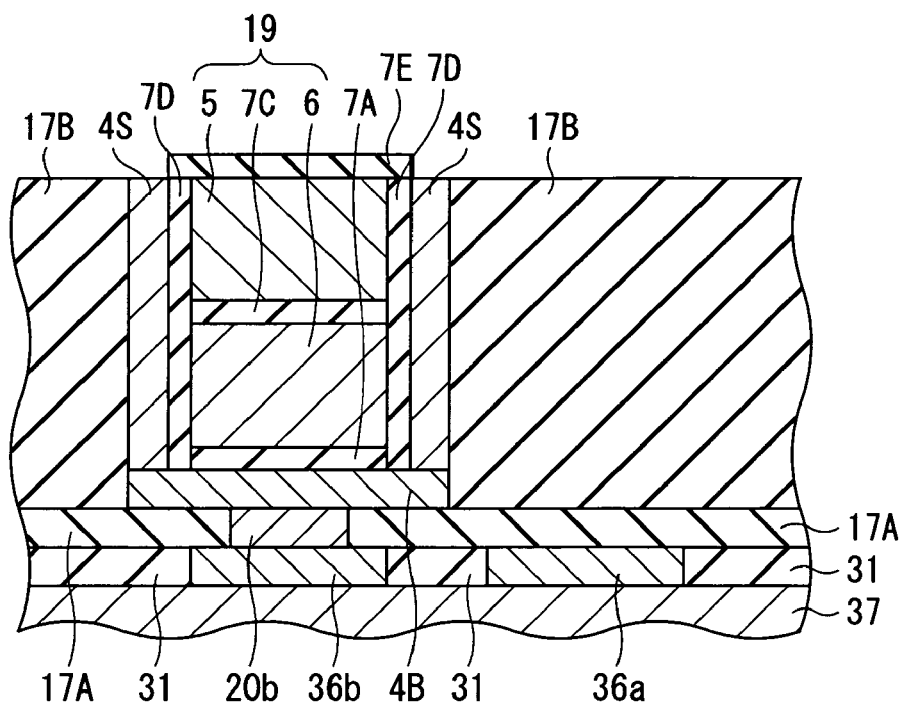
FIG. 22 is an enlarged cross section showing a process subsequent to FIG. 21.
Figure 23:
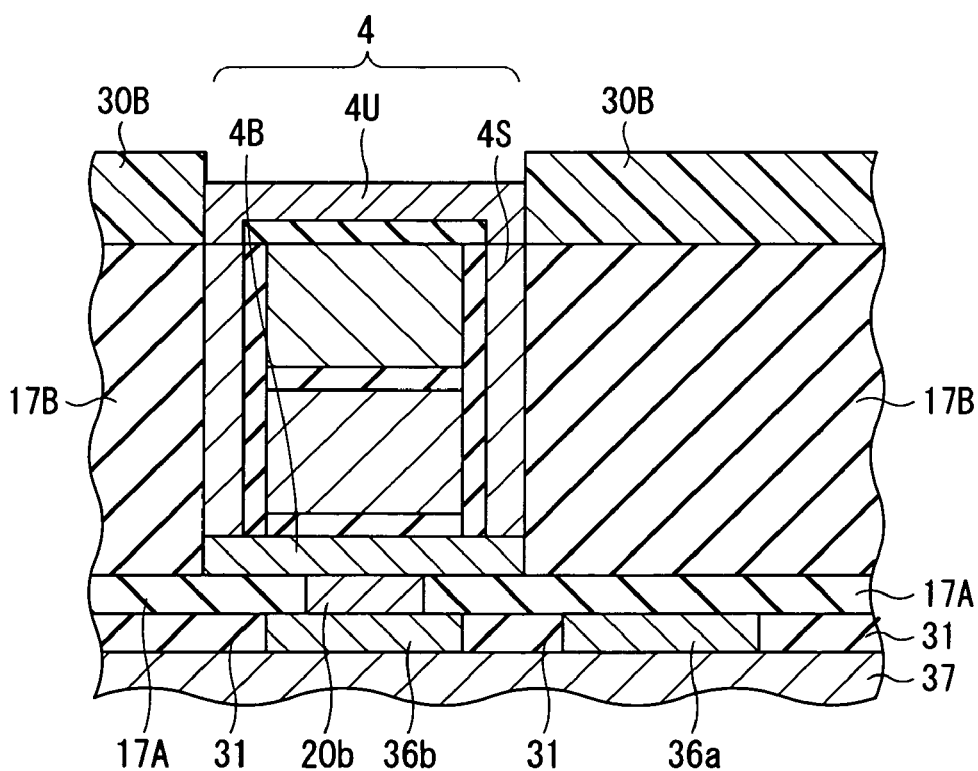
FIG. 23 is an enlarged cross section showing a process subsequent to FIG. 22.

After that, as shown in FIG. 22, the insulating film 7E is selectively formed so as to cover the flat exposed surface of the write bit line 5 by photolithography or the like. Further, a metal layer is thinly formed by, for example, sputtering. After that, as shown in FIG. 23, a photoresist layer 30B is formed on the metal layer in the area corresponding to the insulating film 17B by photolithography or the like. Further, the resultant is soaked in a plating bath and a plating process using the metal layer as an electrode is performed, thereby forming a top magnetic layer 4U made of, for example, NiFe. By the operation, formation of the toroidal magnetic layer 4 made by the bottom magnetic layer 4B, the intermediate magnetic layer 4S, and the top magnetic layer 4U completes. The intermediate magnetic layer 4S and the top magnetic layer 4U are concrete examples corresponding to a "top magnetic layer" of the invention.

Figure 24:
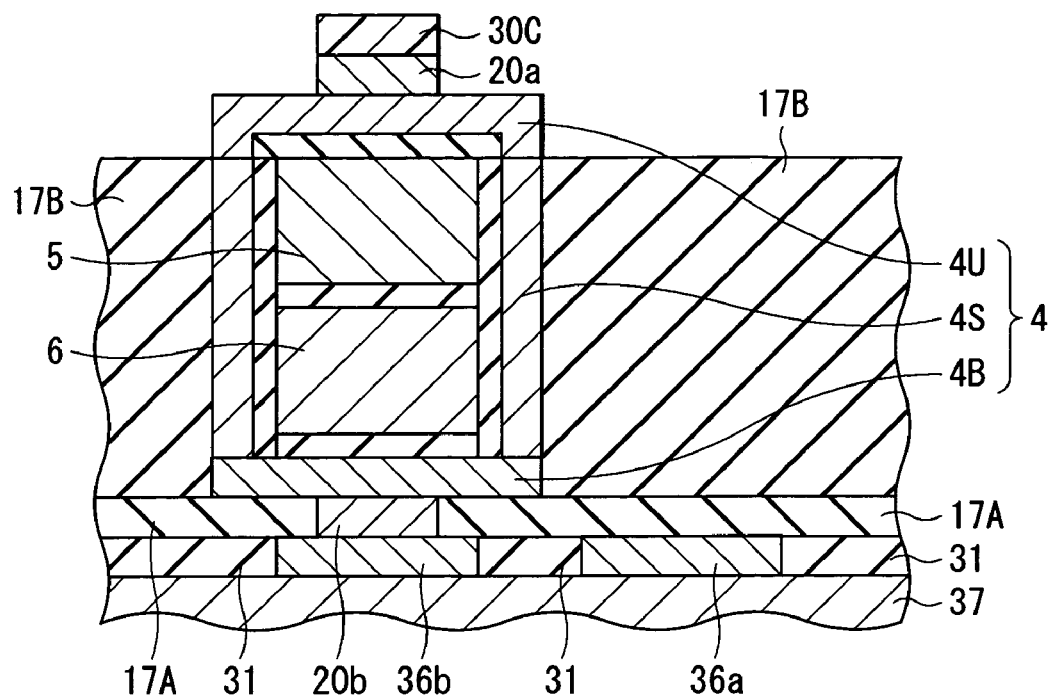
FIG. 24 is an enlarged cross section showing a process subsequent to FIG. 23.

Subsequently, as shown in FIG. 24, by removing the photoresist layer 30B, the top magnetic layer 4U as part of the toroidal magnetic layer 4 is exposed. The stack layer part 20a is provided in a position corresponding to the stacked body S20b on the top magnetic layer 4U, thereby forming the stacked body S20a. Concretely, first, a resist pattern is selectively formed so as to cover the area other than the area for forming the stack layer part 20b by an i-line stepper or the like. Next, the second magnetic layer 8a taking the form of, for example, a CoFe layer, and an aluminum (Al) layer are sequentially formed on the whole surface by sputtering or the like. By performing an oxidizing process on the aluminum layer, the tunnel barrier layer 3a is obtained. Further, on the tunnel barrier layer 3a, the first magnetic layer 2a taking the form of, for example, a CoFe layer is formed by sputtering or the like. Subsequently, by lifting off the resist pattern, the stack layer part 20a having a predetermined pattern shape and constructed by the first magnetic layer 2a, the tunnel barrier layer 3a, and the second magnetic layer 8a is exposed. By the operation, formation of the stacked body S20a constructed by part of the top magnetic layer 4U and the stack layer part 20a completes.

Figure 25:
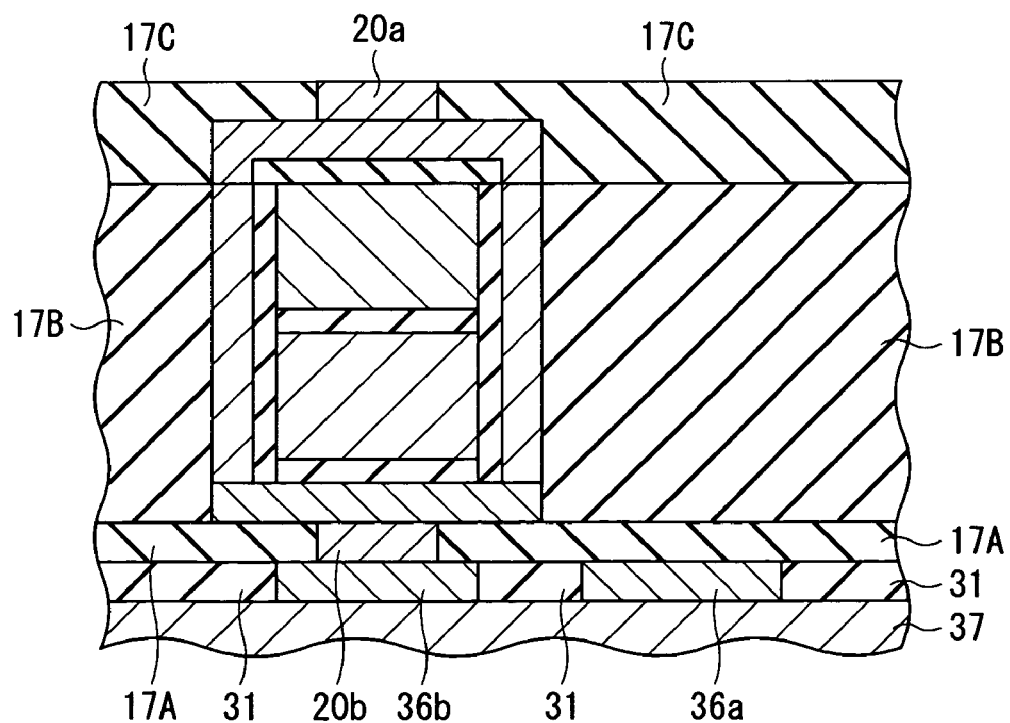
FIG. 25 is an enlarged cross section showing a process subsequent to FIG. 24.

Subsequently, after the photoresist layer 30C is selectively formed on the stack layer part 20a, as shown in FIG. 25, for example, by using TEOS, an insulating film 17C made of silicon oxide ($SiO_2$) is formed so as to cover the whole by a CVD (Chemical Vapor Deposition) system. Further, the photoresist layer 30C is lifted off.

Figure 26:
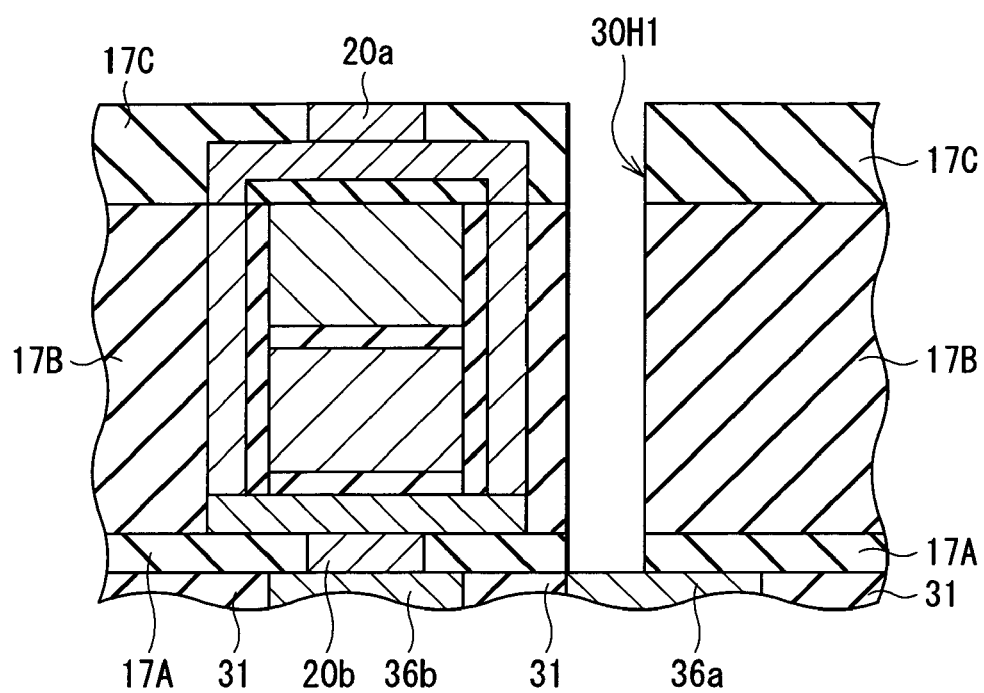
FIG. 26 is an enlarged cross section showing a process subsequent to FIG. 25.

After that, to form a connection layer 36T for electrically connecting the conductive layer 36a and the stacked body S20a, as shown in FIG. 26, a via hole 30H1 is formed in part of the area corresponding to the conductive layer 36a. Concretely, a resist pattern is selectively formed so as to cover the area other than the area for forming the via hole 30H1 by an i-line stepper or the like. By RIE using a reactive gas such as $C_4F_8$, etching is performed in the layer stack direction to the conductive layer 36a.

Figure 27:
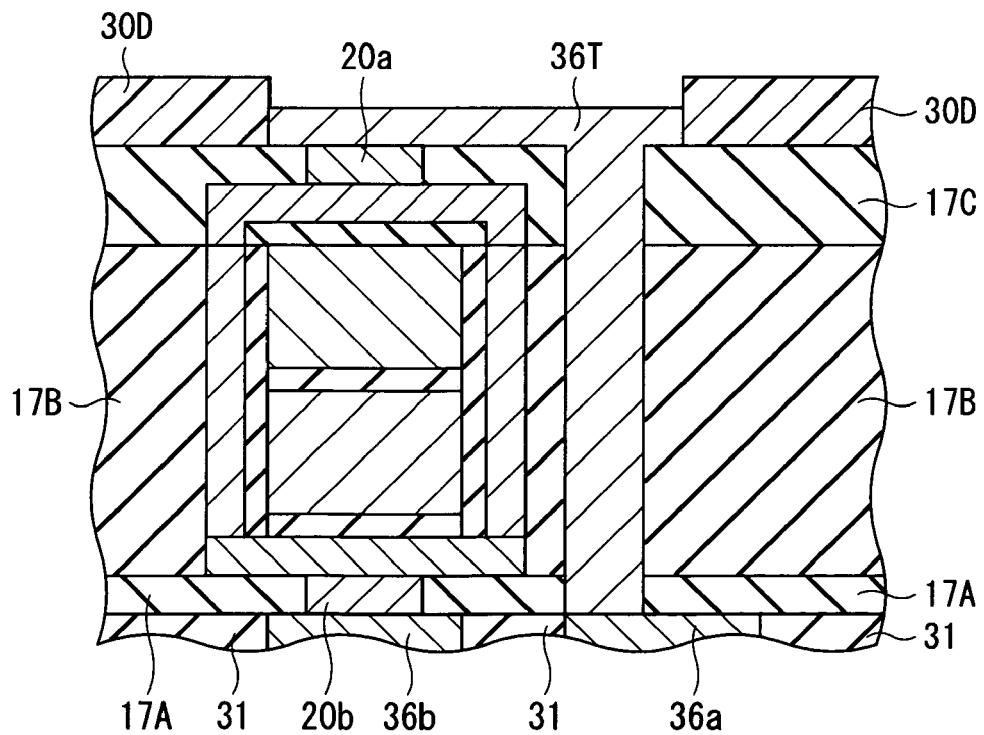
FIG. 27 is an enlarged cross section showing a process subsequent to FIG. 26.

The resist pattern used at the time of forming the via hole 30H1 is removed and, after that, as shown in FIG. 27, the connection layer 36T made of copper (Cu) is formed so as to connect the conductive layer 36a and the stacked body S20a. For example, a photoresist layer 30D having a predetermined shape is selectively formed on the insulating film 17C and, after that, the connection layer 36T is formed by the CVD system by using Cu(1) hexafluoroacetylacetonato trimethylvinylsilane.

Figure 28:
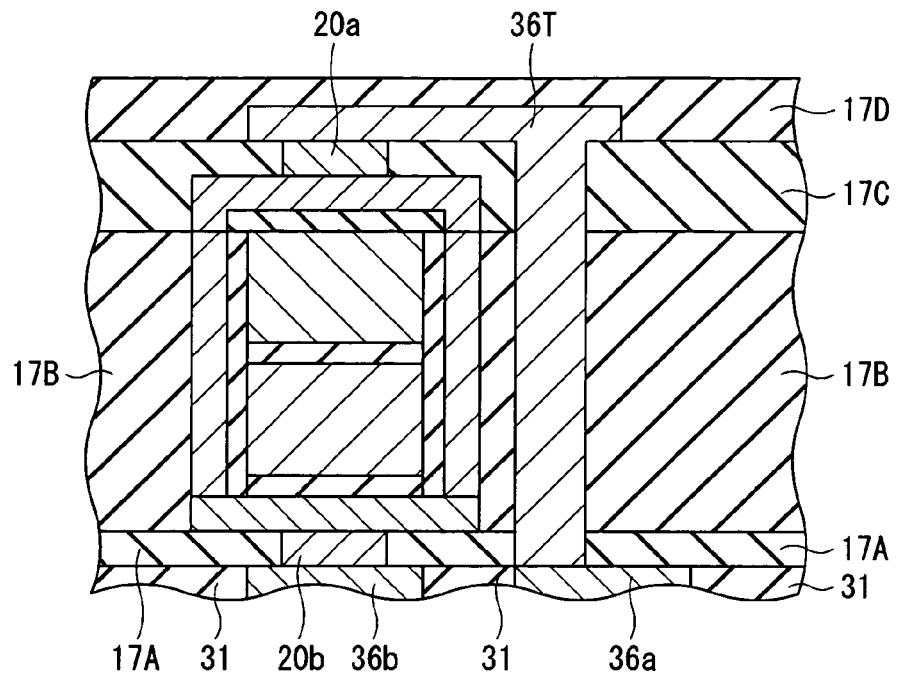
FIG. 28 is an enlarged cross section showing a process subsequent to FIG. 27.
Figure 29:
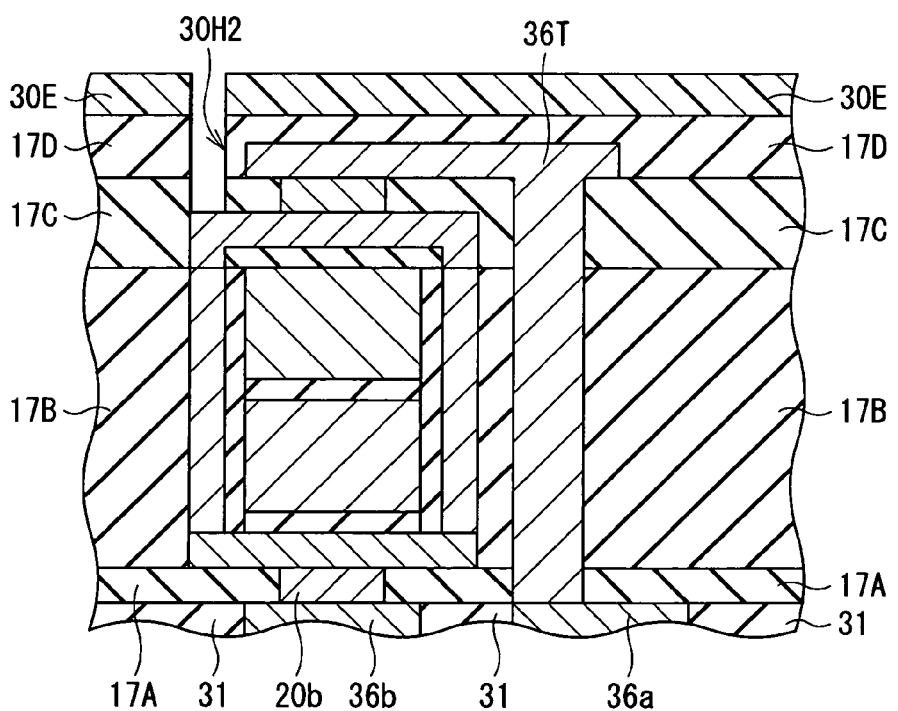
FIG. 29 is an enlarged cross section showing a process subsequent to FIG. 28.

After formation of the connection layer 36T, as shown in FIG. 28, an insulating film 17D made of, for example, $SiO_2$ is formed on the whole surface by the CVD system by using, for example, TEOS. After that, as shown in FIG. 29, to form a connection layer 32T electrically connecting the top magnetic layer 4U (toroidal magnetic layer 4) and the read word line 32, a via hole 30H2 is formed in part of the area corresponding to the top magnetic layer 4U. Concretely, a photoresist layer 30E is selectively formed so as to cover the area other than the area for forming the via hole 30H2 by an i-line stepper or the like. By RIE using a reactive gas such as $C_4F_8$, etching is performed in the layer stack direction to the top magnetic layer 4U.

Figure 30:
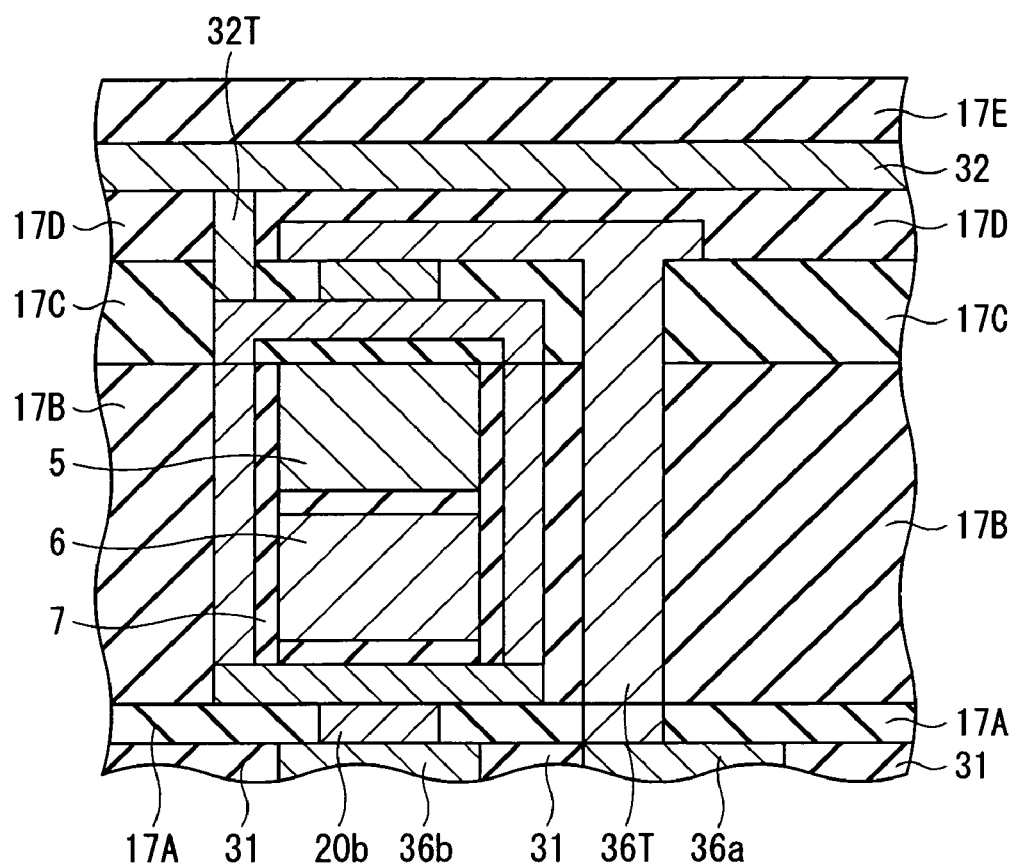
FIG. 30 is an enlarged cross section showing a process subsequent to FIG. 29.

The resist pattern used at the time of forming the via hole 30H2 is removed and, after that, as shown in FIG. 30, the connection layer 32T made of copper for connecting the top conductive layer 4U and the read word line 32, and the read word line 32 are formed. For example, the connection layer 32T and the read word line 32 are formed by the CVD system by using Cu(1) hexafluoroacetylacetonato trimethylvinylsilane. Further, an insulating film 17E made of, for example, $SiO_2$ is formed on the whole surface so as to cover the read word line 32.

After that, the write word line lead electrodes 41 are formed at both ends of the write word line 6, the write bit line lead electrodes 42 are formed at both ends of the write bit line 5, the read word line lead electrodes 43 are formed at both ends of the read word line 32, and the read bit line lead electrodes 44a and 44b are formed at both ends of the read bit lines 33a and 33b.

By the above, formation of the memory cell group 54 including the memory cells 1 completes.

After that, by further performing a step of forming a protective layer made of $SiO_2$, aluminum oxide ($Al_2O_3$), or the like by a sputter system, a CVD system, or the like and a step of polishing the protective layer to expose the lead electrodes 41 to 44, manufacture of the magnetic memory device completes.

According to the manufacturing method of the embodiment, the stack layer part 20b as part of the stacked body S20b is formed on the diode 75b buried in the substrate 31, and the toroidal magnetic layer 4 is formed so as to cover the stack layer part 20b. After that, the stacked body S20a is formed by providing the stack layer part 20a in the position corresponding to the stacked body S20b on the toroidal magnetic layer 4 and, further, the stacked body S20a and the diode 75a are electrically connected to each other. As a result, the magnetic memory device corresponding to the circuit configuration shown in FIG. 8 can be obtained. That is, the diodes 75a and 75b can be formed between the pair of read bit lines 33a and 33b and the pair of stack layer parts S20a and S20b. Consequently, read currents from the sense amplifier circuit 56B pass through the stacked bodies S20a and S20b via the diodes 75a and 75b, are combined in the integrated toroidal magnetic layer 4, and can be passed to the read word line 32. A magnetic memory device in which an unnecessary round other than a normal current path can be avoided is obtained.

As a method for obtaining correspondence to the circuit configuration shown in FIG. 8, a method of forming a magnetic memory device by forming a diode (rectifying device) on the memory cell 1 can be considered. In this case, however, the stacked body of the TMR device is destroyed by heat generated at the time of forming a diode (rectifying device), and its function is lost. It is therefore difficult to actually form the magnetic memory device.

In addition, according to the manufacturing method of the embodiment, the stack layer pattern 19 is formed in a self aligned manner by using the write bit line 5 as a mask. Consequently, high-precision processing can be performed, the process of forming the resist pattern, the process of removing the resist pattern, and the like can be omitted, and the manufacturing process can be simplified as a whole.

Second Embodiment

Referring to FIGS. 31 to 35A and 35B, a magnetic memory device of a second embodiment of the invention will now be described.

Figure 31:
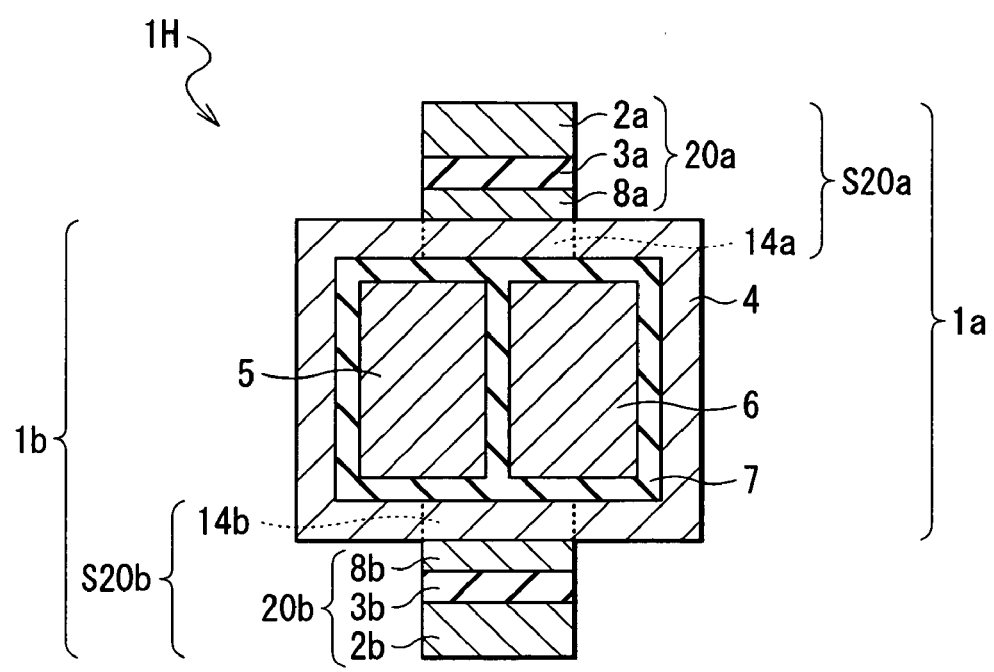
FIG. 31 is a cross section of a magnetic memory cell in a magnetic memory device according to a second embodiment of the invention.
Figure 32:
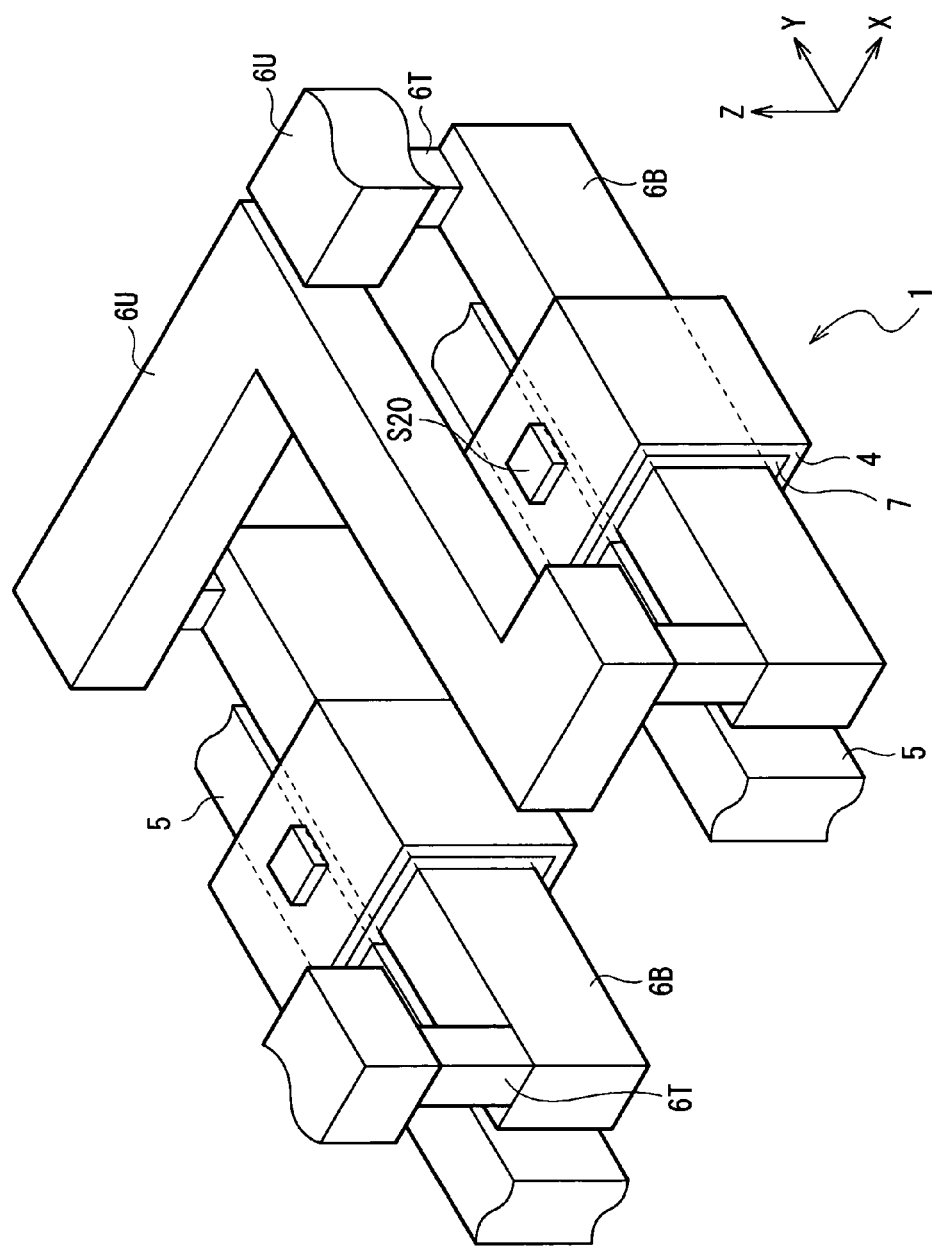
FIG. 32 is a perspective view showing the configuration of a main part of a memory cell group in the magnetic memory device illustrated in FIG. 31.
Figure 33:
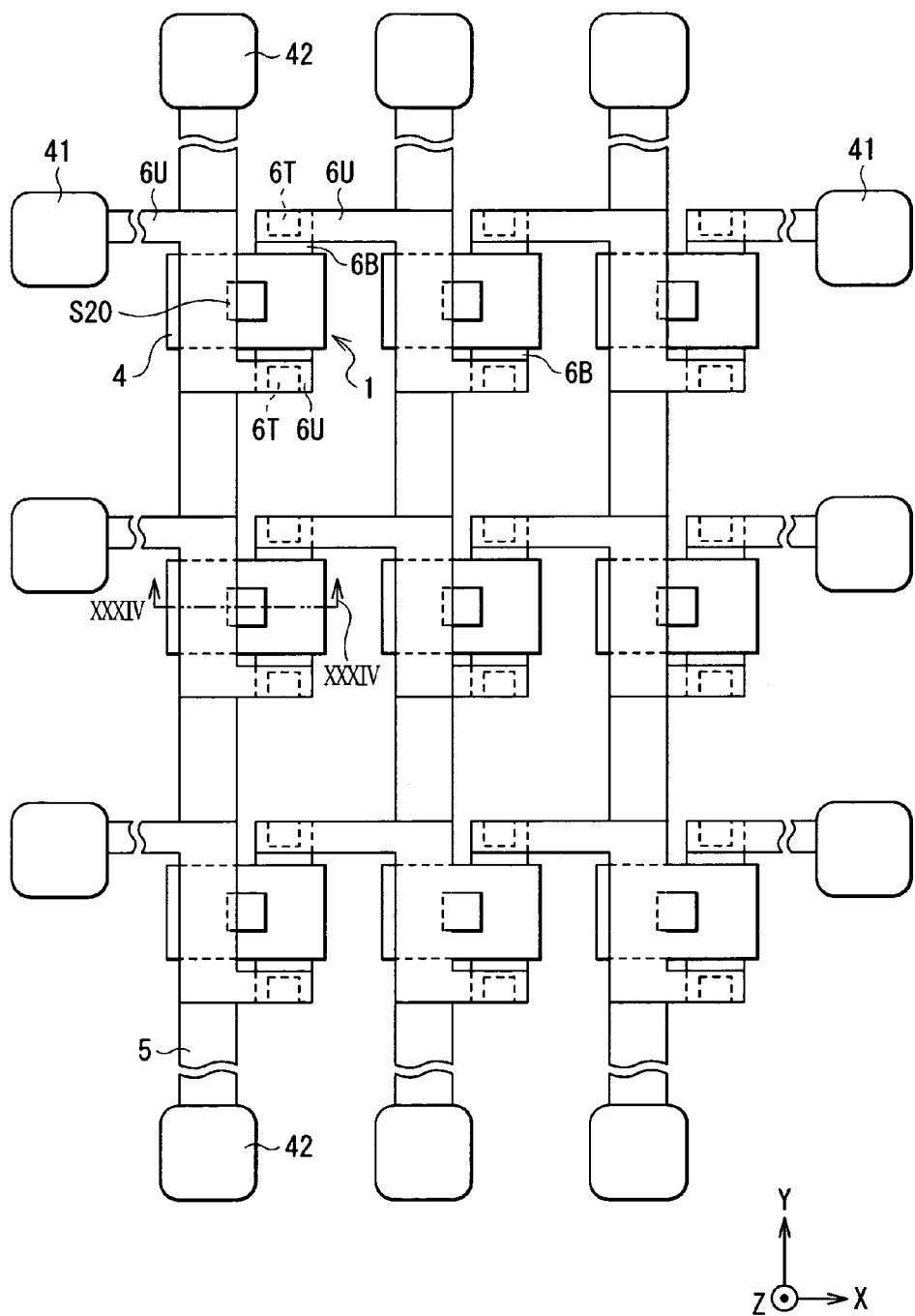
FIG. 33 is a partial plan view showing the configuration of a main part of the memory cell group in the magnetic memory device illustrated in FIG. 31.

FIG. 31 shows a sectional configuration of the memory cell 1H in the magnetic memory device of the embodiment and corresponds to FIG. 5 of the first embodiment. FIG. 32 is an enlarged perspective view of the memory cell 1H and corresponds to FIG. 4. FIG. 33 shows a planar configuration of a magnetic memory device of the modification and corresponds to FIG. 3. In FIGS. 31 to 33, the same reference numerals are designated to the same parts substantially the same as components shown in FIGS. 3 to 5.

In the following description, the configuration of the magnetic memory device of the second embodiment will be described mainly with respect to the points different from those of the first embodiment, and the other description will be properly omitted.

Figure 34:
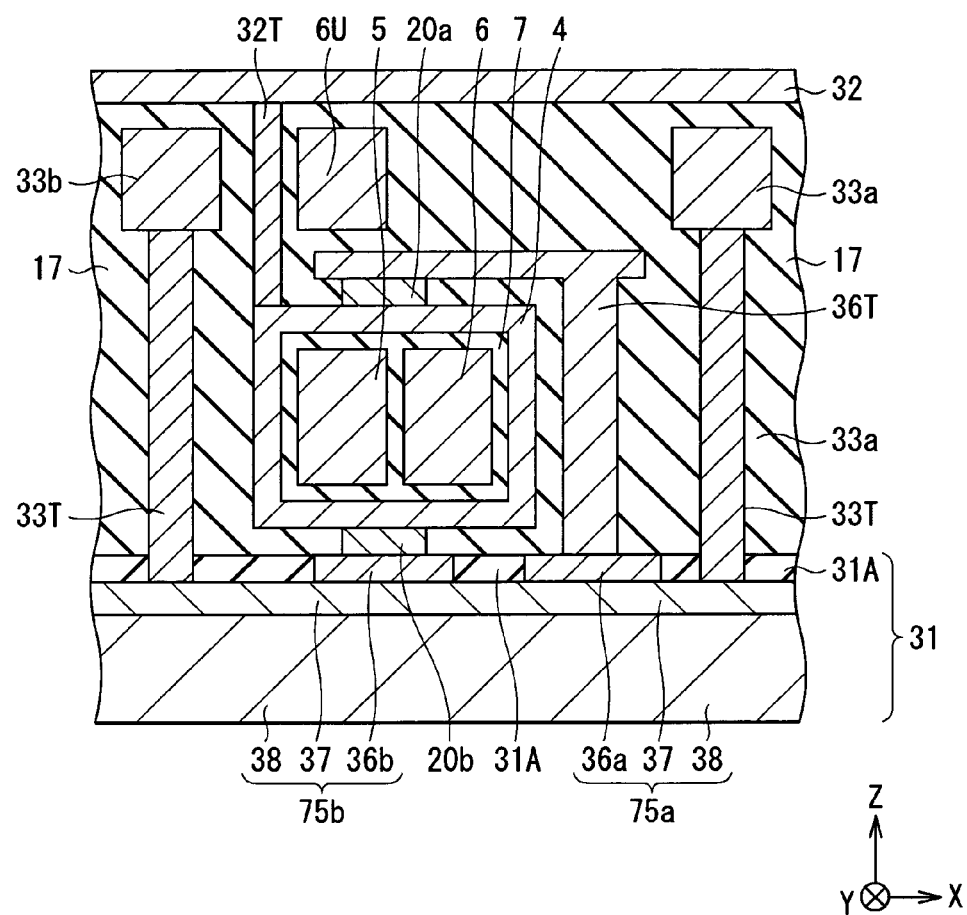
FIG. 34 is a cross section showing the configuration in a section taken along line XXXIV-XXXIV of the memory cell illustrated in FIG. 33.

In the memory cell 1P of the first embodiment, the write word line 6 and the write bit line 5 are arranged so as to be adjacent to each other in a straight line passing through the stacked bodies S20a and S20b in the area penetrating the toroidal magnetic layer 4. In contrast, in the memory cell 1H of the modification, as shown in FIGS. 31, 32, and 34, the write word line 6 and the write bit line 5 are arranged so as to be adjacent to each other in a direction orthogonal to the straight line passing through the stacked bodies S20a and S20b in the area penetrating the toroidal magnetic layer 4. The write bit line 5 and the write word line 6 have to be electrically insulated from each other. Therefore, as shown in FIG. 32, the write word line 6 is bent not only in the XY plane but also in the Z direction. Concretely, the write word line 6 is constructed by a bottom write word line 6B penetrating the toroidal magnetic layer 4 in the Y direction together with the write bit line 5, a top write word line 6U extending in the X direction in an XY plane different from the XY plane including the write bit line 5 and the bottom write word line 6B, and a connection part 6T connecting the top and bottom write word lines 6U and 6B. In this case, not only the write word line 6 which is bent as described above but also the write bit line 5 may be bent.

The memory cell 1H has a compact configuration similar to the memory cell 1P except for the point that the positions of disposing the stacked bodies S20a and S20b with respect to the direction of arranging the write word line 6 and the write bit line 5 penetrating the toroidal magnetic layer 4 are different from each other. Therefore, in the memory cell 1H, writing and reading operations similar to those in the memory cell 1P can be performed.

Figure 35A:
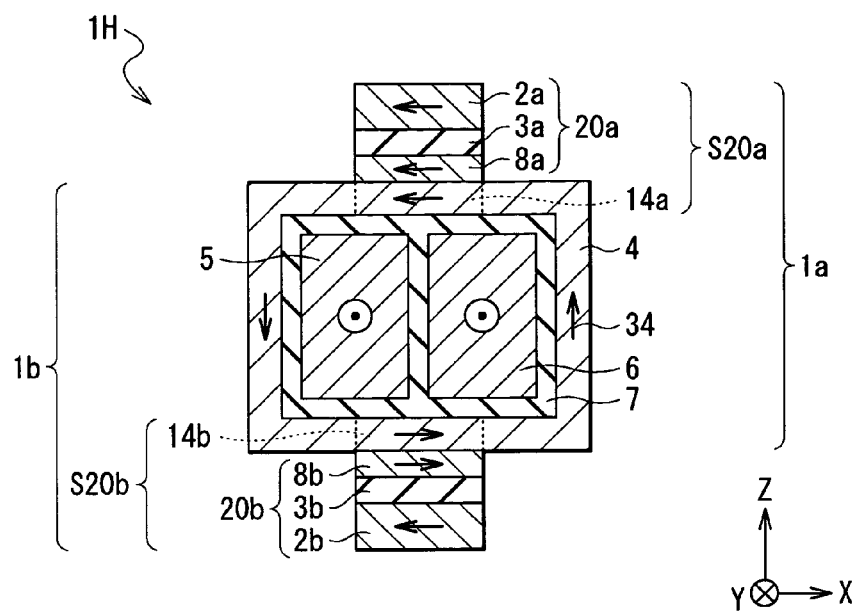
FIGS. 35A and 35B are explanatory diagrams showing the relation between a write current direction and a circulating magnetic field direction (magnetization direction) in the sectional configuration of the memory cell illustrated in FIG. 31.
Figure 35B:
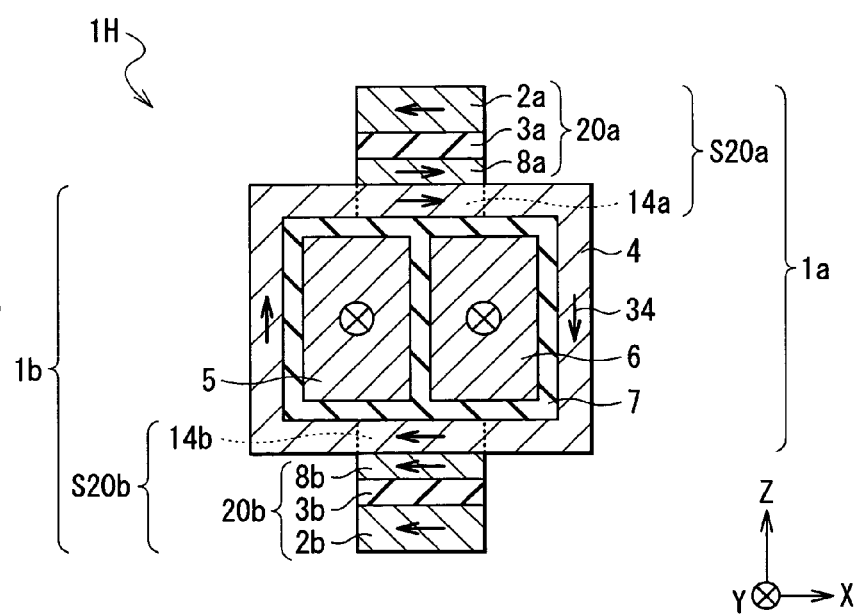

Referring now to FIG. 2 and FIGS. 35A and 35B, the writing operation in the memory cell 1H in the second embodiment will be described. FIGS. 35A and 35B show the relation between the write current direction and the circulating magnetic field direction (magnetization direction) in the sectional configuration of the memory cell 1H illustrated in FIG. 31, and correspond to FIGS. 9A and 9B in the first embodiment, respectively.

FIG. 35A shows a case where write currents flow in the same direction to the write bit line 5 and the write word line 6 which pass through the memory cell 1H and are parallel with each other, corresponding to the write current direction illustrated in FIG. 2. FIG. 35A shows a case where the write current flows from the back to this side in the direction perpendicular to the drawing sheet in the memory cell 1H (in the −Y direction), and the circulating magnetic field 34 is generated in the counterclockwise direction in the toroidal magnetic layer 4 of the portion surrounding the write bit line 5. In this case, the magnetization direction of the connection part 14a and the second magnetic layer 8a becomes the −X direction, and the magnetization direction of the connection part 14b and the second magnetic layer 8b becomes the +X direction. On the other hand, FIG. 35B shows a case where the write current flows from this side to the back in the direction perpendicular to the drawing sheet in the memory cell 1H (in the +Y direction), and the circulating magnetic field 34 is generated in the clockwise direction in the toroidal magnetic layer 4. In this case, the magnetization direction of the connection part 14a and the second magnetic layer 8a becomes the +X direction, and the magnetization direction of the connection part 14b and the second magnetic layer 8b becomes the −X direction.

As obvious from FIGS. 35A and 35B, the magnetization directions of the second magnetic layers 8a and 8b in the pair of TMR devices 1a and 1b change so as to be opposite to each other in accordance with the direction of the circulating magnetic field 34 generated by currents flowing in both of the write bit line 5 and the write word line 6 penetrating toroidal magnetic layer 4. By using the changes, binary information of "0" or "1" can be stored in the memory cell 1H.

As described above, also in the second embodiment, effects similar to those of the foregoing first embodiment can be obtained.

Third Embodiment

Figure 36A:
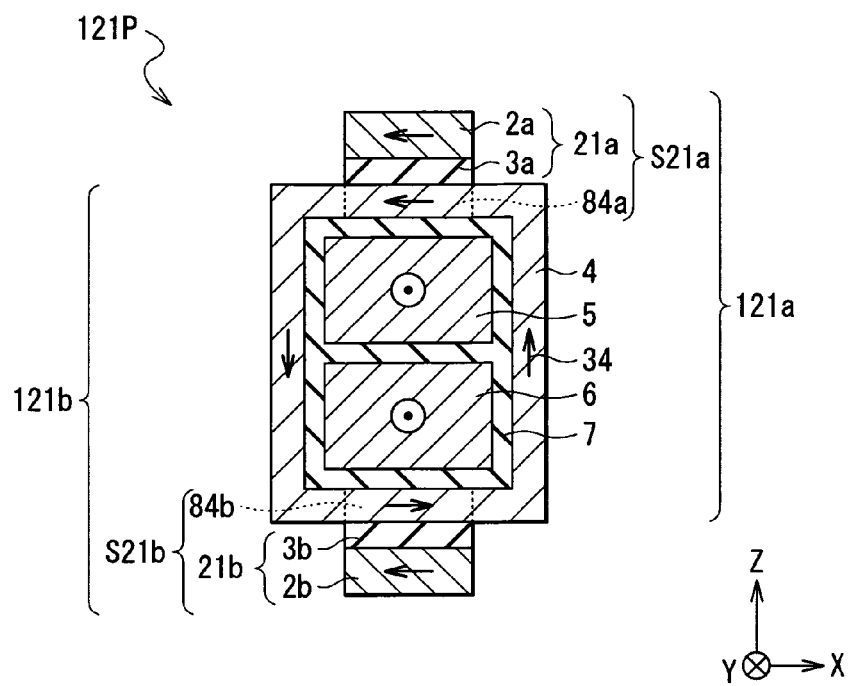
FIGS. 36A and 36B are cross sections showing the configuration of a main part in a magnetic memory device according to third and fourth embodiments of the invention.

Referring to FIG. 36A, a magnetic memory device of a third embodiment of the invention will now be described.

FIG. 36A shows a sectional configuration of a memory cell 121P in the magnetic memory device of the embodiment and corresponds to FIG. 5 of the first embodiment. In FIG. 36A, the same reference numerals are designated to the same parts substantially the same as components shown in FIG. 5.

In the following description, the configuration of the magnetic memory device of the third embodiment and a method of manufacturing the magnetic memory device will be described mainly with respect to the points different from the first embodiment, and the other description will be properly omitted.

In the memory cell 1 in the magnetic memory device of the first embodiment, the magneto-sensitive layer is constructed by the connection parts 14a and 14b and the second magnetic layers 8a and 8b which are magnetically exchange-coupled to each other. The connection parts 14a and 14b construct a part of the toroidal magnetic layer 4. In contrast, in the memory cell 121P in the magnetic memory device of the third embodiment, as shown in FIG. 36A, the magneto-sensitive layer constructs a part of the toroidal magnetic layer 4.

Concretely, connection parts 84a and 84b are magneto-sensitive parts in the toroidal magnetic layer 4 and function also as magneto-sensitive parts in the stacked bodies S21a and S21b, so that the second magnetic layers 8a and 8b can be omitted, and the memory cell 121P having a configuration simpler than that of the memory cell 1 can be obtained. The connection parts 84a and 84b are a concrete example of a "magneto-sensitive layer" in the invention.

In this case, it is desirable that the axis of easy magnetizations of the first magnetic layers 2a and 2b and the connection parts 84a and 84b be parallel to each other so that the magnetization directions of the first magnetic layers 2a and 2b and the connection parts 84a and 84b are stabilized in a state where they are parallel or antiparallel to each other. The toroidal magnetic layer 4 is made of, for example, nickel iron alloy (NiFe), and the thickness in the section direction in the connection parts 84a and 84b is, for example, 20 nm. Desirably, the coercive force of the connection parts 84a and 84b lies in the range from $(50/4\pi) \times 10^3$ A/m to $(100/4\pi) \times 10^3$ A/m, and is lower than that of the first magnetic layer 2. With the coercive force of less than $(50/4\pi) \times 10^3$ A/m, the magnetization direction in the connection parts 84a and 84b may be disturbed by an unnecessary magnetic field such as an external disturbance magnetic field. On the other hand, with a coercive force exceeding $(100/4\pi) \times 10^3$ A/m, there is the possibility that the TMR devices 121a and 121b itself deteriorates due to heat generation caused by increase in write current. Further, when the coercive force of the connection parts 84a and 84b becomes equal to or higher than that of the first magnetic layers 2a and 2b, write current increases, the magnetization direction of the first magnetic layers 2a and 2b as magnetization pinned layers is changed, and it causes deterioration in the function of the TMR devices 121a and 121b as memory elements.

In the memory cell 121P, the connection parts 84a and 84b function as storage layers for storing information. That is, the magnetization direction of the connection parts 84a and 84b is inverted by the circulating magnetic field which is generated by write currents flowing in the write bit line 5 and the write word line 6, and information is stored. In the following, the writing operation in the memory cell 121 will be described concretely.

FIG. 36A shows a case where write currents flow in the same direction in the write bit line 5 and the write word line 6 passing through the TMR devices 121a and 121b and parallel to each other. FIG. 36A shows a case where write current flows from this side to the depth in the direction perpendicular to the drawing sheet (to the +Y direction) in the TMR devices 121a and 121b, and the circulating magnetic field 34 is generated in the counterclockwise direction in the toroidal magnetic layer 4. In this case, the magnetization direction of the connection part 84a is the −X direction, and the magnetization direction of the connection part 84b is the +X direction. Although not shown, in contrast, in the case where write current flows from the depth to this side in the direction perpendicular to the drawing sheet (to the −Y direction) and the circulating magnetic field 34 is generated in the clockwise direction in the toroidal magnetic layer 4, the magnetization direction of the connection part 84a becomes the +X direction, and the magnetization direction of the connection part 84b becomes the −X direction.

When currents flow in the same direction in the write bit line 5 and the write word-line 6, the magnetization directions of the connection parts 84a and 84b become antiparallel to each other and 0 or 1 can be recorded.

As described above, in the magnetic memory device of the third embodiment, the connection parts 84a and 84b function as the magneto-sensitive parts in the toroidal magnetic layer 4 and also the magneto-sensitive parts in the stacked bodies S21a and S21b. Therefore, the second magnetic layer 8 can be omitted, and the memory cell 121 having a simpler configuration can be constructed.

Fourth Embodiment

Figure 36B:
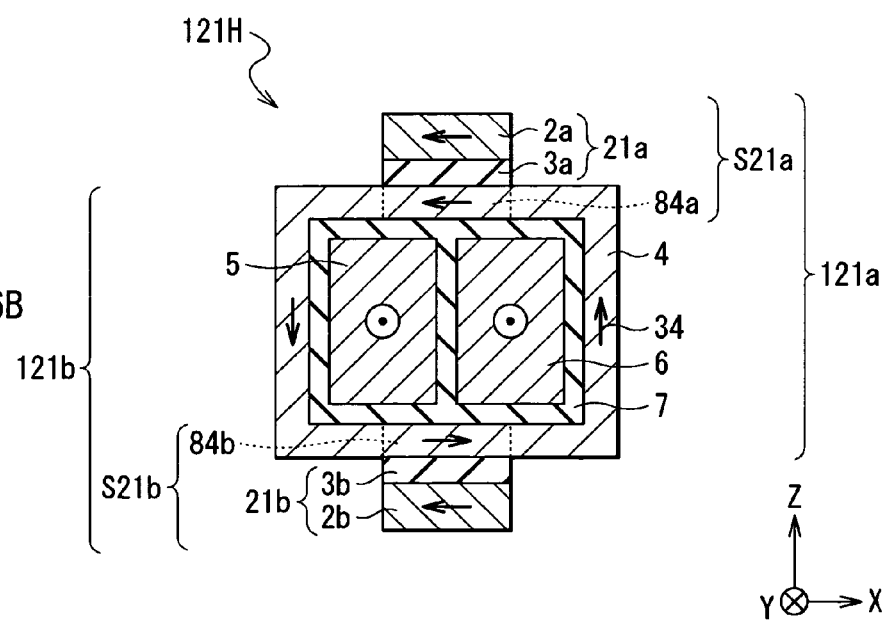

Referring to FIG. 36B, a magnetic memory device of a fourth embodiment of the invention will now be described. FIG. 36B shows a sectional configuration of the memory cell 121H in the magnetic memory device of the embodiment. In FIG. 36B, the same reference numerals are designated to the same parts substantially the same as components shown in FIG. 36A described as the third embodiment.

In the following description, the configuration of the magnetic memory device of the fourth embodiment will be described with respect to the points different from the third embodiment, and the other description will be properly omitted.

In the memory cell 121P of the third embodiment, the write word line 6 and the write bit line 5 are arranged so as to be adjacent to each other in a straight light passing through the stacked bodies S21a and S21b in the area penetrating the toroidal magnetic layer 4. In contrast, in the memory cell 121H of the fourth embodiment, as shown in FIG. 36B, the write word line 6 and the write bit line 5 are arranged so as to be adjacent to each other in a direction orthogonal to the straight line passing through the stacked bodies S21a and S20b in the area penetrating the toroidal magnetic layer 4.

As obvious from FIG. 36B, the magnetization directions of the second magnetic layers 8a and 8b in the pair of TMR devices 121a and 121b change so as to be opposite to each other in accordance with the direction of the circulating magnetic field 34 generated by currents flowing in both of the write bit line 5 and the write word line 6 penetrating toroidal magnetic layer 4. By using the changes, binary information of "0" or "1" can be stored in the memory cell 121H.

As described above, also in the fourth embodiment, effects similar to those of the third embodiment can be obtained.

MODIFICATIONS OF FIRST TO FOURTH EMBODIMENTS

Referring to FIGS. 37A to 40, magnetic memory cells in magnetic memory devices of modifications of the first to fourth embodiments will now be described.

Modification 1

Figure 37A:
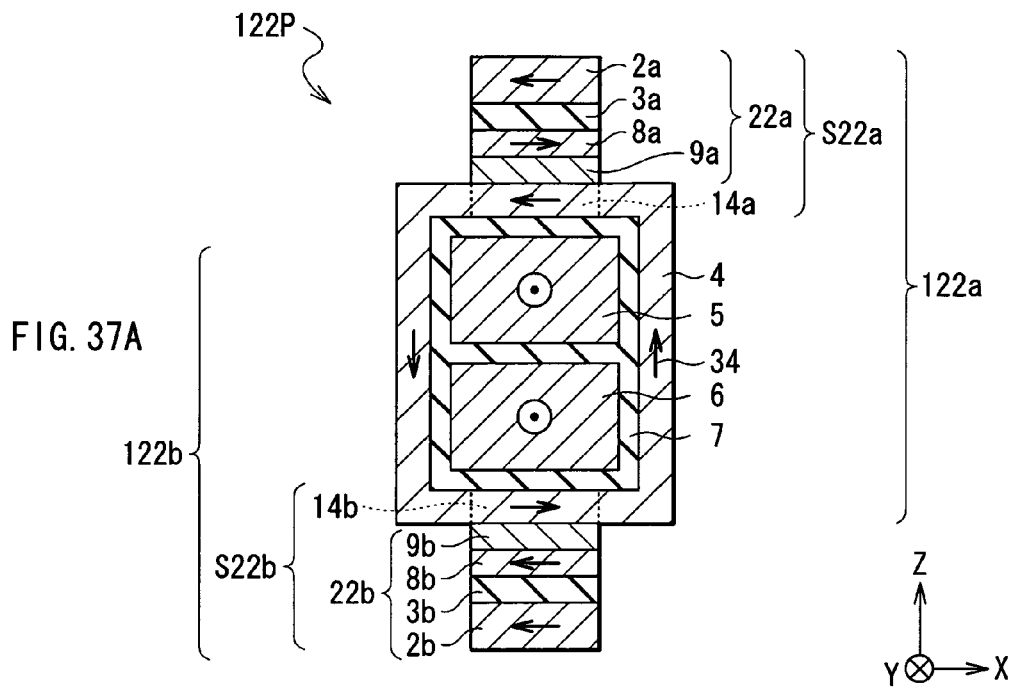
FIGS. 37A and 37B are cross sections showing the configuration of a main part in modifications (first and second modifications) of the magnetic memory devices according to the first and second embodiments of the invention.

FIG. 37A shows a sectional configuration of a memory cell 122P as a modification (modification 1) of the first embodiment and corresponds to FIG. 9A. In FIG. 37A, the same reference numerals are designated to the same parts substantially the same as components shown in FIG. 9A.

In the memory cell 1 (1P) in the magnetic memory device of the first embodiment, the magneto-sensitive layer is constructed by the connection parts 14a and 14b as part of the toroidal magnetic layer 4 and the second magnetic layers 8a and 8b, and the connection parts 14a and 14b and the second magnetic layers 8a and 8b are magnetically exchange-coupled to each other. In contrast, in the memory cell 122P of the modification, as shown in FIG. 37A, in addition to the configuration of the memory cell 1 (1P), the magneto-sensitive layer further includes a nonmagnetic conductive layer 9 for anti-ferromagnetic-coupling the connection parts 14a and 14b and the second magnetic layers 8a and 8b. Concretely, the memory cell 122P is constructed by a pair of TMR devices 122a and 122b. The TMR device 122a has a stacked body S22a, and the TMR device 122b has a stacked body S22b. The stacked bodies S22a and S22b in a pair are constructed by stack layer parts 22a and 22b and the connection parts 14a and 14b, respectively. The stack layer parts 22a and 22b have, in order from the side of the toroidal magnetic layer 4, nonmagnetic conductive layers 9a and 9b, the second magnetic layers 8a and 8b, the tunnel barrier layers 3a and 3b, and the first magnetic layers 2a and 2b, respectively. The nonmagnetic conductive layers 9a and 9b are made of, for example, ruthenium (Ru) or copper (Cu). The nonmagnetic conductive layers 9a and 9b are a concrete example of a "first nonmagnetic conductive layer" of the invention.

In the memory cell 122P of the modification, the connection parts 14a and 14b and the second magnetic layers 8a and 8b are antiferromagnetically coupled to each other. Consequently, even when the coercive force is less than $(50/4\pi) \times 10^3$ A/m, a problem such that the magnetization directions in the connection parts 14a and 14b are disturbed by an unnecessary magnetic field such as an external disturbance magnetic field does not occur. For example, the toroidal magnetic layer 4 can be made of iron (Fe), NiFe, CoFe, NiFeCo, cobalt (Co), or the like.

The second magnetic layers 8a and 8b become part for holding recorded information and are stabilized by an anisotropic magnetic field generated by antiferromagnetic coupling. The coercive force of the second magnetic layers 8a and 8b is $(100/4\pi) \times 10^3$ A/m or less and is desirably lower than that of the first magnetic layers 2a and 2b.

The writing operation in the memory cell 122P will now be described.

FIG. 37A shows a case where write currents flow in the same direction in the write bit line 5 and the write word line 6 passing through the memory cell 122P. That is, FIG. 37A shows a case where write current flows from this side to the depth in the direction perpendicular to the drawing sheet (to the +Y direction) in the TMR device 122a, and the circulating magnetic field 34 is generated in the counterclockwise direction in the toroidal magnetic layer 4. In this case, the magnetization direction of the second magnetic layer 8a becomes the +X direction, and the magnetization direction of the second magnetic layer 8b becomes the -X direction. In contrast, in the case where write current flows from the depth to this side in the direction perpendicular to the drawing sheet (to the -Y direction) in the TMR device 122a and the circulating magnetic field 34 is generated in the clockwise direction, the magnetization direction of the second magnetic layer 8a becomes the -X direction, and the magnetization direction of the second magnetic layer 8b becomes the +X direction. When currents flow in the same direction in the write bit line 5 and the write word line 6, the magnetization directions of the second magnetic layer 8 become antiparallel to each other and 0 or 1 can be recorded.

As described above, the memory cell 122P as the modification 1 has, in addition to the configuration of the first embodiment, the nonmagnetic conductive layers 9a and 9b between the connection parts 14a and 14b in the toroidal magnetic layer 4 and the second magnetic layers 8a and 8b. With the configuration, the connection parts 14a and 14b and the second magnetic layers 8a and 8b are strongly antiferromagnetic-coupled to each other. Thus, the magnetization directions of the connection parts 14a and 14b and the second magnetic layers 8a and 8b as the magneto-sensitive layers are stabilized without being disturbed by an unnecessary magnetic field such as an external disturbance magnetic field or the like. In addition, the coercive force of the connection parts 14a and 14b can be further suppressed by the above configuration. Therefore, by reducing the current value in the writing operation, the heat generation amount can be reduced and diffusion and movement of metal elements and the like contained in the connection parts 14a and 14b to the second magnetic layers 8a and 8b can be blocked by providing the nonmagnetic conductive layers 9a and 9b, so that thermal stability improves. As a result, writing can be performed more stably.

Modification 2

Figure 37B:
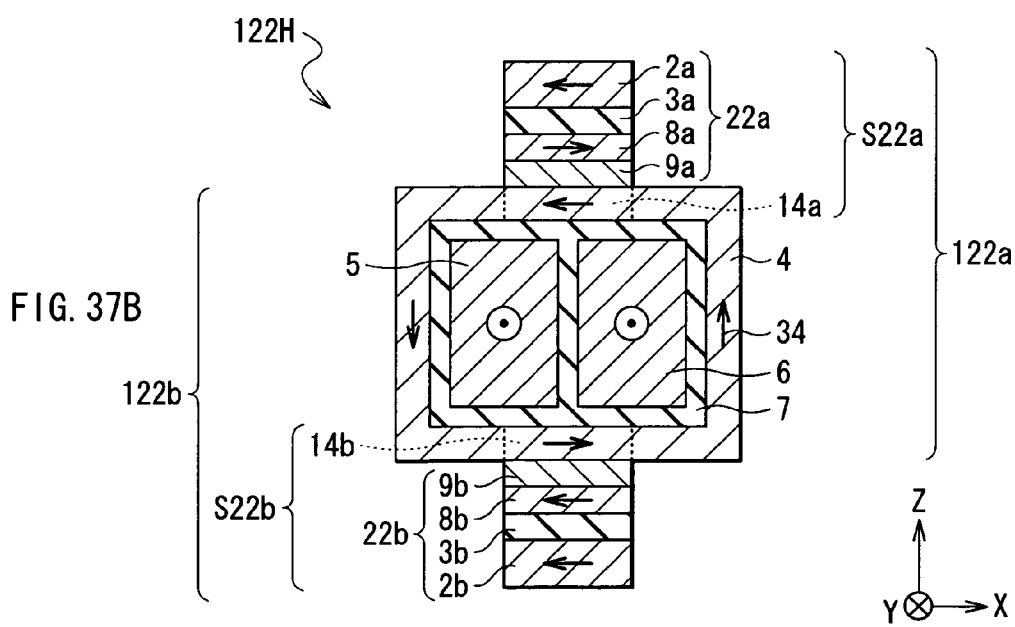

FIG. 37B shows a sectional configuration of a memory cell 122H as a modification (modification 2) of the memory cell 1 (1H) in the magnetic memory device of the second embodiment. In the memory cell 122H, as shown in FIG. 37B, the magneto-sensitive layer further has the nonmagnetic conductive layers 9 for anti-ferromagnetic coupling the connection parts 14a and 14b and the second magnetic layers 8a and 8b between the connection parts 14a and 14b and the second magnetic layers 8a and 8b.

In the memory cell 122H, in a manner similar to the modification 1, the connection parts 14a and 14b and the second magnetic layers 8a and 8b are strongly antiferromagnetically coupled to each other. As a result, writing can be performed more stably.

Modifications 3 and 4

Figure 38A:
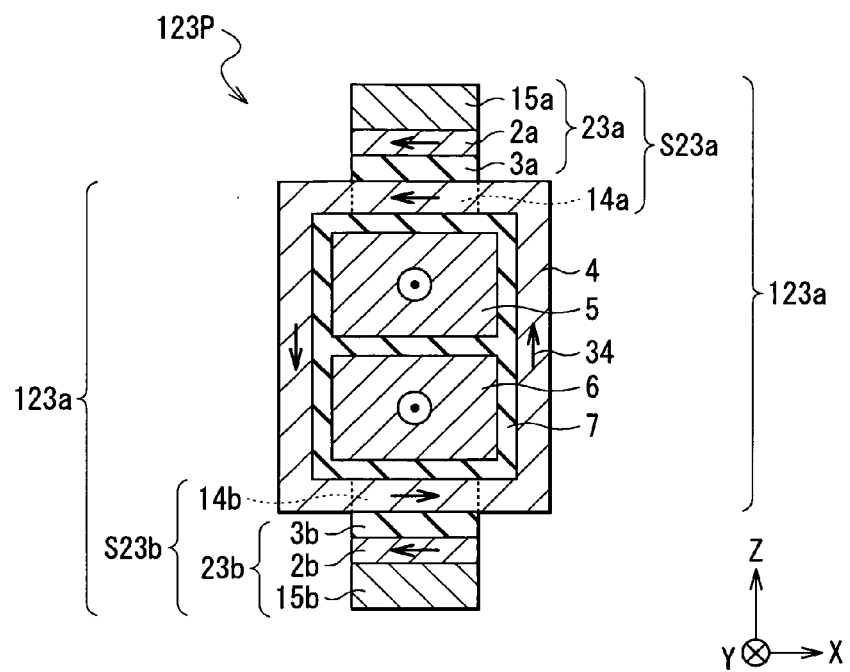
FIGS. 38A and 38B are cross sections showing the configuration of a main part in modifications (third and fourth modifications) of the magnetic memory devices according to the third and fourth embodiments of the invention.
Figure 38B:
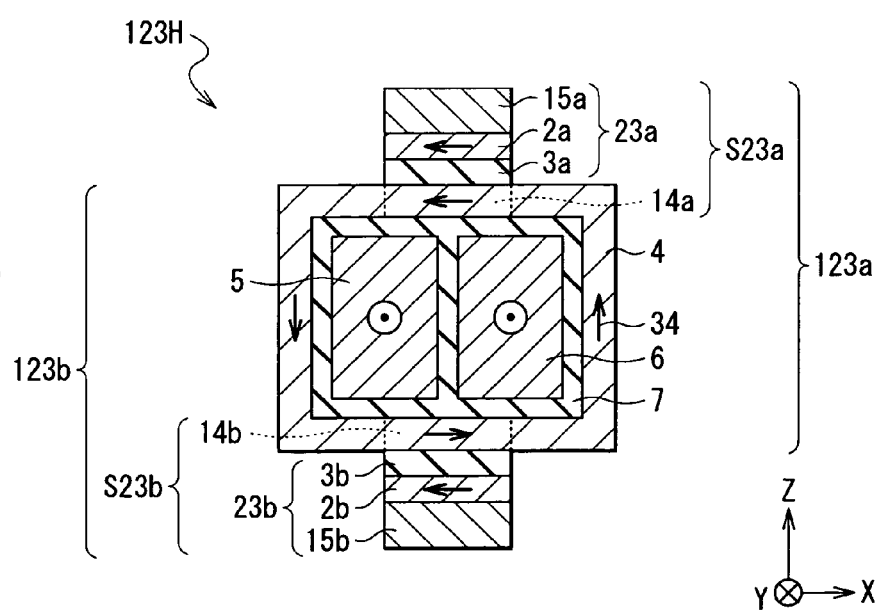

FIG. 38A shows a sectional configuration of a memory cell 123P as a modification (modification 3) of the third embodiment and corresponds to FIG. 36A. FIG. 38B shows a sectional configuration of a memory cell 123H as a modification (modification 4) of the fourth embodiment and corresponds to FIG. 36B.

The stacked bodies S21a and S21b included in the memory cells 121P and 121H in the third and fourth embodiments have a structure called a coercive force difference type including the first magnetic layers 2a and 2b having a coercive force larger than that of the connection parts 84a and 84b. On the other hand, stacked bodies S23a and S23b in the memory cells 123P and 123H shown in FIGS. 38A and 38B have a structure called an exchange bias type in which the magnetization directions of the first magnetic layers 2a and 2b are pinned by exchange coupling to the antiferromagnetic layers.

Concretely, the stacked bodies S23a and S23b have, in order from the side of the toroidal magnetic layer 4, the tunnel barrier layers 3a and 3b, the first magnetic layers 2a and 2b, and third magnetic layers 15a and 15b, respectively. The third magnetic layers 15a and 15b have antiferromagnetism, function so as to pin the magnetization directions of the first magnetic layers 2a and 2b by the action of exchange coupling to the first magnetic layers 2a and 2b, and are made of, for example, an antiferromagnetic material such as platinum manganese (PtMn) alloy, iridium manganese (IrMn) alloy, iron manganese (FeMn), nickel manganese (NiMn), or ruthenium manganese (RuMn).

As described above, in the modifications 3 and 4, the stacked bodies S23a and S23b have, in addition to the configuration of the second or third embodiment, the third magnetic layers 15a and 15b, respectively, which are antiferromagnetic and exchange-coupled to the first magnetic layers 2a and 2b on the side opposite to the tunnel barrier layer 3 of the first magnetic layers 2a and 2b. With the configuration, the magnetization directions of the first magnetic layers 2a and 2b can be pinned more stably. Consequently, even when the coercive force of the first magnetic layers 2a and 2b is set to be less than $(50/4\pi) \times 10^3$ A/m, the magnetization directions in the connection parts 84a and 84b are not disturbed by an unnecessary magnetic field such as an external disturbance magnetic field, and writing can be performed more stably.

Modifications 5 and 6

Other modifications (modifications 5 and 6) of the third and fourth embodiments will now be described with reference to FIGS. 39A and 39B.

Figure 39A:
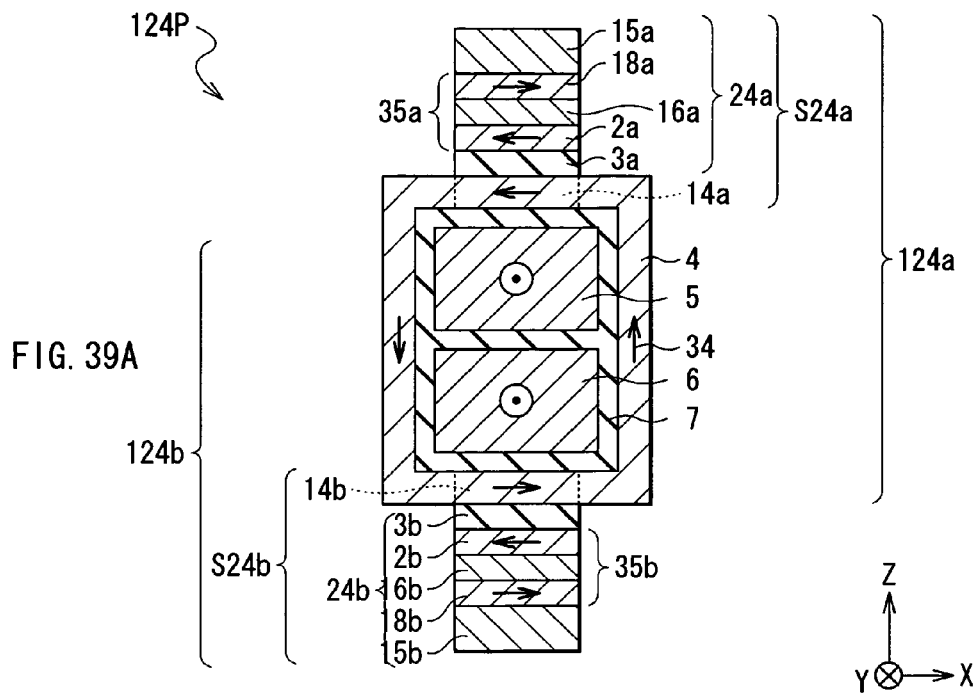
FIGS. 39A and 39B are cross sections showing the configuration of a main part in other modifications (fifth and sixth modifications) of the magnetic memory devices according to the third and fourth embodiments of the invention.
Figure 39B:
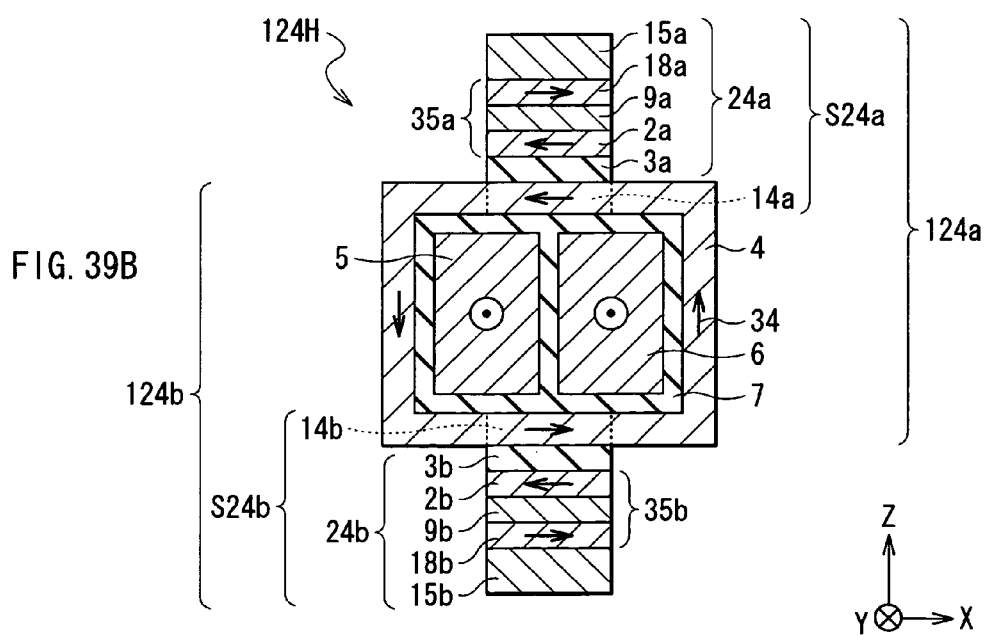

FIG. 39A shows a sectional configuration of a memory cell 124P as another modification (modification 5) of the third embodiment, which is similar to that of FIG. 38A. On the other hand, FIG. 39B shows a sectional configuration of a memory cell 124H as another modification (modification 6) of the fourth embodiment, which is similar to that of FIG. 38B. In FIGS. 39A and 39B, the same reference numerals are designated to components substantially the same as those shown in FIGS. 38A and 38B.

In a manner similar to the modifications 3 and 4, stacked bodies S24a and S24b in the memory cells 124P and 124H of the modifications 5 and 6 shown in FIG. 39A have a structure called exchange bias type in which the magnetization directions of the first magnetic layers 2a and 2b are pinned by exchange coupling to the antiferromagnetic layers. Different from the memory cells 123P and 123H, each of the memory cells 124P and 124H has not a single magnetization pinned layer but a synthetic magnetization pinned layer (hereinbelow, called SyAP layer) made of a plurality of layers.

Concretely, the stacked bodies S24a and S24b have a structure obtained by stacking, in order from the side of the toroidal magnetic layer 4, the tunnel barrier layers 3a and 3b, the SyAp layers 35a and 35b, and the third magnetic layers 15a and 15b which are antiferromagnetic. The SyAP layers 35a and 35b have a structure obtained by stacking, in order from the side of the toroidal magnetic layer 4, the first magnetic layers 2a and 2b, nonmagnetic conductive layers 16a and 16b, and fourth magnetic layers 18a and 18b, respectively. The nonmagnetic conductive layers 16a and 16b are made of, for example, copper. The fourth magnetic layers 18a and 18b are made of, for example, iron (Fe), NiFe, CoFe, NiFeCo, cobalt (Co), or the like and are antiferromagnetically coupled to the first magnetic layers 2a and 2b, respectively. The nonmagnetic conductive layers 16a and 16b are a concrete example of a "second nonmagnetic conductive layer" in the invention.

As described above, in the modifications 5 and 6, the stacked bodies S24a and S24b have the structure obtained by stacking in order the nonmagnetic conductive layers 16a and 16b, fourth magnetic layers 18a and 18b, and third magnetic layers 15a and 15b on the side opposite to the tunnel barrier layer 3 of the first magnetic layers 2a and 2b. In such a manner, a magnetostatic field generated by the fourth magnetic layers 18a and 18b and the first magnetic layers 2a and 2b which are antiferromagnetically coupled to each other form a closed magnetic path. Thus, a round of the magnetic field to the connection parts 14a and 14b as the magneto-sensitive layers can be suppressed, and the magnetization directions of the first magnetic layers 2a and 2b as magnetization pinned layers are further stabilized. Thus, the writing operation can be performed more stably.

Modifications 7 and 8

Other modifications (modifications 7 and 8) of the first and second embodiments will now be described with reference to FIGS. 40A and 40B.

Figure 40A:
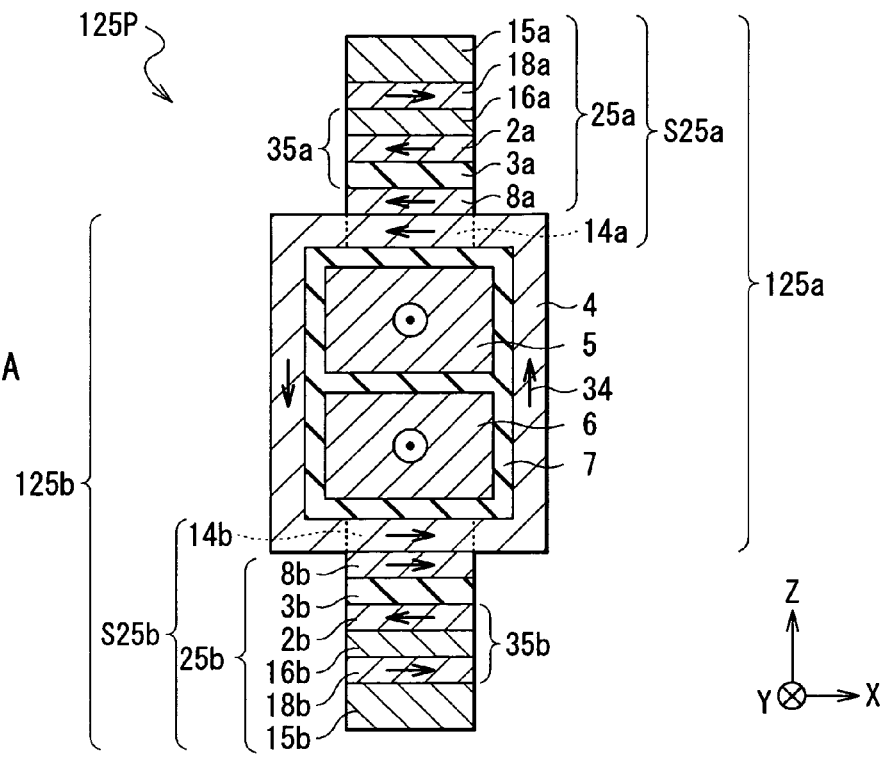
FIGS. 40A and 40B are cross sections showing the configuration of a main part in other modifications (seventh and eighth modifications) of the magnetic memory devices according to the first and second embodiments of the invention.
Figure 40B:
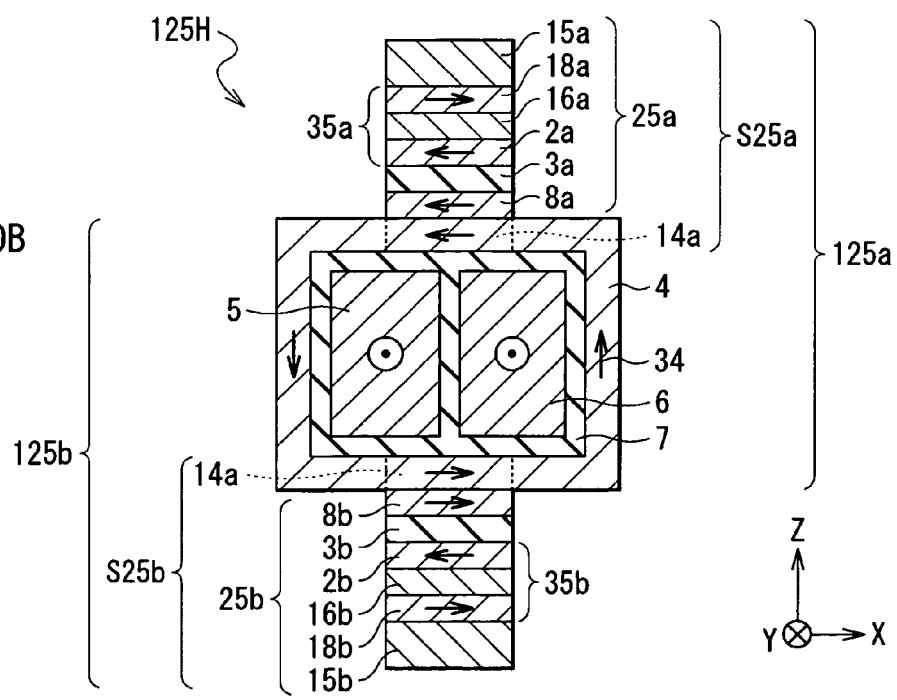

FIG. 40A shows a sectional configuration of a memory cell 125P as another modification (modification 7) of the first embodiment, and FIG. 40B shows a sectional configuration of a memory cell 125H as another modification (modification 8) of the second embodiment.

As shown in FIGS. 40A and 40B, stacked bodies S25a and S25b in the memory cells 125P and 125H of the modifications 7 and 8 have a structure called the exchange bias type and have the SyAP layers 35a and 35b, respectively. With a configuration, magnetostatic fields generated by the fourth magnetic layers 18a and 18b and the first magnetic layers 2a and 2b which are antiferromagnetically coupled to each other form a closed magnetic path. Thus, a round of the magnetic field to the connection parts 14a and 14b as a first magneto-sensitive part and the second magnetic layers 8a and 8b as a second magneto-sensitive part can be suppressed, and the magnetization directions of the first magnetic- layers 2a and 2b as magnetization pinned layers are further stabilized. Thus, the writing operation can be performed more stably.

Further, concrete examples in the embodiment will be described.

In the embodiment, the following two samples of the magnetic memory device were produced on the basis of the manufacturing method described in the first embodiment. To be concrete, the samples were samples 1 and 2 of magnetic memory devices in each of which a plurality of memory cells 1 each having the sectional structure shown in FIG. 5 were arranged in matrix.

The MR ratio, TMR device resistance, switching current, and adjacent cell inversion current of the magnetic memory devices of the samples 1 and 2 were measured. The MR ratio and the TMR device resistance were obtained by using average values of a pair of TMR devices in a memory cell as measurement values. The current values of the switching current and the adjacent cell inversion current were measured by passing write currents of the same magnitude simultaneously to the write bit line 5 and the write word line 6. The results are shown in Table 1. Example 1 in Table 1 shows results corresponding to the sample 1, and Example 2 shows results corresponding to the sample 2. For comparison of numerical values, similar measurement was also performed on the memory cell having the structure shown in FIG. 44, and illustrated as a comparative example in Table 1. The magnetic field applied at the time of measurement was $(500/4\pi) \times 10^3$ A/m. A memory cell as a comparative example shown in FIG. 44 has a one TMR device 120 but does not have a toroidal magnetic layer surrounding the write bit line 105 and the write word line 106.

As shown in Table 1, although there is not a large difference in the MR ratio and the TMR device resistance between Examples 1 and 2 and the comparative example, there was a clear significant difference in the switching currents and the adjacent cell inversion current.

The switching current is the minimum current value necessary for inverting the magnetization direction in a memory cell to be written. The values of the switching currents in Examples 1 and 2 were smaller than the value in the comparative example. It means that since the magnetization of the magneto-sensitive layer could be inverted efficiently, a writing operation could be performed even with a small current. That is, it could be confirmed that when neighboring TMR devices share part of the toroidal magnetic layer, a large circulating magnetic field can be generated even with a small current.

The adjacent cell inversion current denotes a current value of a current which is applied to a memory cell adjacent to a memory cell to be written and by which the magnetization direction of the memory cell which is not inherently to be written is inverted. As shown in Table 1, it was known that, in Examples 1 and 2, even when write current larger than that in the comparative example is applied, the magnetization direction in the adjacent memory cell is not inverted. It means that occurrence of a magnetic field which forms a closed magnetic path and exerts an adverse influence on the adjacent-memory cell can be suppressed.

Although the invention has been described above by the some embodiments and modifications, the invention is not limited to the embodiments and modifications but can be variously modified. For example, in the embodiments and the modifications, the Schottky diode 75 is used as a rectifying device for preventing back flow. The Schottky diode 75 may be replaced with a bipolar transistor as a device having the same rectifying action.

Figure 41:
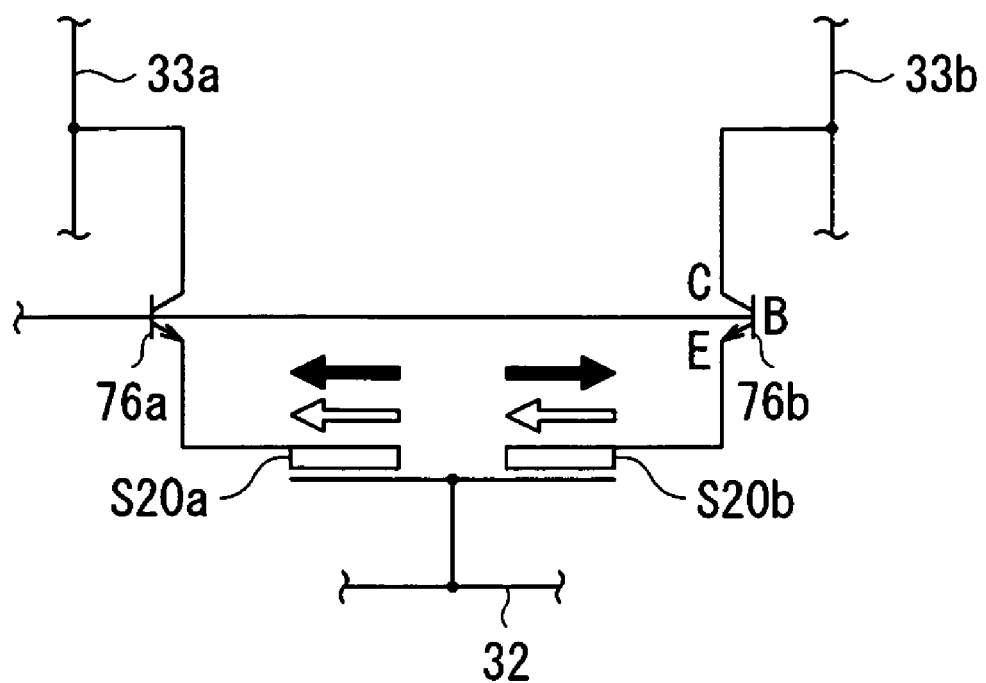
FIG. 41 is a partial enlarged view showing a modification of a rectifying device in the circuit configuration illustrated in FIG. 8.
Figure 42:
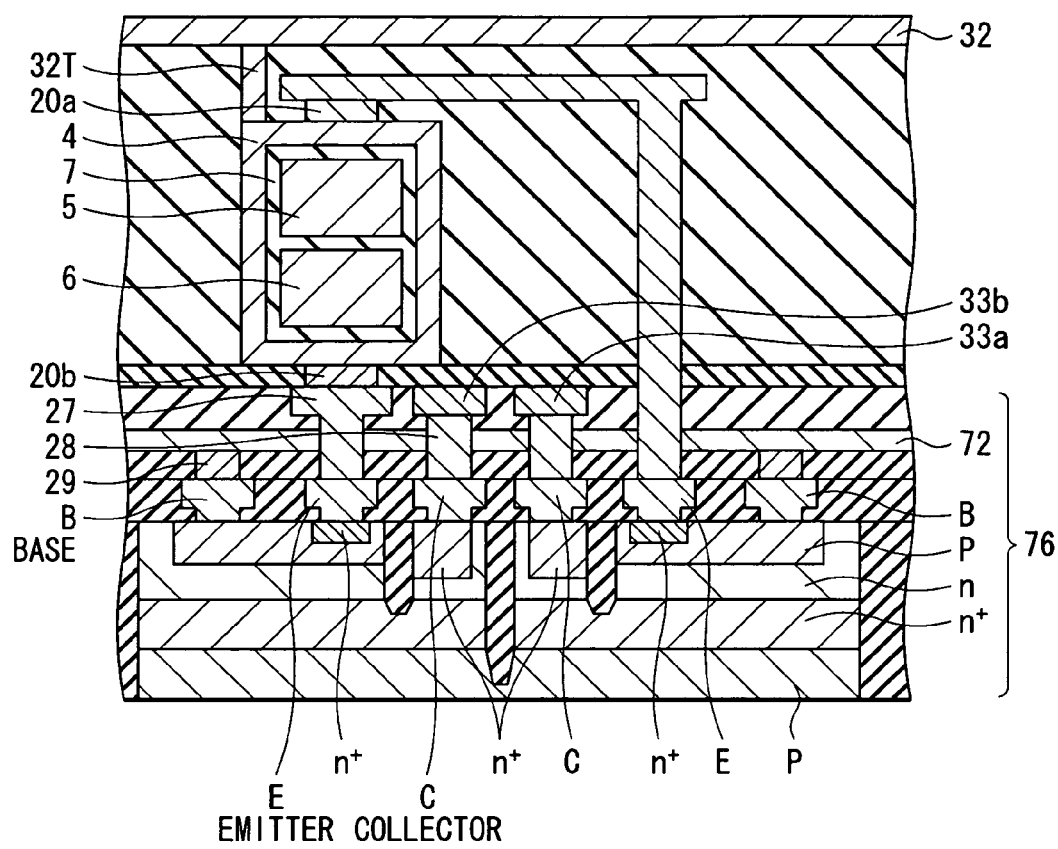
FIG. 42 is a partial cross section showing a sectional configuration in a modification of the rectifying device illustrated in FIG. 41.

FIG. 41 shows the configuration of a main part of a circuit in the case where bipolar transistors 76a and 76b are provided between the read bit lines 33a and 33b and the stacked bodies S20a and S20b. FIG. 42 shows a sectional structure of the bipolar transistors 76a and 76b. The bases B of. the bipolar transistors 76a and 76b are connected to the word decode line 72. The collectors C are connected to the read bit lines 33a and 33b via a connection layer 28, and the emitters E are connected to the stacked bodies S20a and S20b via a connection layer 27.

Figure 43:
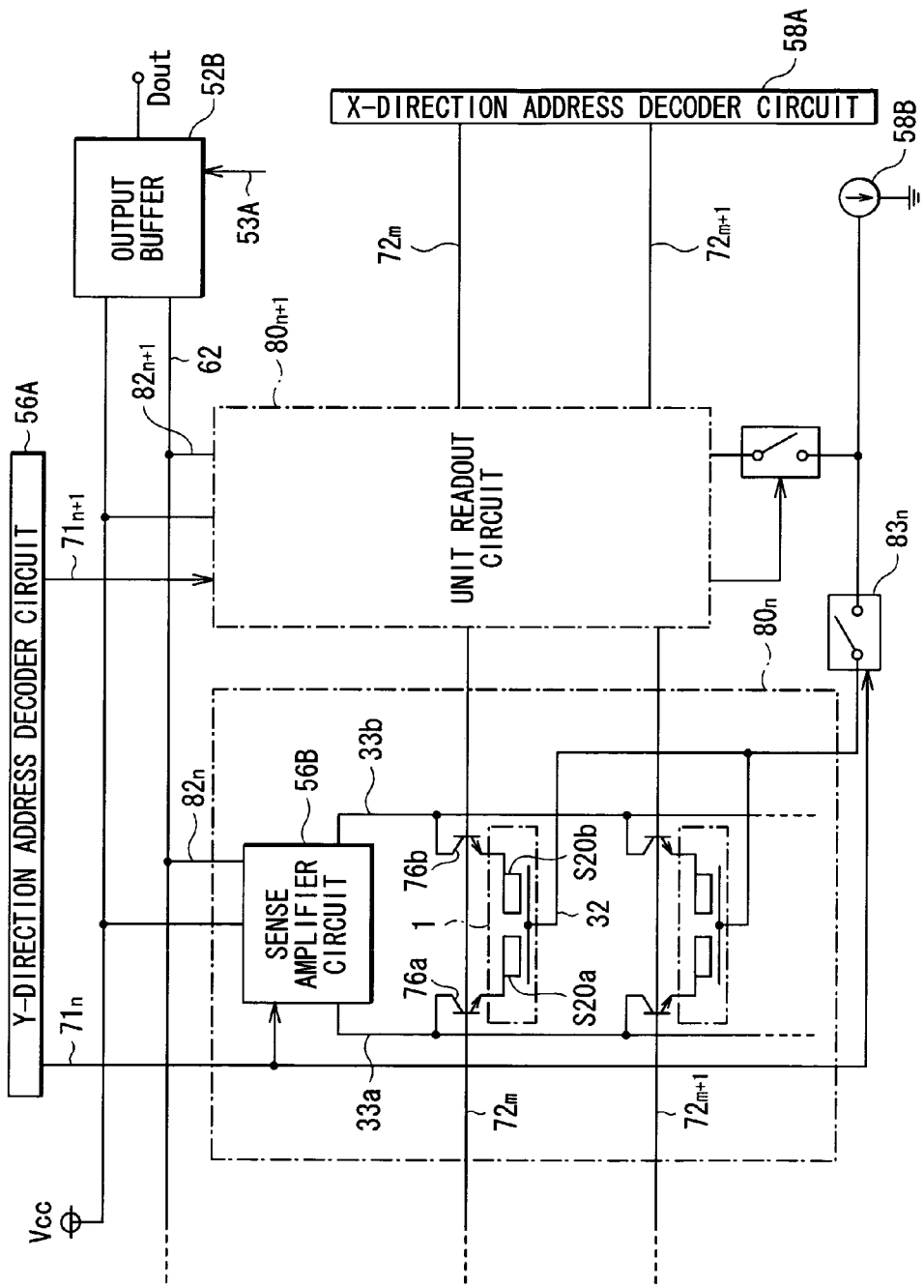
FIG. 43 is a circuit diagram showing a general circuit configuration in a modification of the rectifying device illustrated in FIG. 41.

FIG. 43 shows the whole readout circuit in the case where the bipolar transistors 76a and 76b are provided. In this case, when a control signal from the Y-direction address decoder circuit 56A is transmitted to, for example, the sense amplifier circuit 56B of the unit readout circuit 80n, the sense amplifier circuit 56B generates read currents so that the read currents pass through the read bit lines 33a and 33b. The control signal from the Y-direction address decoder circuit 56A is also transmitted to the read switch 83n at the same time, and the read switch 83n is made conductive. On the other hand, the X-direction address decoder circuit 58A generates a control signal so as to select a memory cell 1m and pass through the word decode line 72m. When the control signal from the X-direction address decoder circuit 58A is transmitted to the base B of each of the bipolar transistors 76a and 76b, the collector C and the emitter E are made conductive. As a result, the read current passes through the stacked bodies S20a and S20b of the memory cell 1m and finally flows in the constant current circuit 58B via the read switch 83n. Like the diode 75, the bipolar transistor 76 also functions to pass the current in one direction, so that a round of the read current as shown in FIG. 46 can be avoided.

Figure 44:
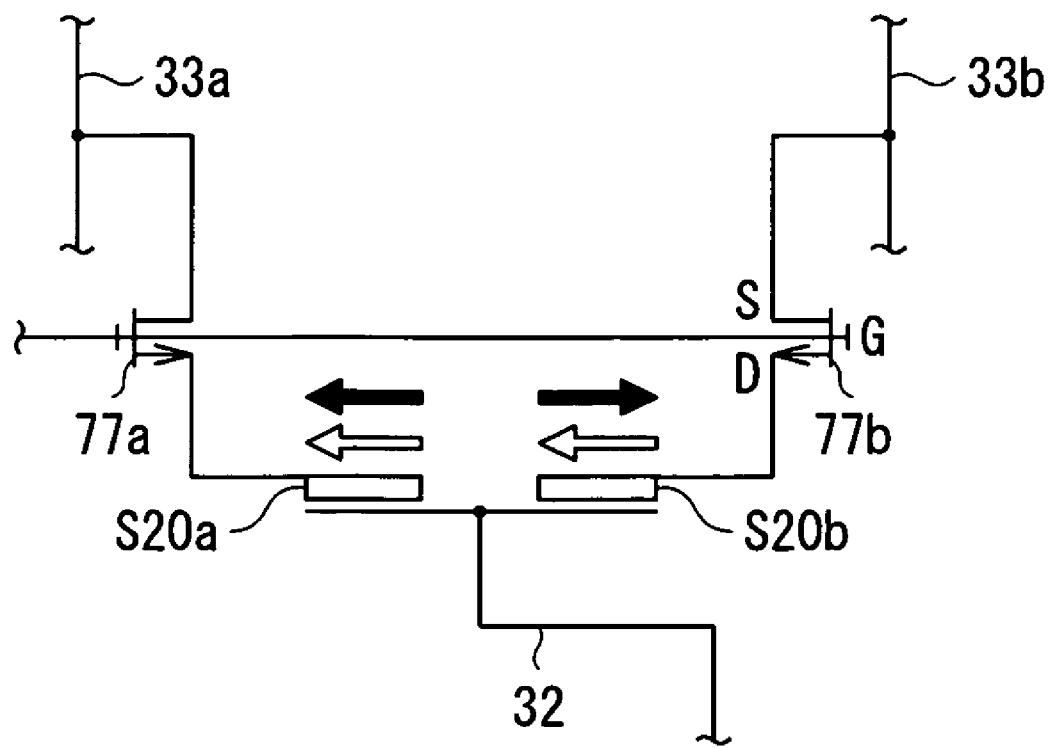
FIG. 44 is a partial enlarged view showing another modification of the rectifying device in the circuit configuration illustrated in FIG. 8.
Figure 45:
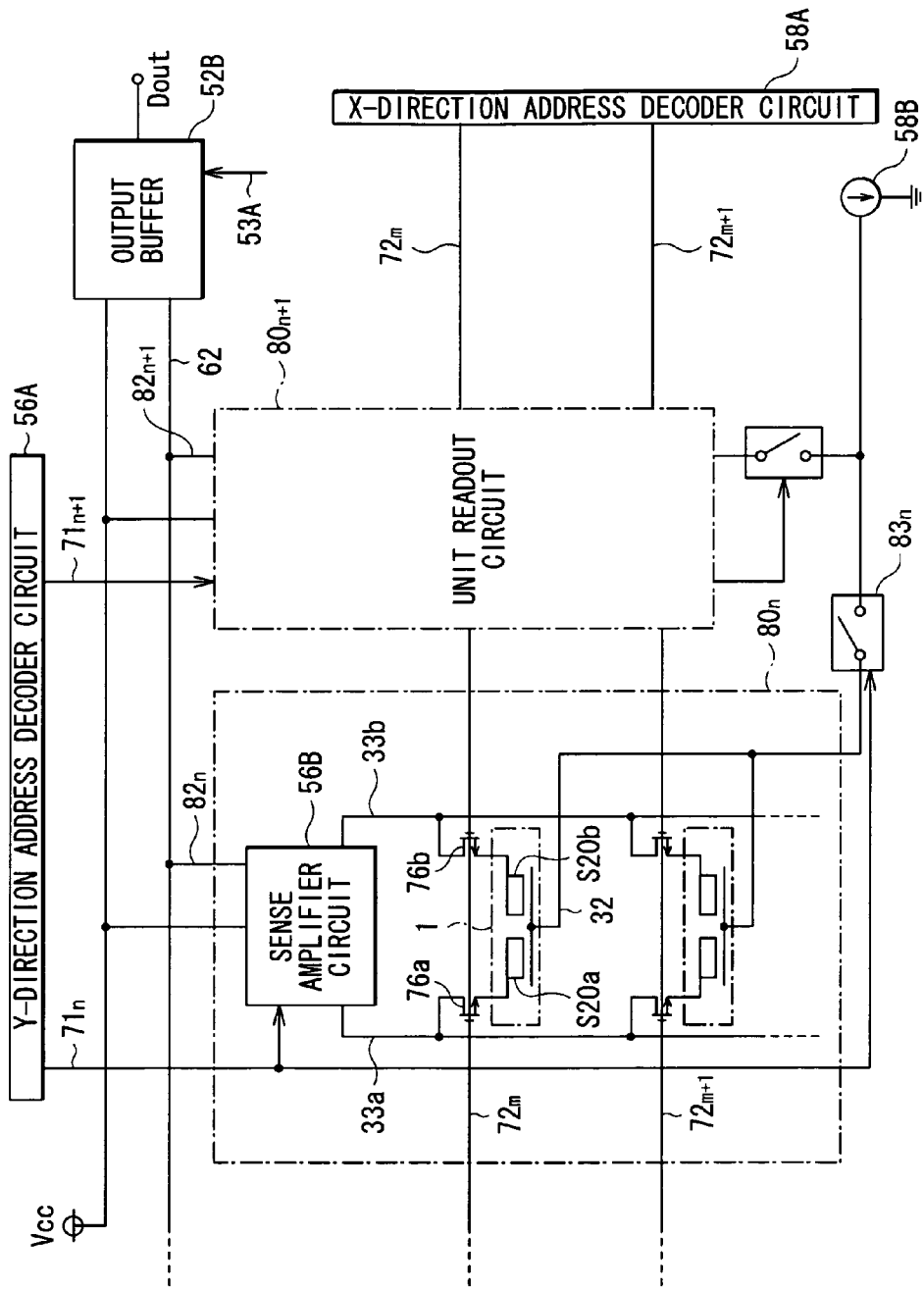
FIG. 45 is a circuit diagram showing a general circuit configuration of another modification of the rectifying device illustrated in FIG. 44.

As rectifying devices for preventing back flow, as shown in FIG. 44, MOS transistors 77a and 77b can be used. In this case, the sources S are connected to the read bit lines 33a and 33b, the drains D are connected to the TMR films 20a and 20b, and a gate G connected to the word decode line 72 is closed, thereby obtaining a conductive state. FIG. 45 shows the whole readout circuit in the case where the MOS transistors 77a and 77b are provided. Except for the point that the conductive state is obtained by closing the gate G, the reading operation in the reading circuit shown in FIG. 45 is similar to that in the circuit (FIG. 43) using the bipolar transistor 76.

In the embodiment, the case where the write bit line 5 and the write word line 6 form the parallel part 10 has been described above. The invention, however, is not limited to the case but may be applied to a case where the write bit line 5 and the write word line 6 form, for example, 90°. The case of forming the toroidal magnetic layer 4 so as to surround the parallel part 10 is more preferable because the magnetization of the magneto-sensitive layer is inverted more efficiently.

In the embodiment, information of the memory cells 1 is read by using a differential value of read currents passed to the TMR devices 1a and 1b as an output. The invention, however, is not limited to the embodiment. For example, it is also possible to make the value of the read current passing through a TMR device output as it is and detect the state which is either a high-resistance state or a low-resistance state.

As described above, a magnetic memory cell or a magnetic memory device of the invention includes: first and second stacked bodies each including a magneto-sensitive layer whose magnetization direction changes according to an external magnetic field, and constructed so that current flows in a direction perpendicular to a stack layer surface, and disposed so that their stack layer surfaces face each other; and a toroidal magnetic layer disposed between the first and second stacked bodies so that the direction along the stack layer surface is set as an axial direction, and constructed so as to be penetrated by a plurality of conductors along the axial direction. Consequently, a closed magnetic path can be formed by passing currents to the plurality of conductors (first and second write lines), so that the magnetization of each of the magneto-sensitive layers in the first and second stacked bodies can be inverted efficiently. In particular, in the magnetic memory device of the invention including a plurality of magnetic memory cells, a magnetic influence exerted on a memory cell adjacent to a memory cell to be written can be reduced.

In particular, when the first stacked body constructs a first magnetoresistive device in cooperation with the toroidal magnetic layer, and the second stacked body constructs a second magnetoresistive device in cooperation with the toroidal magnetic layer, a pair of magnetoresistive devices sharing the toroidal magnetic layer is constructed, so that the configuration which is more compact than the case where one toroidal magnetic layer is provided for one stacked body can be obtained, and higher packing density can be achieved.

Further, in the magnetic memory cell and the magnetic memory device of the invention, when the plurality of conductors (first and second write lines) extend parallel to each other in an area penetrating the toroidal magnetic layer, a synthetic magnetic field generated in the magneto-sensitive layer by passing currents to the plurality of conductors (first and second write lines) can be made larger than that in the case where the conductors cross each other, and the magnetization in the magneto-sensitive layer can be inverted more efficiently. As a result, the write current necessary for inverting the magnetization can be reduced. Further, the magnetization directions of a plurality of magnetic domains in the magneto-sensitive layer can be aligned excellently as a whole, so that higher reliability can be obtained.

When the magnetic memory device of the invention further includes first and second rectifying devices provided between the pair of first read lines and the first and second stacked bodies on each of current paths of read currents supplied to the first and second stacked bodies; and a second read line for leading the read currents passed through the first and second stacked bodies to the ground, fluctuations caused by a round of the read current, that is, noise occurring in the read signal can be reduced, so that magnetic information can be read stably.

A method of manufacturing a magnetic memory device of the invention includes the steps of forming a second stack layer part as part of the second stacked body on a substrate provided with first and second rectifying devices and electrically connecting the second rectifying device and the second stack layer part; forming a bottom magnetic layer so as to cover at least the stack layer part and completing formation of the second stacked body; forming the first write line over the bottom magnetic layer via a first insulating film; forming the second write line over the first write line via a second insulating film so as to include a portion in which the first and second write lines extend parallel to each other; forming a stack layer pattern forming a stack layer pattern including the portion in which the first and second write lines extend parallel to each other while sandwiching the second insulating film by performing patterning by sequentially etching the second write line, the second insulating film, and the first write line; forming a toroidal magnetic layer by providing a top magnetic layer so as to surround the stack layer pattern via a third insulating film; forming a first stacked body by providing a first stack layer part in a position corresponding to the second stacked body over the toroidal magnetic layer and forming a magnetic memory cell having the first and second stacked bodies; and electrically connecting the first stacked body and the first rectifying device. Consequently, a structure in which the toroidal magnetic layer is commonly disposed on a face of one of the first and second stacked bodies whose stack layer surfaces face each other so that the direction along the stack layer surface is used as the axial direction can be obtained. Moreover, a current path in which a pair of read currents flow in the first and second rectifier devices and the first and second stacked bodies and are combined in the toroidal magnetic layer can be constructed. Consequently, an unnecessary round of the read currents can be avoided, and the magnetic information can be read stably.

In particular, in the stack layer pattern forming steps, when the stack layer pattern is formed in a self aligned manner by selectively etching the second insulating film and the first write line while using the second write line as a mask, processing with high alignment precision can be performed, and the whole manufacturing process can be simplified.

TABLE 1

|  | MR ratio % | TMR device resistance $\Omega \cdot (\mu m)^2$ | Switching current mA | Adjacent cell inversion current mA |
|---|---|---|---|---|
| Example 1 | 36-38 | 430-510 | 1.2 | 20.0 or larger |
| Example 2 | 37-38 | 480-490 | 1.1 | 20.0 or larger |
| Comparative example | 40 | 520 | 8.2 | 13 |

The invention claimed is:

1. A magnetic memory cell comprising:
   first and second stacked bodies each including a magneto-sensitive layer whose magnetization direction changes according to an external magnetic field, and constructed so that current flows in a direction perpendicular to a stack layer surface, and disposed so that their stack layer surfaces face each other; and
   a toroidal magnetic layer disposed between the first and second stacked bodies so that the direction along the stack layer surface is set as an axial direction, and constructed so as to be penetrated by a plurality of conductors along the axial direction.

2. A magnetic memory cell according to claim 1, wherein the first stacked body constructs a first magnetoresistive device in cooperation with the toroidal magnetic layer, and the second stacked body constructs a second magnetoresistive device in cooperation with the toroidal magnetic layer.

3. A magnetic memory cell according to claim 1, wherein each of the first and second stacked bodies is electrically connected to the toroidal magnetic layer.

4. A magnetic memory cell according to claim 1, wherein the plurality conductors extend parallel to each other in an area penetrating the toroidal magnetic layer.

5. A magnetic memory cell according to claim 1, wherein the plurality of conductors are disposed so as to be adjacent to each other in a direction of a straight line passing through the first and second stacked bodies in an area penetrating the toroidal magnetic layer.

6. A magnetic memory cell according to claim 1, wherein the plurality of conductors are disposed so as to be adjacent to each other in a direction orthogonal to a straight line passing through the first and second stacked bodies in an area penetrating the toroidal magnetic layer.

7. A magnetic memory cell according to claim 1, wherein magnetization directions of the magneto-sensitive layers in the first and second stacked bodies change so as to be antiparallel to each other by a magnetic field generated by currents flowing in the plurality of conductors.

8. A magnetic memory cell according to claim 7, wherein either a first state or a second state is obtained, the first state in which one of a pair of magneto-sensitive layers in the first and second stacked bodies is magnetized in a first direction, and the other is magnetized in a second direction antiparallel to the first direction, the second state in which one of the magneto-sensitive layers in the pair is magnetized in the second direction and the other is magnetized in the first direction, and
   information is stored in the first and second stacked bodies in correspondence with the first and second states.

9. A magnetic memory cell according to claim 1, wherein each of the pair of magento-sensitive layers in the first and second stacked bodies includes first and second magneto-sensitive parts constructed so as to be magnetically exchange-coupled to each other, and
   the first magneto-sensitive part is part of the toroidal magnetic layer.

10. A magnetic memory cell according to claim 9, wherein each of the magneto-sensitive layers in one pair has a first nonmagnetic conductive layer for antiferromagnetic-coupling the first and second magneto-sensitive parts between the first and second magneto-sensitive parts.

11. A magnetic memory cell according to claim 9, wherein the second magneto-sensitive part in one pair has a coercive force larger than that of the first magneto-sensitive part in one pair.

12. A magnetic memory cell according to claim 9, wherein each of the first and second stacked bodies includes:
    a nonmagnetic layer;
    a first magnetic layer stacked on one side of the nonmagnetic layer and whose magnetization direction is pinned; and
    a second magnetic layer stacked on the side opposite to the first magnetic layer of the nonmagnetic layer and functioning as the second magneto-sensitive part, and
    information is detected on the basis of currents flowing in the first and second stacked bodies.

13. A magnetic memory cell according to claim 12, wherein the first magnetic layer has a coercive force larger than that of the second magnetic layer.

14. A magnetic memory cell according to claim 12, wherein a third magnetic layer which is antiferromagnetic and is exchange-coupled to the first magnetic layer is disposed on the side opposite to the nonmagnetic layer of the first magnetic layer.

15. A magnetic memory cell according to claim 14, wherein a second nonmagnetic conductive layer and a fourth magnetic layer which is antiferromagnetic-coupled to the first magnetic layer are disposed in order from the side of the first magnetic layer between the first and third magnetic layers.

16. A magnetic memory cell according to claim 12, wherein the nonmagnetic layer is an insulating layer which can produce a tunnel effect.

17. A magnetic memory cell according to claim 1, wherein the pair of magneto-sensitive layers constructs part of the toroidal magnetic layer.

18. A magnetic memory cell according to claim 17, wherein each of the first and second stacked bodies includes:
a nonmagnetic layer;
a first magnetic layer stacked on one side of the nonmagnetic layer and whose magnetization direction is pinned; and
the magneto-sensitive layer stacked on the side opposite to the first magnetic layer of the nonmagnetic layer, and information is detected on the basis of currents flowing in the first and second stacked bodies.

19. A magnetic memory cell according to claim 18, wherein on the side opposite to the nonmagnetic layer of the first magnetic layer, a second nonmagnetic conductive layer, a fourth magnetic layer antiferromagnetic-coupled to the first magnetic layer, and a third magnetic layer which is antiferromagnetic are disposed in order.

20. A magnetic memory cell according to claim 18, wherein the nonmagnetic layer is an insulating layer which can produce a tunnel effect.

21. A magnetic memory device comprising:
a first write line;
a second write line extending so as to cross the first write line; and
a magnetic memory cell,
wherein the magnetic memory cell comprises:
first and second stacked bodies each including a magneto-sensitive layer whose magnetization direction changes according to an external magnetic field, and constructed so that current flows in a direction perpendicular to a stack layer surface, and disposed so that their stack layer surfaces face each other; and
a toroidal magnetic layer disposed between the first and second stacked bodies so that the direction along the stack layer surface is set as an axial direction, and constructed so as to be penetrated by the first and second write lines along the axial direction.

22. A magnetic memory device according to claim 21, wherein the first stacked body constructs a first magnetoresistive device in cooperation with the toroidal magnetic layer, and
the second stacked body constructs a second magnetoresistive device in cooperation with the toroidal magnetic layer.

23. A magnetic memory device according to claim 21, wherein each of the first and second stacked bodies is electrically connected to the toroidal magnetic layer.

24. A magnetic memory device according to claim 21, wherein the first and second write lines extend parallel to each other in an area penetrating the toroidal magnetic layer.

25. A magnetic memory device according to claim 21, wherein the first and second write lines are disposed so as to be adjacent to each other in a direction of a straight line passing through the first and second stacked bodies in an area penetrating the toroidal magnetic layer.

26. A magnetic memory device according to claim 21, wherein the first and second write lines are disposed so as to be adjacent to each other in a direction orthogonal to a straight line passing through the first and second stacked bodies in an area penetrating the toroidal magnetic layer.

27. A magnetic memory device according to claim 21, wherein magnetization directions of the magneto-sensitive layers in the first and second stacked bodies change so as to be antiparallel to each other by a magnetic field generated by currents flowing in both of the first and second write lines.

28. A magnetic memory device according to claim 27, wherein either a first state or a second state is obtained, the first state in which one of a pair of magneto-sensitive layers in the first and second stacked bodies is magnetized in a first direction, and the other is magnetized in a second direction antiparallel to the first direction, the second state in which one of the magneto-sensitive layers in the pair is magnetized in the second direction and the other is magnetized in the first direction, and
information is stored in the magnetic memory cell in correspondence with the first and second states.

29. A magnetic memory device according to claim 21, further comprising a pair of first read lines which are connected to the first and second stacked bodies and supply read current to the stacked bodies,
wherein information is read from the magnetic memory cell on the basis of the current flowing in the stacked bodies.

30. A magnetic memory device according to claim 29, wherein read current is supplied from the pair of first read lines to the first and second stacked bodies and, on the basis of the difference between a pair of read current values, information is read from the magnetic memory cell.

31. A magnetic memory device according to claim 21, wherein the pair of magneto-sensitive layers in the first and second stacked bodies have first and second magneto-sensitive parts constructed so as to be magnetically exchange-coupled to each other, and
the first magneto-sensitive part constructs part of the toroidal magnetic layer.

32. A magnetic memory device according to claim 31, wherein the pair of magneto-sensitive layers has a first nonmagnetic conductive layer for antiferromagnetic-coupling the first and second magneto-sensitive parts between the first and second magneto-sensitive parts.

33. A magnetic memory device according to claim 31, wherein the second magneto-sensitive part in one pair has a coercive force larger than that of the first magneto-sensitive part.

34. A magnetic memory device according to claim 31, wherein each of the first and second stacked bodies includes:
a nonmagnetic layer;
a first magnetic layer stacked on one side of the nonmagnetic layer and whose magnetization direction is pinned; and
a second magnetic layer stacked on the side opposite to the first magnetic layer of the nonmagnetic layer and functioning as the second magneto-sensitive part, and information is detected on the basis of currents flowing in the first and second stacked bodies.

35. A magnetic memory device according to claim 34, wherein the first magnetic layer has a coercive force larger than that of the second magnetic layer.

36. A magnetic memory device according to claim 34, wherein a third magnetic layer which is antiferromagnetic and is exchange-coupled to the first magnetic layer is disposed on the side opposite to the nonmagnetic layer of the first magnetic layer.

37. A magnetic memory device according to claim 34, wherein a second nonmagnetic conductive layer and a fourth magnetic layer which is antiferromagnetic-coupled to the first magnetic layer are disposed in order from the side of the first magnetic layer between the first and third magnetic layers.

38. A magnetic memory device according to claim 34, wherein the nonmagnetic layer is an insulating layer which can produce a tunnel effect.

39. A magnetic memory device according to claim 21, wherein the pair of magneto-sensitive layers in the first and second stacked bodies constructs part of the toroidal magnetic layer.

40. A magnetic memory device according to claim 39, wherein each of the first and second stacked bodies includes:
a nonmagnetic layer;
a first magnetic layer stacked on one side of the nonmagnetic layer and whose magnetization direction is pinned; and
the magneto-sensitive layer stacked on the side opposite to the first magnetic layer of the nonmagnetic layer, and information is detected on the basis of currents flowing in the first and second stacked bodies.

41. A magnetic memory device according to claim 40, wherein on the side opposite to the nonmagnetic layer of the first magnetic layer, a second nonmagnetic conductive layer, a fourth magnetic layer antiferromagnetic-coupled to the first magnetic layer, and a third magnetic layer which is antiferromagnetic are disposed in order.

42. A magnetic memory device according to claim 40, wherein the nonmagnetic layer is an insulating layer which can produce a tunnel effect.

43. A magnetic memory device according to claim 29, comprising:
first and second rectifying devices provided between the pair of first read lines and the first and second stacked bodies on each of current paths of read currents supplied to the first and second stacked bodies; and
a second read line for leading the read currents passed through the first and second stacked bodies to the ground.

44. A magnetic memory device according to claim 43, wherein each of the first and second rectifying devices is a Schottky diode, a PN junction diode, a bipolar transistor, or a MOS (Metal-Oxide-Semiconductor) transistor.

45. A magnetic memory device according to claim 21, wherein the second stacked body, the toroidal magnetic layer, and the first stacked body are disposed in order on a substrate provided with the first and second rectifying devices, and the first and second rectifying devices and the first and second stacked bodies are electrically connected to each other, respectively.

46. A magnetic memory device according to claim 45, wherein the first and second rectifying devices are bipolar transistors, and emitters in the bipolar transistors and the first and second stacked bodies are electrically connected to each other.

47. A magnetic memory device according to claim 45, wherein the first and second rectifying devices are MOS (Metal-Oxide-Semiconductor) transistors, and sources in the MOS transistors and the first and second stacked bodies are electrically connected to each other.

48. A magnetic memory device according to claim 45, wherein each of the first and second rectifying devices is a Schottky diode, has a conductive layer and an epitaxial layer in order from the side of the first and second stacked bodies, and a Schottky barrier is formed between the conductive layer and the epitaxial layer.

49. A method of manufacturing a magnetic memory device including a first write line, a second write line extending so as to cross the first write line, and a magnetic memory cell having first and second stacked bodies including magneto-sensitive layers whose magnetization directions change according to an external magnetic field, comprising the steps of:
forming a second stack layer part as part of the second stacked body on a substrate provided with first and second rectifying devices and electrically connecting the second rectifying device and the second stack layer part;
forming a bottom magnetic layer so as to cover at least the stack layer part and completing formation of the second stacked body;
forming the first write line over the bottom magnetic layer via a first insulating film;
forming the second write line over the first write line via a second insulating film so as to include a portion in which the first and second write lines extend parallel to each other;
forming a stack layer pattern forming a stack layer pattern including the portion in which the first and second write lines extend parallel to each other while sandwiching the second insulating film by performing patterning by sequentially etching the second write line, the second insulating film, and the first write line;
forming a toroidal magnetic layer by providing a top magnetic layer so as to surround the stack layer pattern via a third insulating film;
forming a first stacked body by providing a first stack layer part in a position corresponding to the second stacked body over the toroidal magnetic layer and forming a magnetic memory cell having the first and second stacked bodies; and
electrically connecting the first stacked body and the first rectifying device.

50. A method of manufacturing a magnetic memory device according to claim 49, wherein in the step of forming the stack layer pattern, the stack layer pattern is formed in a self aligned manner by selectively etching the second insulating film and the first write line by using the second write line as a mask.

* * * * *